US009627390B2

(12) United States Patent
Choi et al.

(10) Patent No.: US 9,627,390 B2
(45) Date of Patent: Apr. 18, 2017

(54) SEMICONDUCTOR DEVICE HAVING FIN-TYPE ACTIVE PATTERNS AND GATE NODES

(71) Applicant: Samsung Electronics Co., Ltd., Suwon-si (KR)

(72) Inventors: Hyun-Min Choi, Uiwang-si (KR); Shigenobu Maeda, Seongnam-si (KR); Ji-Hoon Yoon, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/683,151

(22) Filed: Apr. 10, 2015

(65) Prior Publication Data
US 2015/0294979 A1 Oct. 15, 2015

(30) Foreign Application Priority Data

Apr. 10, 2014 (KR) .................... 10-2014-0043030
Feb. 10, 2015 (KR) .................... 10-2015-0020250

(51) Int. Cl.
*H01L 27/112* (2006.01)
*G11C 17/16* (2006.01)
*H01L 23/525* (2006.01)

(52) U.S. Cl.
CPC ........ *H01L 27/11206* (2013.01); *G11C 17/16* (2013.01); *H01L 23/5252* (2013.01); *H01L 2224/32145* (2013.01); *H01L 2224/32225* (2013.01); *H01L 2924/15311* (2013.01); *H01L 2924/181* (2013.01)

(58) Field of Classification Search
CPC . H01L 51/56; H01L 51/5246; H01L 51/0072; C09K 11/06; C09K 2211/1007
See application file for complete search history.

(56) References Cited

U.S. PATENT DOCUMENTS

| | | | |
|---|---|---|---|
| 7,456,426 B2 | 11/2008 | Breitwisch et al. | |
| 7,691,684 B2 | 4/2010 | Breitwisch et al. | |
| 7,811,871 B2 | 10/2010 | Anderson et al. | |
| 8,030,736 B2 | 10/2011 | Booth, Jr. et al. | |
| 8,400,813 B2 | 3/2013 | Lee | |
| 8,421,186 B2 | 4/2013 | Li et al. | |
| 8,564,064 B2 | 10/2013 | Cheng et al. | |
| 2004/0141351 A1* | 7/2004 | Fricke | G11C 13/003 365/63 |

(Continued)

*Primary Examiner* — Andy Huynh
(74) *Attorney, Agent, or Firm* — Muir Patent Law, PLLC

(57) ABSTRACT

A semiconductor device is provided. The semiconductor device includes: a plurality of fin-type active patterns which extend along a first direction, and are arranged with respect to each other along a second direction different from the first direction; a contact which is electrically connected to the plurality of fin-type active patterns; a first gate electrode which extends along the second direction and is formed on at least two of the plurality of fin-type active patterns; and a second gate electrode which extends along the second direction and is formed on at least one of the plurality of fin-type active patterns. The first gate electrode is disposed between the contact and the second gate electrode, and the number of fin-type active patterns intersected by the first gate electrode is greater than the number of fin-type active patterns intersected by the second gate electrode.

19 Claims, 51 Drawing Sheets

(56) References Cited

U.S. PATENT DOCUMENTS

| | | | |
|---|---|---|---|
| 2008/0157176 A1* | 7/2008 | Kim | H01L 27/115 257/321 |
| 2011/0115024 A1* | 5/2011 | Lee | H01L 21/82343 257/368 |
| 2013/0119481 A1 | 5/2013 | Butt et al. | |
| 2013/0148409 A1 | 6/2013 | Chung | |
| 2013/0153960 A1 | 6/2013 | Yang | |
| 2013/0175638 A1 | 7/2013 | Ho et al. | |
| 2013/0270559 A1 | 10/2013 | Hafez et al. | |
| 2013/0277748 A1 | 10/2013 | Lee et al. | |
| 2013/0294141 A1* | 11/2013 | Oh | G11C 17/18 365/96 |
| 2013/0299940 A1 | 11/2013 | Kurz et al. | |
| 2013/0322150 A1* | 12/2013 | Kim | G11C 17/16 365/104 |

* cited by examiner

FIG. 46
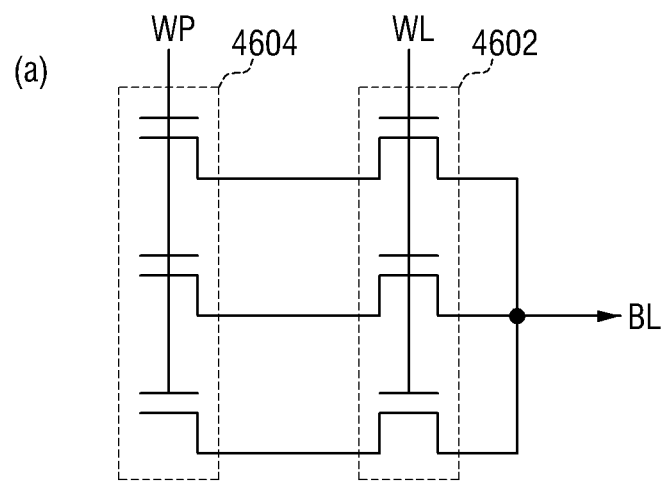
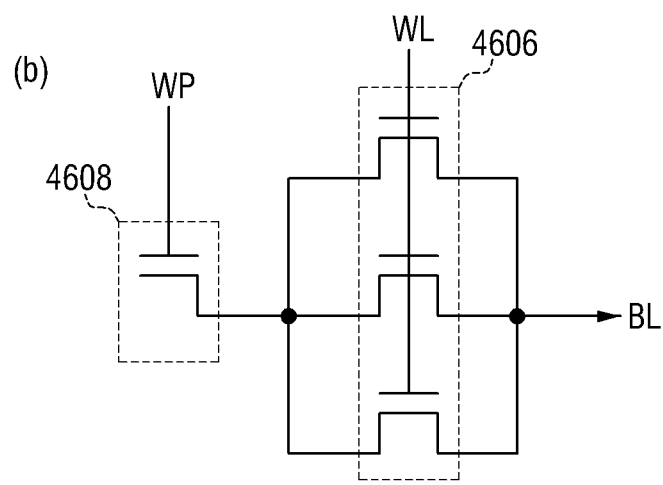

SEMICONDUCTOR DEVICE HAVING FIN-TYPE ACTIVE PATTERNS AND GATE NODES

This application claims priority from Korean Patent Application No. 10-2014-0043030 filed on Apr. 10, 2014 in the Korean Intellectual Property Office and also claims priority from Korean Patent Application No. 10-2015-0020250 filed on Feb. 10, 2015 in the Korean Intellectual Property Office, the disclosure of which is incorporated herein by reference in its entirety.

BACKGROUND

1. Field

The present disclosure relates to a semiconductor device, and more particularly, to a semiconductor device including antifuse elements.

2. Description of the Related Art

In general, programmable memory is used in microcontroller units (MCUs), power integrated circuits (ICs), display driver ICs, complementary metal oxide semiconductor (CMOS) image sensors, etc. used for example as mobile parts or automobile parts. For such programmable memory, one-time programmable (OTP) memory, which occupies a small area, does not require an additional process, and is programmed by electrically short-circuiting with a breakdown mechanism when a high voltage is applied to a thin gate oxide layer, is widely used.

Programmable memory devices such as OTP memory devices are usually programmed by breaking connections (using fuses) or creating connections (using antifuses) in a memory circuit. For example, a programmable read-only memory (PROM) includes a fuse and/or an antifuse at a memory position or a bit and is programmed by triggering one of the fuse and the antifuse. Once programming is done, it is usually irreversible. Usually, programming is carried out after memory devices are manufactured, taking a particular end use or application into account.

Fuse connection is implemented by resistive fuse elements that open or break at a certain amount of high current. Antifuse connection is implemented by a thin barrier layer formed of a non-conductive material (such as silicon dioxide) between two conductive layers or terminals. When a sufficiently high voltage is applied to the terminals, silicon dioxide or such non-conductive material becomes a short circuit or a low-resistance conductive path between the two terminals.

SUMMARY

Aspects of the present invention provide a semiconductor device capable of increasing a ratio of an On current to an Off current which is one of characteristics of an antifuse element.

However, aspects of the present invention are not restricted to the ones set forth herein. The above and other aspects of the present invention will become more apparent to one of ordinary skill in the art to which the present invention pertains by referencing the detailed description given below.

According to one embodiment, a semiconductor device includes: a substrate; a first fin-type active pattern extending along a first direction on the substrate, and comprising first through fourth lengthwise regions arranged sequentially along the first direction; a second fin-type active pattern extending along the first direction on the substrate, and comprising a first lengthwise region and a second lengthwise region arranged sequentially along the first direction. The first lengthwise region of the first fin-type active pattern corresponds with the first lengthwise region of the second fin-type active pattern to face the first lengthwise region of the second fin-type active pattern, and the second lengthwise region of the first fin-type active pattern corresponds with the second lengthwise region of the second fin-type active pattern to face the second lengthwise region of the second fin-type active pattern. The semiconductor device further includes a first gate electrode extending along a second direction different from the first direction and formed on the second lengthwise region of the first fin-type active pattern and the second lengthwise region of the second fin-type active pattern; a second gate electrode extending along the second direction, formed on the fourth lengthwise region of the first fin-type active pattern, and not formed on the second fin-type active pattern; and a contact electrically connected to the first lengthwise region of the first fin-type active pattern and the first lengthwise region of the second fin-type active pattern.

According to one embodiment, the second gate electrode is a gate terminal for a rupture transistor of an anti-fuse device. The antifuse device may include a plurality of access transistors and at least the rupture transistor, and may include a greater number of access transistors than rupture transistors.

According to one embodiment, the first gate electrode forms a gate for an access transistor and is electrically connected to a word line, and the second gate electrode forms a gate for a rupture transistor and is electrically connected to a high-voltage line.

According to one embodiment, the third lengthwise region of the first fin-type active pattern is a region between the second lengthwise region of the first fin-type active pattern and the fourth lengthwise region of the first fin-type active pattern, and the second fin-type active pattern includes a third lengthwise region corresponding to the third lengthwise region of the first fin-type active pattern, wherein the third lengthwise region of the second fin-type active pattern is shorter lengthwise than the third lengthwise region of the first fin-type active pattern.

According to another aspect of the present invention, there is provided a semiconductor device comprising a first fin-type active pattern which is defined by a field insulating layer, extends along a first direction, and comprises first through fourth regions arranged sequentially along the first direction, a second fin-type active pattern which is defined by the field insulating layer, extends along the first direction, and comprises a first region and a second region, a first gate electrode which extends along a second direction different from the first direction and is formed on the second region of the first fin-type active pattern and the second region of the second fin-type active pattern, a second gate electrode which extends along the second direction, is formed on the fourth region of the first fin-type active pattern, and is not formed on the second fin-type active pattern, and a contact which is electrically connected to the first region of the first fin-type active pattern and the first region of the second fin-type active pattern.

The second fin-type active pattern may further comprise a third region, the second region of the second fin-type active pattern is disposed between the first region of the second fin-type active pattern and the third region of the second fin-type active pattern.

The semiconductor device may further comprise a first epitaxial layer which is formed on the third region of the first fin-type active pattern, and a second epitaxial layer which is formed on the third region of the second fin-type active pattern.

The first epitaxial layer and the second epitaxial layer may be connected to each other.

The first fin-type active pattern may further comprise a fifth region, the fourth region of the first fin-type active pattern is disposed between the third region of the first fin-type active pattern and the fifth region of the first fin-type active pattern.

The semiconductor device may further comprise a dummy gate electrode which extends along the second direction and is formed on the fifth region of the first fin-type active pattern, and the dummy gate electrode covers an end portion of the first fin-type active pattern.

The field insulating layer may comprise a first region and a second region higher than the first region, and an end portion of the first fin-type active pattern is located in the fourth region of the first fin-type active pattern, and the second region of the field insulating layer contacts the end portion of the first fin-type active pattern.

The field insulating layer may comprise a first region and a second region higher than the first region, wherein an end portion of the second fin-type active pattern is located in the second region of the second fin-type active pattern, and the second region of the field insulating layer contacts the end portion of the second fin-type active pattern.

The semiconductor device may further comprise a third fin-type active pattern which is defined by the field insulating layer, extends along the first direction, and comprises a first region and a second region, and the first gate electrode is formed on the second region of the third fin-type active pattern, the second gate electrode is not formed on the third fin-type active pattern, and the contact is electrically connected to the first region of the third fin-type active pattern.

The third fin-type active pattern may further comprise a third region, and the second region of the third fin-type active pattern is disposed between the first region of the third fin-type active pattern and the third region of the third fin-type active pattern.

The field insulating layer may comprise a first region and a second region higher than the first region, and an end portion of the third fin-type active pattern is located in the second region of the third fin-type active pattern, and the second region of the field insulating layer contacts the end portion of the third fin-type active pattern.

The semiconductor device may further comprise a third fin-type active pattern which is defined by the field insulating layer, extends along the first direction, and comprises first through fourth regions, and the first through fourth regions of the third fin-type active pattern are arranged sequentially along the first direction, the first gate electrode is formed on the second region of the third fin-type active pattern, the second gate electrode is formed on the fourth region of the third fin-type active pattern, and the contact is electrically connected to the first region of the third fin-type active pattern.

The third fin-type active pattern may further comprise a fifth region, and the fourth region of the third fin-type active pattern is disposed between the third region of the third fin-type active pattern and the fifth region of the third fin-type active pattern.

The field insulating layer may comprise a first region and a second region higher than the first region, and an end portion of the third fin-type active pattern is located in the fourth region of the third fin-type active pattern, and the second region of the field insulating layer contacts the end portion of the third fin-type active pattern.

In one embodiment, each of the first region of the first fin-type active pattern and the third region of the first fin-type active pattern comprises an n-type impurity region.

In one embodiment, the first through fourth regions of the first fin-type active pattern are directly connected to each other.

The first region and the second region of the second fin-type active pattern may be directly connected to each other.

A distance between the contact and the second gate electrode may be greater than a distance between the contact and the first gate electrode.

According to another aspect of the present invention, there is provided a semiconductor device comprising a first fin-type active pattern and a second fin-type active pattern which are defined by a field insulating layer and extend along a first direction, a contact which is electrically connected to the first fin-type active pattern and the second fin-type active pattern, a first gate electrode which extends along a second direction different from the first direction and is formed on the first fin-type active pattern and the second fin-type active pattern, and a second gate electrode which extends along the second direction and is formed on the first fin-type active pattern, wherein the second gate electrode is not formed on the second fin-type active pattern, and the first gate electrode is disposed between the contact and the second gate electrode.

The semiconductor device may further comprise a third fin-type active pattern which is defined by the field insulating layer and extends along the first direction, and the first gate electrode is formed on the third fin-type active pattern, and the contact is electrically connected to the third fin-type active pattern.

In one embodiment, the second gate electrode is not formed on the third fin-type active pattern.

According to still another aspect of the present invention, there is provided a semiconductor device comprising a first fin-type active pattern and a second fin-type active pattern which are defined by a field insulating layer, extend along a first direction, and are arranged along a second direction different from the first direction, a contact which is electrically connected to the first fin-type active pattern and the second fin-type active pattern, a first gate electrode and a second gate electrode which extend along the second direction, are formed on the first fin-type active pattern and the second fin-type active pattern, and are disposed on both sides of the contact, a third gate electrode which extends along the second direction, is formed on the first fin-type active pattern, and is not formed on the second fin-type active pattern, and a fourth gate electrode which extends along the second direction, is formed on the first fin-type active pattern, and is not formed on the second fin-type active pattern, wherein the first gate electrode is disposed between the contact and the third gate electrode, and the second gate electrode is disposed between the contact and the fourth gate electrode.

The semiconductor device may further comprise a third fin-type active pattern which is defined by the field insulating layer and extends along the first direction, and the first gate electrode and the second gate electrode are formed on the third fin-type active pattern, the third gate electrode and the fourth gate electrode are not formed on the third fin-type active pattern, and the contact is electrically connected to the third fin-type active pattern.

The semiconductor device may further comprise a third fin-type active pattern which is defined by the field insulating layer and extends along the first direction, and the first through fourth gate electrodes are formed on the third fin-type active pattern, and the contact is electrically connected to the third fin-type active pattern.

According to still another aspect of the present invention, there is provided a semiconductor device comprising a first fin-type active pattern and a second fin-type active pattern which are defined by a field insulating layer, extend along a first direction, and are arranged along a second direction different from the first direction, a contact which is electrically connected to the first fin-type active pattern and the second fin-type active pattern, a first gate electrode and a second gate electrode which extend along the second direction, are formed on the first fin-type active pattern and the second fin-type active pattern, and are disposed on both sides of the contact, a third gate electrode which extends along the second direction, is formed on the first fin-type active pattern, and is not formed on the second fin-type active pattern, a fourth gate electrode which extends along the second direction, is formed on the second fin-type active pattern, and is not formed on the first fin-type active pattern, and the first gate electrode is disposed between the contact and the third gate electrode, and the second gate electrode is disposed between the contact and the fourth gate electrode.

The semiconductor device may further comprise a third fin-type active pattern which is defined by the field insulating layer and extends along the first direction, and the first gate electrode and the second gate electrode are formed on the third fin-type active pattern, the third gate electrode and the fourth gate electrode are not formed on the third fin-type active pattern, and the contact is electrically connected to the third fin-type active pattern.

The semiconductor device may further comprise a third fin-type active pattern which is defined by the field insulating layer and extends along the first direction, and the first through fourth gate electrodes are formed on the third fin-type active pattern, and the contact is electrically connected to the third fin-type active pattern.

According to still another aspect of the present invention, there is provided a semiconductor device comprising a plurality of fin-type active patterns which are defined by a field insulating layer, extend along a first direction, and are arranged along a second direction different from the first direction, a contact which is electrically connected to the plurality of fin-type active patterns, a first gate electrode which extends along the second direction and is formed on at least one of the plurality of fin-type active patterns, and a second gate electrode which extends along the second direction and is formed on at least one of the plurality of fin-type active patterns, wherein the first gate electrode is disposed between the contact and the second gate electrode, and the number of fin-type active patterns intersected by the first gate electrode is greater than the number of fin-type active patterns intersected by the second gate electrode.

In one embodiment, the first gate electrode intersects all of the plurality of fin-type active patterns.

According to still another aspect of the present invention, there is provided a semiconductor device comprising a first active region which is formed on a substrate, extends along a first direction, and comprises first through fourth regions arranged sequentially along the first direction, a second active region which is formed on the substrate, extends along the first direction, and comprises a first region and a second region, a first gate electrode which extends along a second direction different from the first direction and is formed on the second region of the first active region and the second region of the second active region, a second gate electrode which extends along the second direction, is formed on the fourth region of the first active region, and is not formed on the second active region, and a contact which is electrically connected to the first region of the first active region and the first region of the second active region.

The semiconductor device may further comprise a third active region which is formed on the substrate, extends along the first direction, and comprises a first region and a second region, and the first gate electrode is formed on the second region of the third active region, and the contact is electrically connected to the first region of the third active region.

BRIEF DESCRIPTION OF THE DRAWINGS

The above and other aspects and features of the present invention will become more apparent by describing in detail exemplary embodiments thereof with reference to the attached drawings, in which:

FIGS. 46(a) and 46(b) are diagrams illustrating the effects of a memory cell including a semiconductor device according to embodiments of the present invention;

Figure 1:
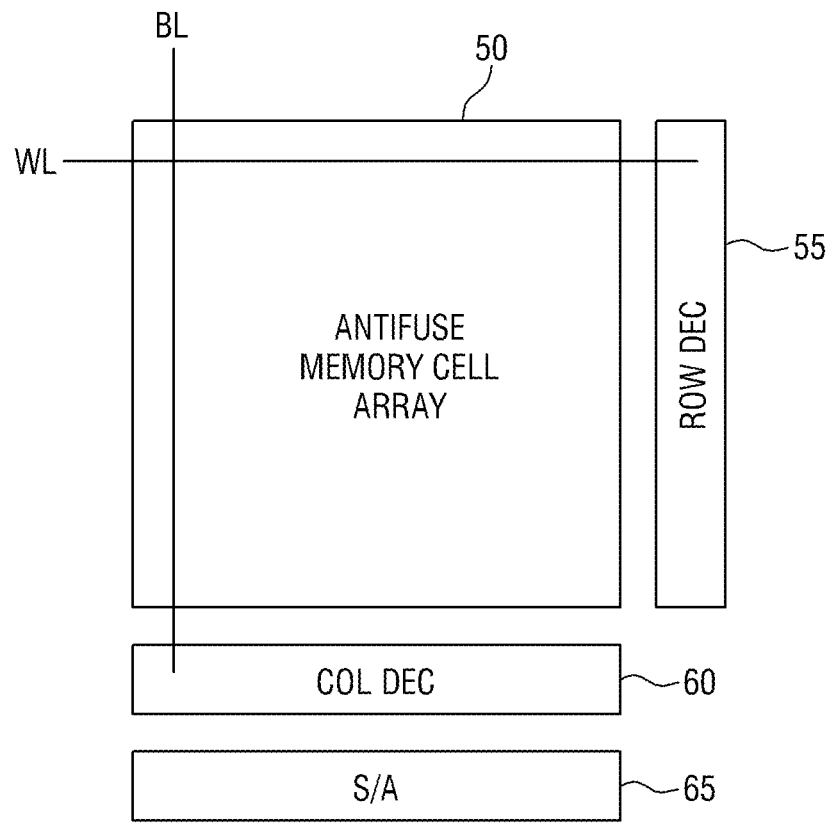
FIG. 1 is a conceptual diagram of a memory device including a semiconductor device according to embodiments of the present invention.

Unless specifically indicated otherwise based on the context of this disclosure, different aspects of the various embodiments disclosed herein can be combined to form a semiconductor device according to further embodiments. Therefore, the various above-described embodiments are not necessarily mutually exclusive of each other.

DETAILED DESCRIPTION OF THE EMBODIMENTS

The present disclosure will now be described more fully hereinafter with reference to the accompanying drawings, in which various embodiments of the invention are shown. This invention may, however, be embodied in different forms and should not be construed as limited to the embodiments set forth herein. The same or similar reference numbers indicate the same or similar components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, or as "contacting" another layer, there are no intervening elements or layers present. It will also be understood that when a layer is referred to as being "on" another layer or substrate, it can be directly on the other layer or substrate, or intervening layers may also be present. In contrast, when an element is referred to as being "directly on" another element, there are no intervening elements present.

Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. Unless the context indicates otherwise, these terms are only used to distinguish one element from another element, for example as a naming convention. Thus, for example, a first element, a first component or a first section discussed below could be termed a second element, a second component or a second section without departing from the teachings of the present invention.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 2:
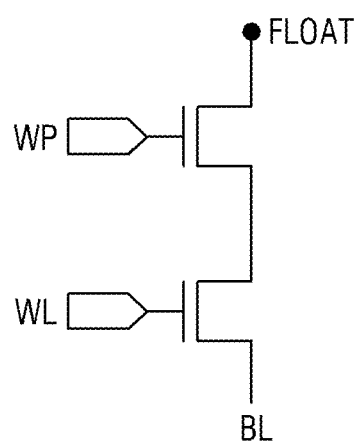
FIG. 2 is a circuit diagram of one antifuse memory cell.

FIG. 1 is a conceptual diagram of a memory device including a semiconductor device according to certain embodiments of the present invention. FIG. 2 is a circuit diagram of one antifuse memory cell.

Referring to FIG. 1, the memory device includes a memory cell array 50, a row decoder 55, a column decoder 60, and a sense amplifier 65.

The memory cell array 50 includes a plurality of antifuse memory cells each located between one of X bit lines BL and one of Y word lines WL, where X and Y are integers of one or more.

Referring to FIG. 2, each of the antifuse memory cells is connected between a bit line BL and a word line WL. In one embodiment, each of the antifuse memory cells, also referred to herein generally as antifuse devices, includes two transistor structures (each which can include one or more transistors, and each which may be referred to herein as a transistor even though it may include a plurality of transistors): an access transistor structure and a rupture transistor structure. The access transistor structure, also described as an access transistor, has a gate terminal connected to a word line WL, a source terminal connected to a drain terminal of the rupture transistor structure, and a drain terminal connected to a bit line BL. The rupture transistor structure, also described herein as a rupture transistor, has a gate terminal connected to a high-voltage line WP, a source terminal connected to a floating terminal FLOAT, and the drain terminal connected to the source terminal of the access transistor.

The row decoder 55 selects a word line WL based on a row of a target cell to be accessed in the memory cell array 50, i.e., based on a decoded word line address.

The column decoder 60 selects a bit line BL based on a column of the target cell to be accessed in the memory cell array 50, i.e., based on a decoded bit line address.

The sense amplifier 65 is connected to an end of each of the bit lines BL to sense and amplify data of the target cell and outputs the sensed and amplified data.

A semiconductor device according to a first embodiment of the present invention will now be described with reference to FIGS. 3 through 7.

Figure 3:
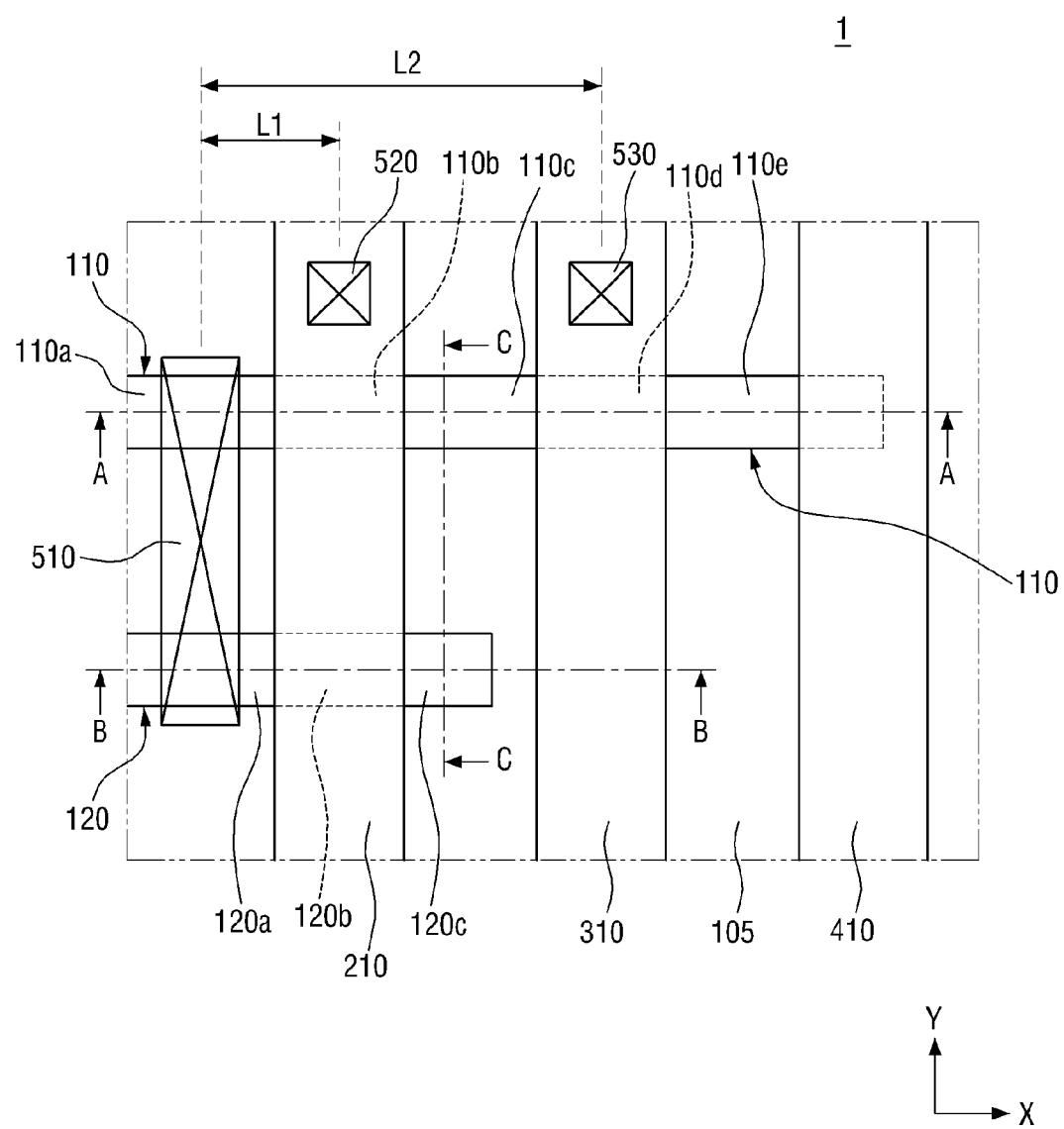
FIG. 3 is a layout view of a semiconductor device according to a first embodiment of the present invention.
Figure 4:
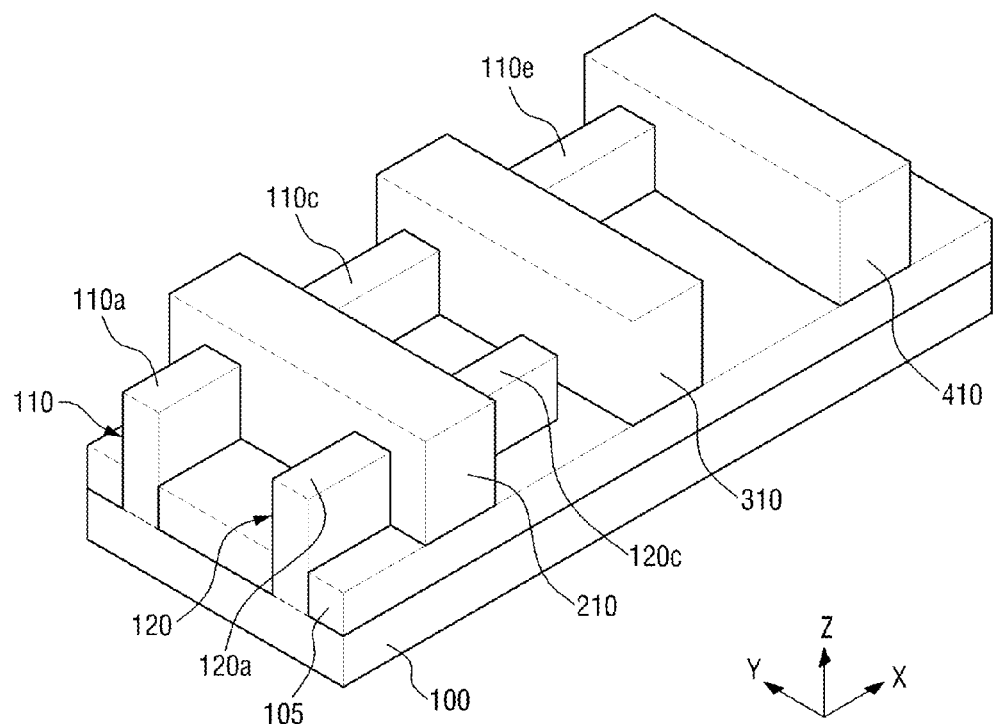
FIG. 4 is a perspective view of the semiconductor device according to the first embodiment of the present invention.
Figure 5:
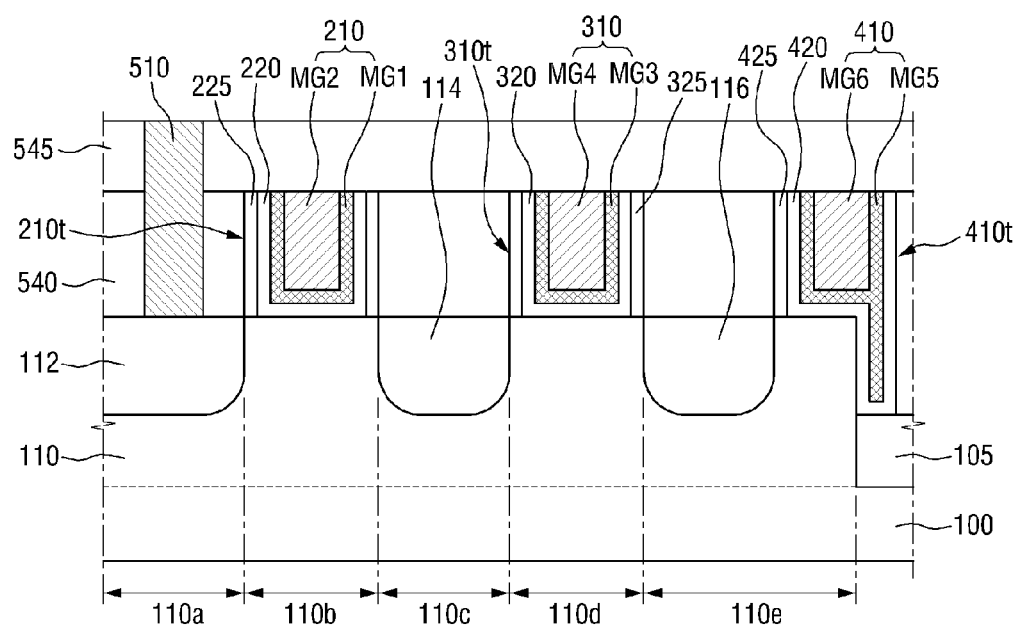
FIG. 5 is a cross-sectional view taken along the line A-A of FIG. 3.
Figure 6:
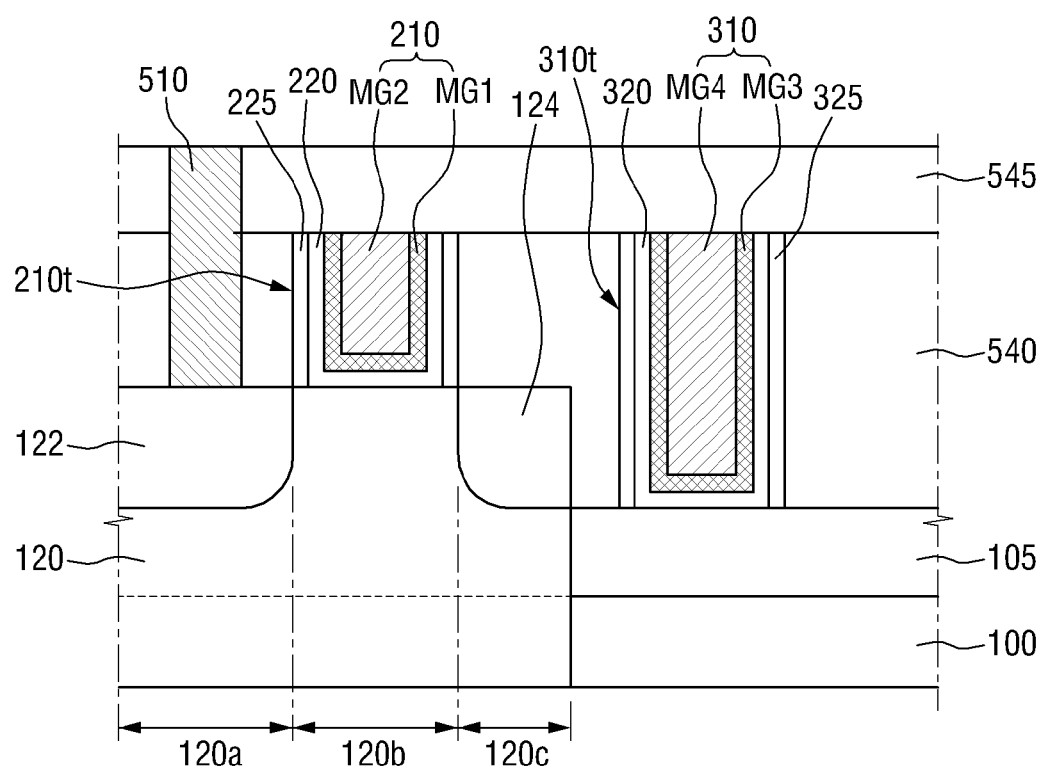
FIG. 6 is a cross-sectional view taken along the line B-B of FIG. 3.
Figure 7:
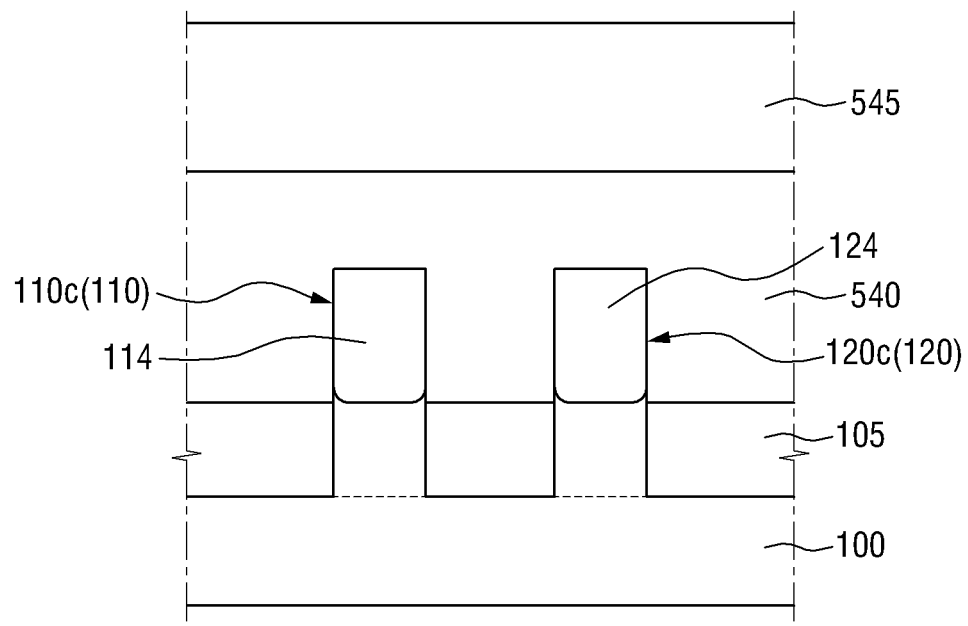
FIG. 7 is a cross-sectional view taken along the line C-C of FIG. 3.

FIG. 3 is a layout view of a semiconductor device 1 according to a first embodiment of the present invention. FIG. 4 is a perspective view of the semiconductor device 1 according to the first embodiment of the present invention. FIG. 5 is a cross-sectional view taken along the line A-A of FIG. 3. FIG. 6 is a cross-sectional view taken along the line B-B of FIG. 3. FIG. 7 is a cross-sectional view taken along the line C-C of FIG. 3. In FIG. 4, first through third contacts 510 through 530, a first interlayer insulating film 540, and a second interlayer insulating film 545 are not illustrated for ease of description.

In addition, a semiconductor device using fin-type active patterns will hereinafter be described, but the present invention is not limited thereto. For example, the present invention may also apply to a semiconductor device using active regions defined by device isolation layers formed in a substrate.

As used herein, a semiconductor device may refer to any of the various devices such as shown in the various figures, and may also refer, for example, to a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIGS. 3 through 7, the semiconductor device 1 according to the first embodiment of the present invention may include a first fin-type active pattern 110, a second fin-type active pattern 120, a first gate electrode 210, a second gate electrode 310, and the first contact 510.

A substrate 100 may be, for example, a bulk silicon substrate or a silicon-on-insulator (SOI) substrate. Otherwise, the substrate 100 may be a silicon substrate or may be a substrate formed of another material such as silicon germanium, indium antimonide, lead telluride, indium arsenide, indium phosphide, gallium arsenide, or gallium antimonide. Alternatively, the substrate 100 may consist of a base substrate and an epitaxial layer formed on the base substrate.

The first fin-type active pattern 110 and the second fin-type active pattern 120 may protrude from the substrate 100. A field insulating layer 105 may partially cover side surfaces of each of the first fin-type active pattern 110 and the second fin-type active pattern 120. For example, a top surface of the first fin-type active pattern 110 and a top surface of the second fin-type active pattern 120 may protrude past a top surface of the field insulating layer 105 formed on the substrate 100.

In one embodiment, each of the first fin-type active pattern 110 and the second fin-type active pattern 120 is defined by the field insulating layer 105. For example, from a plan view, the side surfaces of the first fin-type active pattern 110 may contact side surfaces of the field insulating layer 105, and side surfaces of the second fin-type active pattern 120 may contact side surfaces of the field insulating layer 105, to define the boundaries of the first and second fin-type active patterns 110 and 120. The field insulating layer 105 may include one of, e.g., an oxide layer, a nitride layer, an oxynitride layer, and combinations of the same.

Each of the first fin-type active pattern 110 and the second fin-type active pattern 120 may extend along a first direction X. The first fin-type active pattern 110 and the second fin-type active pattern 120 may be arranged with respect to each other along a second direction Y.

More specifically, each of the first fin-type active pattern 110 and the second fin-type active pattern 120 may include long sides, also referred to as extension-direction sides, extending along the first direction X and short sides, also referred to as end sides, extending along the second direction Y. In the first fin-type active pattern 110 and the second fin-type active pattern 120 arranged along the second direction Y, a first long side of the first fin-type active pattern 110 may face a first long side of the second fin-type active pattern 120.

In certain embodiments, each of the first fin-type active pattern 110 and the second fin-type active pattern 120 may be part of the substrate 100 and may include an epitaxial layer grown from the substrate 100.

The first fin-type active pattern 110 and the second fin-type active pattern 120 may include an element semiconductor material such as silicon or germanium. In addition, the first fin-type active pattern 110 and the second fin-type active pattern 120 may include a compound semiconductor such as a group IV-IV compound semiconductor or a group III-V compound semiconductor.

Specifically, the group IV-IV compound semiconductor may be a binary or ternary compound containing two or more of carbon (C), silicon (Si), germanium (Ge) and tin (Sn) or a compound obtained by doping the binary or ternary compound with a group IV element.

In an example of the group III-V compound semiconductor, each of the first fin-type active pattern 110 and the second fin-type active pattern 120 may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

Semiconductor devices according to certain embodiments of the present invention will be described based on the assumption that the first fin-type active pattern 110 and the second fin-type active pattern 120 contain silicon. However, the fin-type active patterns are not limited as such.

The first fin-type active pattern 110 may include first through fourth regions 110a through 110d. The first region 110a of the first fin-type active pattern 110, the second region 110b of the first fin-type active pattern 110, the third region 110c of the first fin-type active pattern 110, and the fourth region 110d of the first fin-type active pattern 110 may be arranged sequentially along the first direction X (e.g., a lengthwise direction of the fin-type active pattern).

The first through fourth regions 110a through 110d of the first fin-type active pattern 110 may be directly connected to each other. For example, they may be continuously formed.

The first fin-type active pattern 110 may further include a fifth region 110e on a side of the fourth region 110d of the first fin-type active pattern 110. For example, the fourth region 110d of the first fin-type active pattern 110 is disposed between the third region 110c of the first fin-type active pattern 110 and the fifth region 110e of the first fin-type active pattern 110.

The first through fifth regions 110a through 110e of the first fin-type active pattern 110 may be arranged sequentially along the first direction X.

In the semiconductor device 1 according to the first embodiment of the present invention, one of the end portions of the first fin-type active pattern 110 may be located in the fifth region 110e of the first fin-type active pattern 110. For example, the fifth region 110e of the first fin-type active pattern 110 may include one of the end sides of the first fin-type active pattern 110.

The second fin-type active pattern 120 may include a first region 120a and a second region 120b. The first region 120a of the second fin-type active pattern 120 and the second region 120b of the second fin-type active pattern 120 may be directly connected to each other. For example, they may be continuously formed. The regions of the fin-type active patterns described herein may also be referred to as sections or portions. Thus, different regions, sections, or portions of each fin-type active pattern may be described as different lengthwise regions, sections, or portions. Corresponding lengthwise regions, sections, or portions of two fin-type active patterns (e.g., first fin-type active pattern 110 and second fin-type active pattern 120) may refer to regions, sections, or portions that correspond in the X-direction. The corresponding regions, sections, or portions, may have the same lengths, or may have different lengths. Each fin-type active pattern, such as first fin-type active pattern 110, or second fin-type active pattern 120, may also be referred to herein as a fin.

The second fin-type active pattern 120 may further include a third region 120c on a side of the second region 120b of the second fin-type active pattern 120. For example, the second region 120b of the second fin-type active pattern 120 may be disposed between the first region 120a of the second fin-type active pattern 120 and the third region 120c of the second fin-type active pattern 120.

The first through third regions 120a through 120c of the second fin-type active pattern 120 may be arranged sequentially along the first direction X.

In the semiconductor device 1 according to the first embodiment of the present invention, one of end portions of the second fin-type active pattern 120 is located in the third region 120c of the second fin-type active pattern 120. As such, the third region 120c of the second fin-type active pattern 120 may include one of the short (e.g., end) sides of the second fin-type active pattern 120.

The first through third regions 110a through 110c of the first fin-type active pattern 110 may correspond to the first through third regions 120a through 120c of the second fin-type active pattern 120, respectively. For example, the first region 110a of the first fin-type active pattern 110 may correspond to the first region 120a of the second fin-type active pattern 120. For example, they may correspond in the X-direction. The second region 110b of the first fin-type active pattern 110 may correspond to the second region 120b of the second fin-type active pattern 120. For example, they may correspond in the X-direction. In one embodiment, both first regions 110a and 120a correspond in the X-direction and have the same length to extend along the same X-direction locations, and both second regions 110b and 120b correspond in the X-direction and have the same length to extend along the same X-direction locations. In addition, the third region 110c of the first fin-type active pattern may correspond to the third region 120c of the second fin-type active pattern 120. For example, they may correspond in the X-direction. In one embodiment, the corresponding parts in the third regions 110c and 120c face each other but do not have, e.g., equal lengths in the X-direction, while the corresponding parts in each of the first regions 110a and 120a and second regions 110b and 120b face each other and have equal lengths.

The first interlayer insulating film 540 is formed on the substrate 100. The first interlayer insulating film 540 covers the first fin-type active pattern 110, the second fin-type active pattern 120, and the field insulating layer 105. The first interlayer insulating film 540 may include a first trench 210t and a second trench 310t extending along the second direction Y. The first interlayer insulating film 540 may further include a third trench 410t extending along the second direction Y.

The first trench 210t may intersect at least part of the second region 120b of the second fin-type active pattern 120 and the second region 110b of the first fin-type active pattern 110. The second trench 310t may intersect at least part of the fourth region 110d of the first fin-type active pattern 110.

The first interlayer insulating film 540 may include, for example, at least one of a low-k material, an oxide layer, a nitride layer, and an oxynitride layer. The low-k material may be made of, but is not limited to, Flowable Oxide (FOX), Tonen SilaZen (TOSZ), Undoped Silica Glass (USG), Borosilica Glass (BSG), PhosphoSilaca (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or any combination of the same.

The second interlayer insulating film 545 is formed on the first interlayer insulating film 540. The second interlayer insulating film 545 may include, for example, at least one of a low-k material, an oxide layer, a nitride layer, and an oxynitride layer.

The first gate electrode 210 may be formed in the first trench 210t. The first gate electrode 210 may be formed on the field insulating layer 105, the first fin-type active pattern 110, and the second fin-type active pattern 120. More specifically, the first gate electrode 210 is formed on the second region 110b of the first fin-type active pattern 110 and the second region 120b of the second fin-type active pattern 120.

The first gate electrode 210 may extend along the second direction Y and intersect the first fin-type active pattern 110 and the second fin-type active pattern 120.

The first gate electrode 210 may include, for example metal layers (MG1, MG2). As illustrated in the drawings, the first gate electrode 210 may be formed by stacking two or more metal layers (MG1, MG2), but the present invention is not limited thereto. A first metal layer MG1 may control a work function, and a second metal layer MG2 may fill a space formed by the first metal layer MG1. For example, the first metal layer MG1 may include at least one of TiN, TaN, TiC, and TaC. In addition, the second metal layer MG2 may include W or Al. Alternatively, the first gate electrode 210 may be made of a material (e.g., Si or SiGe) other than metal. The first gate electrode 210 may be formed by, but is not limited to, a replacement process.

In the semiconductor devices according to certain disclosed embodiments, the first gate electrode 210 may be the gate terminal of the access transistor illustrated in FIG. 2. As such, the first gate electrode 210 may be connected to a word line WL. Further, as shown, the access transistor may include two fins-type active patterns 110 and 120 crossed by the gate electrode 210.

The second gate electrode 310 may be formed in the second trench 310t. The second gate electrode 310 may be formed on the field insulating layer 105 and the first fin-type active pattern 110. However, in the semiconductor device 1 according to the first embodiment of the present invention, the second gate electrode 310 is not formed on the second fin-type active pattern 120. More specifically, the second gate electrode 310 is formed on the fourth region 110d of the first fin-type active pattern 110.

The second gate electrode 310 may extend along the second direction Y and intersect the first fin-type active pattern 110. However, in one embodiment, the second gate electrode 310 does not intersect the second fin-type active pattern 120.

In the semiconductor devices according to certain embodiments, the second gate electrode 310 may be the gate terminal of the rupture transistor illustrated in FIG. 2. As such, the second gate electrode 310 may be connected to the high-voltage line WP.

The second gate electrode 310 may include metal layers (MG3, MG4). As illustrated in the drawings, the second gate electrode 310 may be formed by stacking two or more metal layers (MG3, MG4), but the present invention is not limited thereto. Since a description of the second gate electrode 310 can be the repetition of the description of the first gate electrode 210, it will be omitted.

A first gate insulating layer 220 may be formed between the first fin-type active pattern 110 and the first gate electrode 210 and between the second fin-type active pattern 120 and the first gate electrode 210. The first gate insulating layer 220 may be formed on top and side surfaces of the second region 110b of the first fin-type active pattern 110 and top and side surfaces of the second region 120b of the second fin-type active pattern 120. In addition, the first gate insulating layer 220 may be formed between the first gate electrode 210 and the field insulating layer 105.

A second gate insulating layer 320 may be formed between the first fin-type active pattern 110 and the second gate electrode 310. The second gate insulating layer 320 may be formed on top and side surfaces of the fourth region 110d of the first fin-type active pattern 110. In addition, the second gate insulating layer 320 may be formed between the first gate electrode 210 and the field insulating layer 105.

Each of the first gate insulating layer 220 and the second gate insulating layer 320 may include, for example, silicon oxide, silicon nitride, silicon oxynitride, or a high-k material. For example, the high-k material may include one or more of, but is not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In the drawings, the first gate insulating layer 220 is formed along side surfaces and bottom surfaces of the first trench 210*t*, and the second gate insulating layer 320 is formed along side surfaces and bottom surfaces of the second trench 310*t*. However, the present invention is not limited thereto.

First gate spacers 220 may be formed on sidewalls of the first gate electrode 210 extending along the second direction Y. Second gate spacers 325 may be formed on sidewalls of the second gate electrode 310 extending along the second direction Y.

Each of the first and second gate spacers 225 and 325 may include, for example, at least one of silicon nitride (SiN), silicon oxynitride (SiON), silicon oxide ($SiO_2$), silicon oxycarbonitride (SiOCN), and combinations of the same. In the drawings, each of the first and second gate spacers 225 and 325 is illustrated as a single layer. However, the present invention is not limited thereto, and each of the first and second gate spacers 225 and 325 may also have a multilayer structure.

A first impurity region 112 may be formed in the first region 110*a* of the first fin-type active pattern 110, and a second impurity region 114 may be formed in the third region 110*c* of the first fin-type active pattern 110. A third impurity region 122 may be formed in the first region 120*a* of the second fin-type active pattern 120.

If the first fin-type active pattern 110 further includes the fifth region 110*e*, a fourth impurity region 116 may be formed in the fifth region 110*e* of the first fin-type active pattern 110. Further, if the second fin-type active pattern 120 further includes the third region 120*c*, a fifth impurity region 124 may be formed in the third region 120*c* of the second fin-type active pattern 120.

The third impurity region 122 may be an impurity region shared by the first gate electrode 210 and the second gate electrode 310.

In the semiconductor device 1 according to the first embodiment of the present invention, the first impurity region 112, the second impurity region 114, and the fourth impurity region 116 may be formed in the first fin-type active pattern 110, and the third impurity region 122 and the fifth impurity region 124 may be formed in the second fin-type active pattern 120.

In the semiconductor devices according to the embodiments of the present invention, if the first gate electrode 210 is a gate terminal of a p-channel metal oxide semiconductor (PMOS) transistor, the first through fifth impurity regions 112, 114, 116, 122 and 124 may include, e.g., p-type impurities. The p-type impurities may be, but are not limited to, boron (B).

In the semiconductor devices according to the embodiments of the present invention, if the first gate electrode 210 is a gate terminal of an n-channel metal oxide semiconductor (NMOS) transistor, the first through fifth impurity regions 112, 114, 116, 122 and 124 may include, e.g., n-type impurities. The n-type impurities may be, but are not limited to, P, As, or Sb.

The semiconductor device 1 according to the first embodiment of the present invention may further include a third gate electrode 410.

The first interlayer insulating film 540 may include the third trench 410*t* which intersects part of the fifth region 110*e* of the first fin-type active pattern 110.

The third gate electrode 410 may be formed in the third trench 410*t*. The third gate electrode 410 may be formed on the field insulating layer 105 and the first fin-type active pattern 110. However, the third gate electrode 410 is not formed on the second fin-type active pattern 120. For example, the third gate electrode 410 is formed on the fifth region 110*e* of the first fin-type active pattern 110.

The third gate electrode 410 may extend along the second direction Y and intersect at least part of the first fin-type active pattern 110. For example, the third gate electrode 410 may intersect at least part of the fifth region 110*e* of the first fin-type active pattern 110.

In the semiconductor device 1 according to the first embodiment of the present invention, the third gate electrode 410 may be an electrically floating gate electrode. For example, the third gate electrode 410 may be a dummy gate electrode.

In the semiconductor device 1 according to the first embodiment of the present invention, the third gate electrode 410 may cover one of the end portions of the first fin-type active pattern 110. The third gate electrode 410 may cover one of the short (e.g., end) sides of the first fin-type active pattern 110. Since one of the end portions of the first fin-type active pattern 110 is located in the fifth region 110*e* of the first fin-type active pattern 110, the third gate electrode 410 may partially cover the fifth region 110*e* of the first fin-type active pattern 110.

The third gate electrode 410 may include, for example, metal layers (MG5, MG6). As illustrated in the drawings, the third gate electrode 410 may be formed by stacking two or more metal layers (MG5, MG6), but the present invention is not limited thereto. Since a description of the third gate electrode 410 can be the repetition of the description of the first gate electrode 210, it will be omitted.

Referring to FIG. 4, the top surface of the field insulating layer 105 is below a bottom surface of the first gate electrode 210, a bottom surface of the second gate electrode 310, and a bottom surface of the third gate electrode 410. Here, the "bottom surface" of each of the gate electrodes 210 through 410 refers to the lowest part of a lower surface thereof. In FIG. 4, a portion that contacts the top surface of the field insulating layer 105 may be the bottom surface.

A third gate insulating layer 420 may be formed between the first fin-type active pattern 110 and the third gate electrode 410. Third gate spacers 425 may be formed on sidewalls of the third gate electrode 410 extending along the second direction Y.

The first contact 510 is formed on the first region 110*a* of the first fin-type active pattern 110 and the first region 120*a* of the second fin-type active pattern 120. The first contact 510 may penetrate through the first interlayer insulating film 540 and the second interlayer insulating film 545, but the present invention is not limited thereto.

The first contact 510 is electrically connected to the first region 110*a* of the first fin-type active pattern 110 and the first region 120*a* of the second fin-type active pattern 120. More specifically, the first contact 510 is electrically connected to the first impurity region 112 and the third impurity region 122. The first contact 510 may contact each of the first impurity region 112 and the third impurity region 122.

The first contact 510 may electrically connect the first region 110*a* of the first fin-type active pattern 110 and the first region 120*a* of the second fin-type active pattern 120.

The second contact 520 is formed on the first gate electrode 210. The second contact 520 is electrically connected to the first gate electrode 210. For example, the first gate electrode 210 may be connected to the high-voltage line WP of FIG. 2 by the second contact 520.

The third contact 530 is formed on the second gate electrode 310. The third contact 530 is electrically connected to the second gate electrode 310. For example, the second gate electrode 310 may be connected to the word line WL of FIG. 2 by the third contact 530.

The first contact 510, the second contact 520, and the third contact 530 may include, but are not limited to, Al, Cu, or W.

In the semiconductor devices according to certain embodiments, the first impurity region 112 and the third impurity region 122 may be the drain terminal of the access transistor illustrated in FIG. 2. Therefore, the first impurity region 112 and the third impurity region 122 may be connected to the bit line BL. Further, the first impurity region 112 and the third impurity region 122 may be connected to the bit line BL by the first contact 510.

In the semiconductor devices according to certain embodiments, the second impurity region 114 shared by the first gate electrode 210 and the second gate electrode 310 may be the source terminal of the access transistor and the drain terminal of the rupture transistor illustrated in FIG. 2.

A contact electrically connected to the second impurity region 114 for electrically connecting the first fin-type active pattern 110 to a wiring line supplying power or an electrical signal is not formed on the second impurity region 114. More specifically, this type of contact for electrically connecting to the third region 110c of the first fin-type active pattern 110 is not formed on the third region 110c of the first fin-type active pattern 110. As such, the third region 110c of the first fin-type active pattern 110 is not electrically connected to a wiring line, such as word line (WL) or bit line (BL), a wiring line providing electrical signal from an external source, or the like.

Accordingly, in one embodiment, a contact, which electrically connects the first fin-type active pattern 110 to a wiring line supplying power or electrical signal, is not formed on the first fin-type active pattern 110 located between the first gate electrode 210 and the second gate electrode 310.

On the other hand, though not shown in FIGS. 3 and 5, in one embodiment, the second impurity region 114 is electrically connected to the fifth impurity region 124 formed in the third region 120c of the second fin-type active pattern 120. For example, the second impurity region 114 and the fifth impurity region 124 may be strapped by a conductive line connecting the two regions to each other.

In the semiconductor device 1 according to the first embodiment of the present invention, the fourth impurity region 116 which may be the source terminal of the rupture transistor illustrated in FIG. 2 may be electrically floating.

In the semiconductor devices according to certain embodiments, the first gate electrode 210 is disposed between the first contact 510 and the second gate electrode 310. As such, the first contact 510, the first gate electrode 210, and the second gate electrode 310 are arranged sequentially along the first direction X.

Therefore, the first gate electrode 210 and the second gate electrode 310 are located on one side of the first contact 510 in the first direction X. A distance from the first contact 510 to the first gate electrode 210 is a first distance L1, and a distance from the first contact 510 to the second gate electrode 310 is a second distance L2. The second distance L2 from the first contact 510 to the second gate electrode 310 is greater than the first distance L1 from the first contact 510 to the first gate electrode 210. Here, the term "distance" denotes a gap between a center of a width of a contact in the first direction X and a center of a width of a gate electrode in the first direction X, though distances can be measured from other respective portions of each component. As such, in certain embodiments, a distance between a bit line (BL) contact (e.g., 510) at the drain terminal (e.g., 112) of the access transistor and a word line gate (e.g., 210) of the access transistor is shorter than the distance between the bit line (BL) contact (e.g., 510) at the drain terminal (e.g., 112) of the access transistor and the gate (e.g., 310) for the rupture transistor to which a high voltage line can be connected to cause the gate insulating layer to rupture in the manner of an anti-fuse. In certain embodiments, after the high voltage is applied, the gate insulating layer for gate 310 is a ruptured gate insulating layer, such that the gate 310 is short circuited to the first fin-type active pattern 110.

Referring to FIG. 3, the first fin-type active pattern 110 includes the first region 110a and the third region 110c which protrude, or extend, in the first direction X from side surfaces of the first gate electrode 210. The second fin-type active pattern 120 includes the first region 120a and the third region 120c which protrude, or extend, in the first direction X from the side surfaces of the first gate electrode 210. The first region 110a of the first fin-type active pattern 110 and the first region 120a of the second fin-type active pattern 120 may together form a drain for an access transistor of an anti-fuse device, such as shown in FIG. 2.

Further, the first fin-type active pattern 110 includes the third region 110c and the fifth region 110e which protrude, or extend, in the first direction X from side surfaces of the second gate electrode 310. However, since the second gate electrode 310 is not formed on the second fin-type active pattern 120, the second fin-type active pattern 120 does not include regions which protrude in the first direction X from the side surfaces of the second gate electrode 310.

A modified example of the semiconductor device 1 according to the first embodiment of the present invention will now be described with reference to FIGS. 7 and 8.

Figure 8:
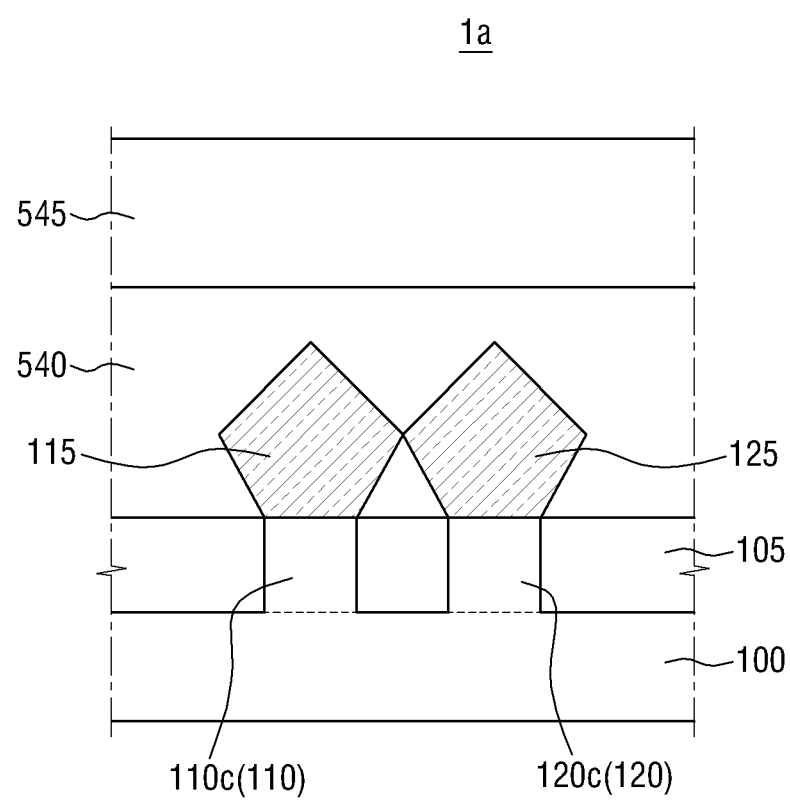
FIG. 8 is a view of a modified example of a semiconductor device according to the first embodiment of the present invention.

Referring to FIGS. 7 and 8, a modified example 1a of the semiconductor device 1 according to the first embodiment of the present invention further includes a first epitaxial layer 115 and a second epitaxial layer 125.

The first epitaxial layer 115 is formed on a first fin-type active pattern 110. For example, in one embodiment, the first epitaxial layer 115 is formed on a third region 110c of the first fin-type active pattern 110. A second impurity region 114 includes the first epitaxial layer 115.

The second epitaxial layer 125 is formed on a second fin-type active pattern 120. For example, in one embodiment, the second epitaxial layer 125 is formed on a third region 120c of the second fin-type active pattern 120. A fifth impurity region 124 includes the second epitaxial layer 125.

An outer circumferential surface of each of the first epitaxial layer 115 and the second epitaxial layer 125 may have various shapes. For example, the outer circumferential surface of each of the first epitaxial layer 115 and the second epitaxial layer 125 may have at least one of a diamond shape, a circular shape, and a rectangular shape. In FIG. 8, the diamond shape (or a pentagonal shape or a hexagonal shape) is illustrated.

In the modified example 1a of the semiconductor device 1 according to the first embodiment of the present invention, the first epitaxial layer 115 and the second epitaxial layer 125 may include the same material.

In the modified example 1a of the semiconductor device 1 according to the first embodiment of the present invention, if a first gate electrode 210 is a gate terminal of a PMOS transistor, the first epitaxial layer 115 may include a compressive stress material. The compressive stress material may be a material (e.g., SiGe) having a greater lattice constant than Si. The compressive stress material may improve the mobility of carriers in a channel region by applying compressive stress to the first fin-type active pattern 110 (e.g., a second region 110b of the first fin-type active pattern 110).

In the modified example 1a of the semiconductor device 1 according to the first embodiment of the present invention, if the first gate electrode 210 is a gate terminal of an NMOS transistor, the first epitaxial layer 111 may be made of the same material as the first fin-type active pattern 110 or a tensile stress material. For example, if the first fin-type active pattern 110 is Si, the first epitaxial layer 115 may be Si or a material (e.g., SiC) having a smaller lattice constant than Si.

In FIG. 8, the first epitaxial layer 115 and the second epitaxial layer 125 are formed on the third region 110c of the first fin-type active pattern 110 and the third region 120c of the second fin-type active pattern 120, respectively. However, this is merely one example.

For example, in the modified example 1a of the semiconductor device 1 according to the first embodiment of the present invention, each of first through fifth impurity regions 112, 114, 116, 122 and 124 may include an epitaxial layer. Therefore, the first through fifth impurity regions 112, 114, 116, 122 and 124, each including the epitaxial layer, are formed on corresponding regions of the first fin-type active pattern 110 and the second fin-type active pattern 120.

In FIG. 8, the first epitaxial layer 115 formed on the third region 110c of the first fin-type active pattern 110 may be connected to the second epitaxial layer 125 formed on the third region 120c of the second fin-type active pattern 120. However, the present invention is not limited thereto, and the first epitaxial layer 115 and the second epitaxial layer 125 may also be separated from each other.

Semiconductor devices according to second through fourth embodiments of the present invention will now be described with reference to FIGS. 9 through 13. For simplicity, the second through fourth embodiments will hereinafter be described, focusing mainly on differences with the embodiment of FIGS. 3 through 8.

Figure 9:
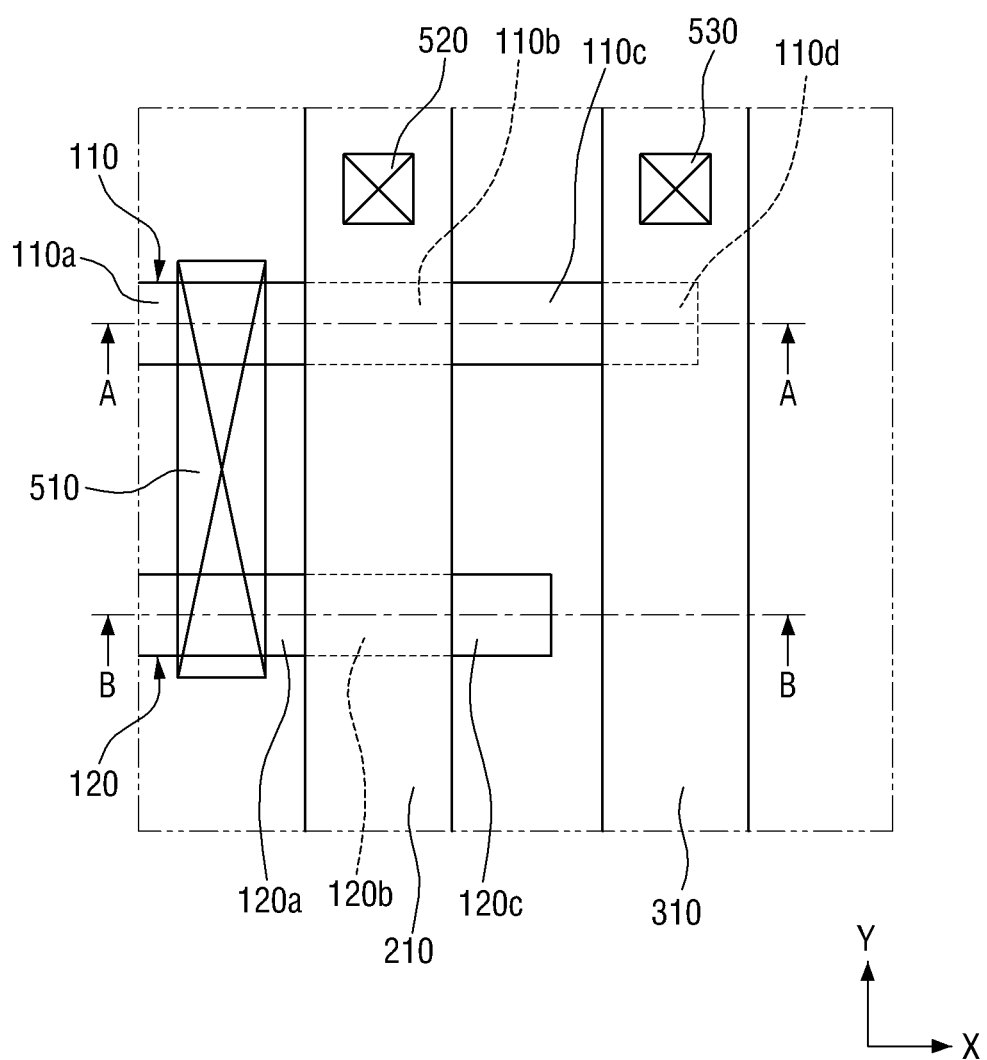
FIGS. 9 and 10 are views of a semiconductor device according to a second embodiment of the present invention.
Figure 10:
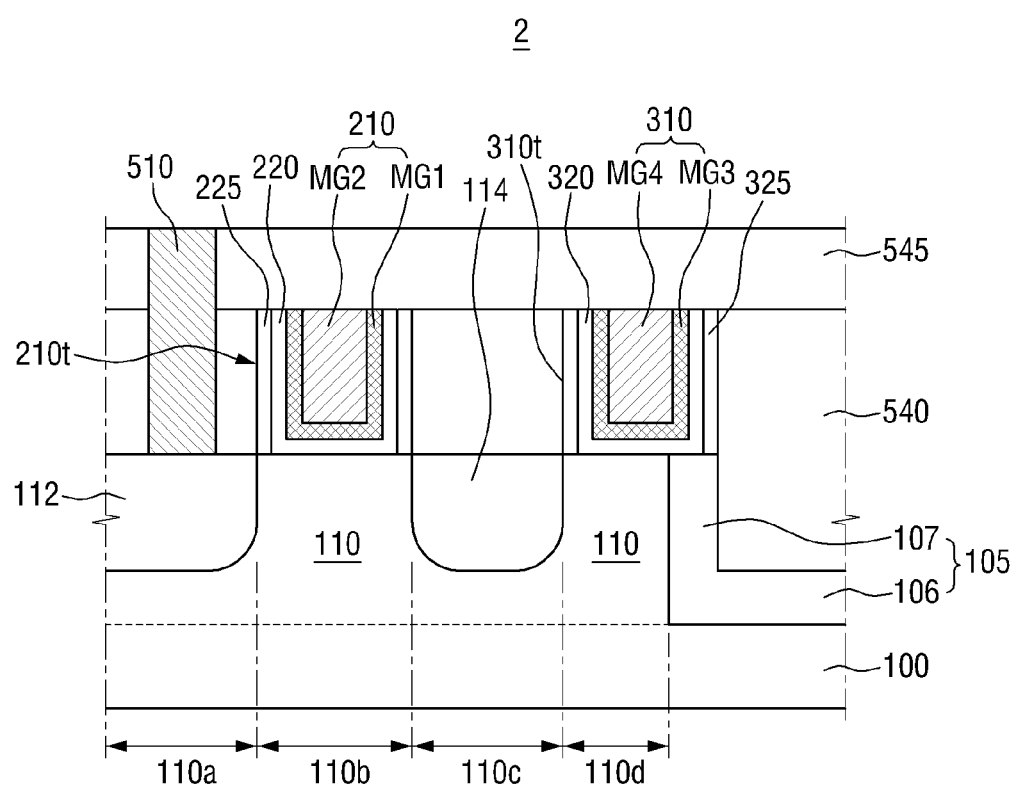
Figure 11:
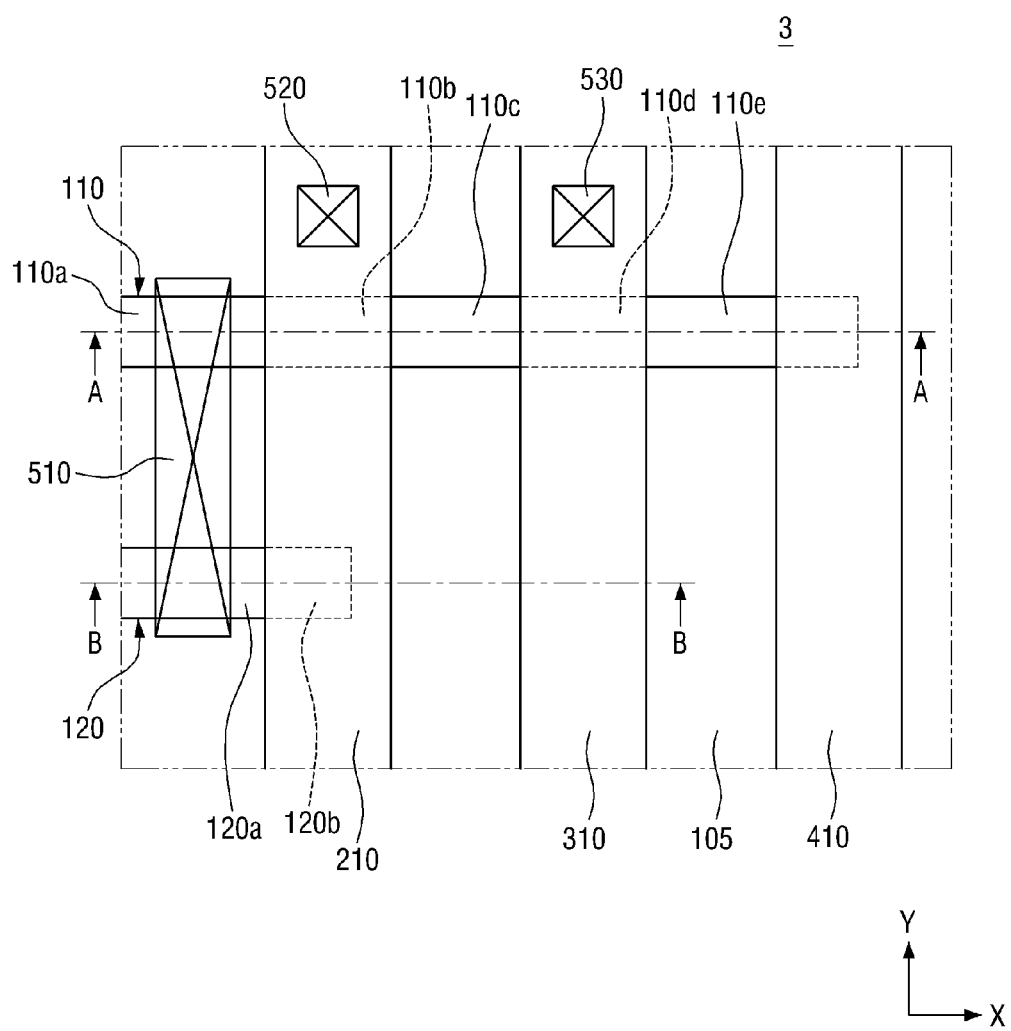
FIGS. 11 and 12 are views of a semiconductor device according to a third embodiment of the present invention.
Figure 12:
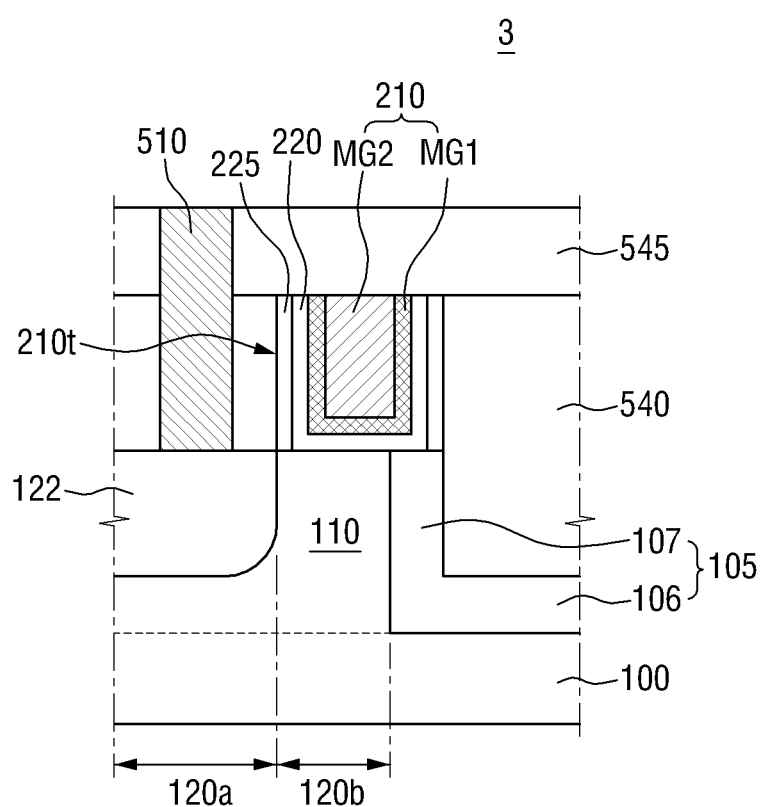
Figure 13:
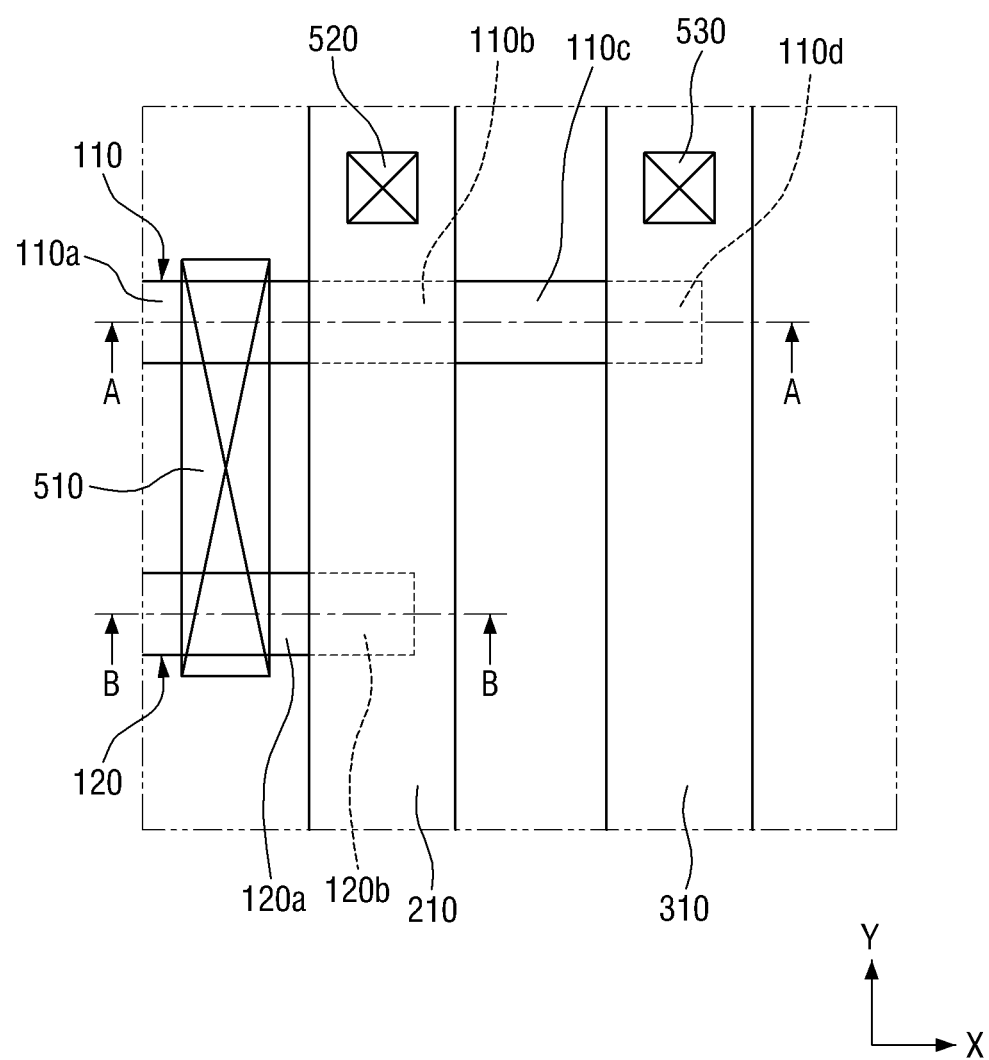
FIG. 13 is a view of a semiconductor device according to a fourth embodiment of the present invention.

FIGS. 9 and 10 are views of a semiconductor device 2 according to a second embodiment of the present invention. FIGS. 11 and 12 are views of a semiconductor device 3 according to a third embodiment of the present invention. FIG. 13 is a view of a semiconductor device 4 according to a fourth embodiment of the present invention. Specifically, FIGS. 9, 11 and 13 are layout views of the semiconductor devices 2 through 4 according to the second through fourth embodiments of the present invention. FIGS. 10 and 12 are cross-sectional views taken along the line A-A of FIG. 9 and the line B-B of FIG. 11, respectively.

Referring to FIGS. 9 and 10, in the semiconductor device 2 according to the second embodiment of the present invention, a field insulating layer 105 includes a first region 106 and a second region 107 higher than the first region 106. Part of a second gate electrode 310 is formed on the second region 107 of the field insulating layer 105.

For example, a height from a top surface of a substrate 100 to a top surface of the second region 107 of the field insulating layer 105 is greater than a height from the top surface of the substrate 100 to a top surface of the first region 106 of the field insulating layer 105.

Specifically, a first fin-type active pattern 110 includes first through fourth lengthwise regions 110a through 110d arranged sequentially along a first direction X. In addition, the first fin-type active pattern 110 does not include an additional region which extends in the first direction X from the fourth region 110d of the first fin-type active pattern 110.

In the semiconductor device 2 according to the second embodiment of the present invention, one end portion of the first fin-type active pattern 110 is located in the fourth region 110d of the first fin-type active pattern 110. For example, the fourth region 110d of the first fin-type active pattern 110 may include one of the short (e.g., end) sides of the first fin-type active pattern 110. This is because the end portions of the first fin-type active pattern 110 include the short sides of the first fin-type active pattern 110.

The second region 107 of the field insulating layer 105 may contact one of the end portions of the first fin-type active patterns 110. Therefore, the second region 107 of the field insulating layer 105 may contact one of the short (e.g., end) sides of the first fin-type active patterns 110.

As such, one of the end portions of the first fin-type active pattern 110 is located in the fourth region 110d of the first fin-type active pattern 110. Therefore, the second region 107 of the field insulating layer 105 may contact the short side of the first fin-type active pattern 110 included in the fourth region 110d of the first fin-type active pattern 110.

A cross-sectional view of the semiconductor device 2 taken along the line B-B of FIG. 9 may be substantially identical to FIG. 6. Here, the first region 106 of the field insulating layer 105 illustrated in FIG. 10 may correspond to the field insulating layer 105 of FIG. 6.

Referring to the cross-sectional view taken along the line B-B of FIG. 9 (as shown, for example, in FIG. 6), one of end portions of the second fin-type active pattern 120 may contact the first region 106 of the field insulating layer 105 but does not contact the second region 107 of the field insulating layer 105. Thus, a short side of the second fin-type active pattern 120 included in a third region 120c of the second fin-type active pattern 120 may contact the first region 106 of the field insulating layer 105.

The second gate electrode 310 is formed not only on the first region 106 of the field insulating layer 105 but also on the second region 107 of the field insulating layer 105.

Part of the second gate electrode 310 may be formed on the second region 107 of the field insulating layer 105 which contacts the fourth region 110d of the first fin-type active pattern 110. For example, as illustrated in FIG. 10, a width of the second gate electrode 310 in the first direction X may be greater than a width of an overlap area between the first fin-type active pattern 110 and the second gate electrode 310.

In the semiconductor device 2 according to the second embodiment, since an end portion of the first fin-type active pattern 110 is located in the fourth region 110d of the first fin-type active pattern 110, the third gate electrode 410 provided in the first embodiment of the present invention may not be used.

Further, referring to FIG. 9, one of the end portions of the first fin-type active pattern 110 is located under the second gate electrode 310 and overlapped by the second gate electrode 310. Therefore, the first fin-type active pattern 110 includes the third region 110c protruding in the first direction X from a side surface of the second gate electrode 310 but does not include a region protruding in the first direction X from the other side surface of the second gate electrode 310.

In FIG. 10, the top surface of the second region 107 of the field insulating layer 105 lies in the same plane with a top surface of the first fin-type active pattern 110. However, the present invention is not limited thereto. That is, the top surface of the second region 107 of the field insulating layer 105 may also be higher or lower than the top surface of the first fin-type active pattern 110.

As shown in FIGS. 9 and 10, the semiconductor device 2 according to the second embodiment of the present invention does not include the source terminal of the rupture transistor illustrated in FIG. 2.

Referring to FIGS. 11 and 12, in the semiconductor device 3 according to the third embodiment of the present invention, a field insulating layer 105 includes a first region 106 and a second region 107 higher than the first region 106. Part of a first gate electrode 210 is formed on the second region 107 of the field insulating layer 105.

Specifically, a second fin-type active pattern 120 includes a first region 120a and a second region 120b. The second fin-type active pattern 120 does not include an additional region extending in a first direction X from the second region 120b of the second fin-type active pattern 120. Therefore, the second fin-type active pattern 120 does not include a part that can correspond to a third region 110c of a first fin-type active pattern 110.

In the semiconductor device 3 according to the third embodiment of the present invention, one of the end portions of the second fin-type active pattern 120 may be located in the second region 120b of the second fin-type active pattern 120. Thus, the second region 120b of the second fin-type active pattern 120 may include one of the short (e.g., end) sides of the second fin-type active pattern 120.

The second region 107 of the field insulating layer 105 may contact one of the end portions of the second fin-type active pattern 120. Therefore, the second region 107 of the field insulating layer 105 may contact one of the short sides of the second fin-type active pattern 120.

As shown, one of the end portions of the second fin-type active pattern 120 is located in the second region 120b of the second fin-type active pattern 120. Therefore, the second region 107 of the field insulating layer 105 may contact the short side of the second fin-type active pattern 120 included in the second region 120b of the second fin-type active pattern 120.

A cross-sectional view of the semiconductor device 3 taken along the line A-A of FIG. 11 may be substantially identical to FIG. 5. Here, the first region 106 of the field insulating layer 105 illustrated in FIG. 12 may correspond to the field insulating layer 105 of FIG. 5.

Referring to the cross-sectional view taken along the line A-A of FIG. 11, part of a fifth region 110e of the first fin-type active pattern 110 in which one of the end portions of the first fin-type active pattern 110 is located is covered by a third gate electrode 410. Therefore, the end portion of the first fin-type active pattern 110 located in the fifth region 110e of the first fin-type active pattern 110 does not contact the second region 107 of the field insulating layer 105. However, a lower part of the fifth region 110e of the first fin-type active pattern 110 contacts the first region 106 of the field insulating layer 105.

The first gate electrode 210 may be formed not only on the first region 106 of the field insulating layer 105 but also on the second region 107 of the field insulating layer 105.

Part of the first gate electrode 210 may be formed on the second region 107 of the field insulating layer 105 which contacts the second region 120b of the second fin-type active pattern 120. For example, as illustrated in FIG. 12, a width of the first gate electrode 210 in the first direction X may be greater than a width of an overlap area between the second fin-type active pattern 120 and the first gate electrode 210.

Further, referring to FIG. 11, one of the end portions of the second fin-type active pattern 120 may be located under the first gate electrode 210 and overlapped by the first gate electrode 210. Therefore, the second fin-type active pattern 120 includes the first region 120a protruding in the first direction X from a side surface of the first gate electrode 210 but does not include a region protruding in the first direction X from the other side surface of the first gate electrode 210.

In FIG. 12, a top surface of the second region 107 of the field insulating layer 105 lies in the same plane with a top surface of the second fin-type active pattern 120. However, the present invention is not limited thereto. The top surface of the second region 107 of the field insulating layer 105 may also be higher or lower than the top surface of the second fin-type active pattern 120.

A cross-sectional view taken along the line A-A of FIG. 13 may be substantially identical to FIG. 10, and a cross-sectional view taken along the line B-B of FIG. 13 is identical to FIG. 12.

Referring to FIG. 13, in the semiconductor device 4 according to the fourth embodiment of the present invention, a field insulating layer 105 includes a first region 106 and a second region 107 higher than the first region 106. Part of a first gate electrode 210 and part of a second gate electrode 310 are formed on the second region 107 of the field insulating layer 105.

Specifically, a first fin-type active pattern 110 includes first through fourth regions 110a through 110d arranged sequentially along a first direction X. The first fin-type active pattern 110 does not include an additional region extending in the first direction X from the fourth region 110d of the first fin-type active pattern 110.

A second fin-type active pattern 120 includes a first region 120a and a second region 120b. The second fin-type active pattern 120 does not include an additional region extending in the first direction X from the second region 120b of the second fin-type active pattern 120. Therefore, the second fin-type active pattern 120 does not include a part that can correspond to the third region 110c of the first fin-type active pattern 110.

In the semiconductor device 4 according to the fourth embodiment of the present invention, one of the end portions of the first fin-type active pattern 110 is located in the fourth region 110d of the first fin-type active pattern 110. In addition, one of the end portions of the second fin-type active pattern 120 is located in the second region 120b of the second fin-type active pattern 120.

Therefore, the fourth region 110d of the first fin-type active pattern 110 may include one of short sides of the first fin-type active pattern 110. The second region 120b of the second fin-type active pattern 120 may include one of short sides of the second fin-type active pattern 120.

The second region 107 of the field insulating layer 105 may contact the short side of the first fin-type active pattern 110 included in the fourth region 110d of the first fin-type active pattern 110 and contact the short side of the second fin-type active pattern 120 included in the second region 120b of the second fin-type active pattern 120.

Therefore, the second region 107 of the field insulating layer 105 contacts the fourth region 110d of the first fin-type active pattern 110 and the second region 120b of the second fin-type active pattern 120.

A width of the second gate electrode 310 in the first direction X may be greater than a width of an overlap area between the first fin-type active pattern 110 and the second gate electrode 310. A width of the first gate electrode 210 in the first direction X may be greater than a width of an overlap area between the second fin-type active pattern 120 and the first gate electrode 210.

Further, referring to FIG. 13, one of the end portions of the first fin-type active pattern 110 may be located under the second gate electrode 310 and overlapped by the second gate electrode 310. In addition, one of the end portions of the second fin-type active pattern 120 may be located under the first gate electrode 210 and overlapped by the first gate electrode 210.

Therefore, the first fin-type active pattern 110 includes the third region 110c protruding in the first direction X from a side surface of the second gate electrode 310 but does not include a region protruding in the first direction X from the other side surface of the second gate electrode 310. Further, the second fin-type active pattern 120 includes the first region 120a protruding in the first direction X from a side surface of the first gate electrode 210 but does not include a region protruding in the first direction X from the other side surface of the first gate electrode 210.

A semiconductor device according to a fifth embodiment of the present invention will now be described with reference to FIG. 14. For simplicity, the fifth embodiment will hereinafter be described, focusing mainly on differences with the embodiment of FIGS. 3 through 8.

Figure 14:
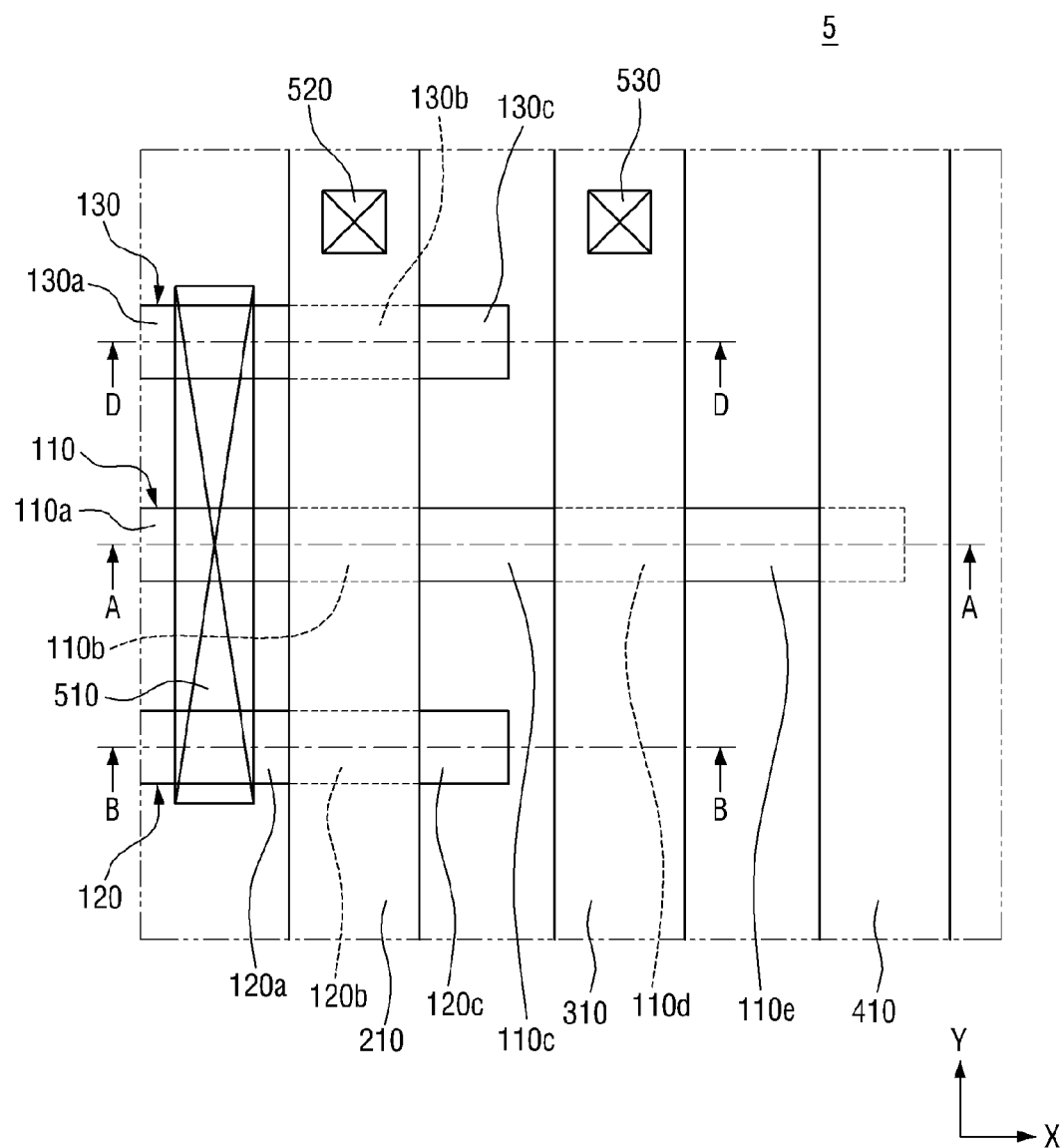
FIG. 14 is a layout view of a semiconductor device according to a fifth embodiment of the present invention.

FIG. 14 is a layout view of a semiconductor device 5 according to a fifth embodiment of the present invention.

Specifically, a cross-sectional view taken along the line A-A of FIG. 14 is identical to FIG. 5, and a cross-sectional view taken along the line B-B of FIG. 14 is identical to FIG. 6. In addition, a cross-sectional view taken along the line D-D of FIG. 14 is substantially identical to FIG. 6 if reference numerals of FIG. 14 are made to correspond to reference numerals of FIG. 6.

Referring to FIG. 14, the semiconductor device 5 according to the fifth embodiment of the present invention further includes a third fin-type active pattern 130 which includes a first region 130a and a second region 130b.

The third fin-type active pattern 130 may protrude from a substrate 100. The third fin-type active pattern 130 is defined by a field insulating layer 105, and a top surface of the third fin-type active pattern 130 protrudes further than a top surface of the field insulating layer 105.

The third fin-type active pattern 130 may extend along a first direction X. First through third fin-type active patterns 110 through 130 may be arranged along a second direction Y.

The third fin-type active pattern 130 may include long sides extending along the first direction X and short sides extending along the second direction Y. In the first through third fin-type active patterns 110 through 130 arranged along the second direction Y, the long sides of the first fin-type active pattern 110, the long sides of the second fin-type active pattern 120, and the long sides of the third fin-type active pattern 130 may face each other.

The third fin-type active pattern 130 may include the first region 130a and the second region 130b. The first region 130a of the third fin-type active pattern 130 and the second region 130b of the third fin-type active pattern 130 may be directly connected to each other. These two regions may together form a drain for an access transistor of an anti-fuse device, such as depicted in FIG. 2.

The third fin-type active pattern 130 may further include a third region 130c on a side of the second region 130b of the third fin-type active pattern 130. Therefore, the second region 130b of the third fin-type active pattern 130 is disposed between the first region 130a of the third fin-type active pattern 130 and the third region 130c of the third fin-type active pattern 130.

The first through third regions 130a through 130c of the third fin-type active pattern 130 may be arranged sequentially in the first direction X.

In the semiconductor device 5 according to the fifth embodiment of the present invention, one of end portions of the third fin-type active pattern 130 may be located in the third region 130c of the third fin-type active pattern 130. Therefore, the third region 130c of the third fin-type active pattern 130 may include one of the short sides of the third fin-type active pattern 130.

The first through third regions 130a through 130c of the third fin-type active pattern 130 may correspond to first through third regions 110a through 110c of the first fin-type active pattern 110 and first through third regions 120a through 120c of the second fin-type active pattern 120, respectively. Thus, the first region 130a of the third fin-type active pattern 130 may form part of the drain of the access transistor depicted, for example, in FIG. 2.

A first gate electrode 210 extends along the second direction Y and intersects the first through third fin-type active patterns 110 through 130.

The first gate electrode 210 is formed on the first through third fin-type active patterns 110 through 130. More specifically, the first gate electrode 210 is formed on the second region 110b of the first fin-type active pattern 110, the second region 120b of the second fin-type active pattern 120, and the second region 130b of the third fin-type active pattern 130.

A second gate electrode 310 intersects the first fin-type active pattern 110. However, the second gate electrode 310 does not intersect the second fin-type active pattern 120 and the third fin-type active pattern 130.

The second gate electrode 310 is formed on the first fin-type active pattern 110 but is not formed on the second fin-type active pattern 120 and the third fin-type active pattern 130.

A first contact 510 is formed on the first region 110a of the first fin-type active pattern 110, the first region 120a of the second fin-type active pattern 120, and the first region 130a of the third fin-type active pattern 130.

The first contact 510 is electrically connected to the first region 110a of the first fin-type active pattern 110, the first region 120a of the second fin-type active pattern 120, and the first region 130a of the third fin-type active pattern 130.

Though not shown in FIG. 14 or other figures, the third region 110c of the first fin-type active pattern 110, the third region 120c of the second fin-type active pattern 120, and the third region 130c of the third fin-type active pattern 130 may be electrically connected to each other by a conductive line.

The first contact 510 may electrically connect the first region 110a of the first fin-type active pattern 110, the first region 120a of the second fin-type active pattern 120, and the first region 130a of the third fin-type active pattern 130.

In FIG. 14, the third fin-type active pattern 130 includes the first region 130a and the third region 130c which protrude in the first direction X from side surfaces of the first gate electrode 210. However, since the second gate electrode 310 is not formed on the third fin-type active pattern 130, the third fin-type active pattern 130 does not include parts which protrude in the first direction X from side surfaces of the second gate electrode 310. A conceptual circuit diagram of an antifuse memory cell such as depicted in FIG. 14 can be seen, for example, in FIG. 46(b), described further below.

In FIG. 14, the first fin-type active pattern 110 is located between the second fin-type active pattern 120 and the third fin-type active pattern 130. However, this is merely intended for ease of description, and the present invention is not limited thereto.

A semiconductor device according to a sixth embodiment of the present invention will now be described with reference to FIG. 15. For simplicity, the sixth embodiment will hereinafter be described, focusing mainly on differences with the embodiments of FIGS. 9, 10 and 14. In addition, cross-sections of the semiconductor device according to the sixth embodiment will be described using FIGS. 6 and 10.

Figure 15:
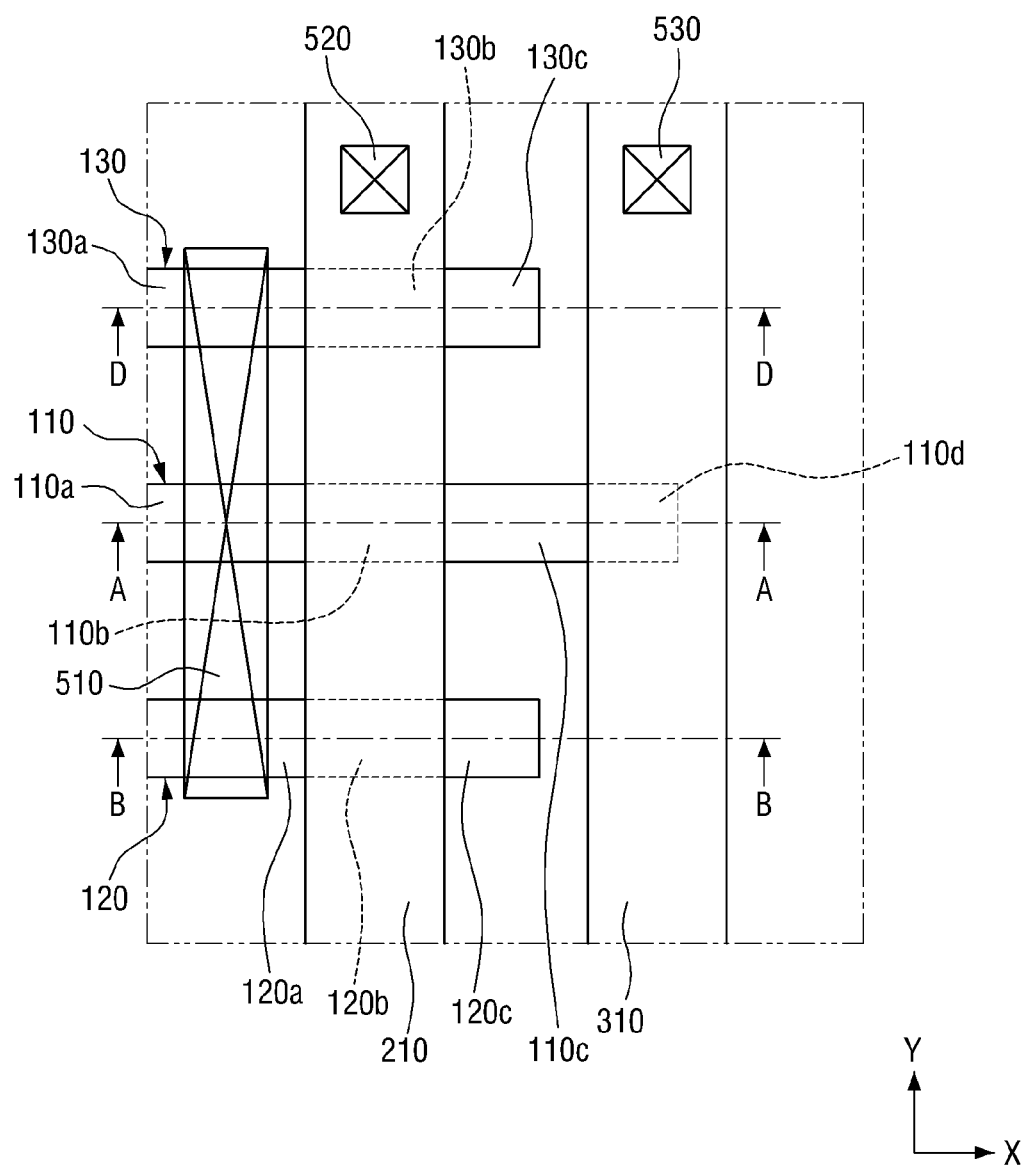
FIG. 15 is a layout view of a semiconductor device according to a sixth embodiment of the present invention.

FIG. 15 is a layout view of a semiconductor device 6 according to a sixth embodiment of the present invention. A cross-sectional view taken along the line A-A of FIG. 15 is similar to FIG. 10, and each of cross-sectional views taken along the lines B-B and D-D of FIG. 15 is similar to FIG. 6.

Referring to FIG. 15, in the semiconductor device 6 according to the sixth embodiment of the present invention, a field insulating layer 105 includes a first region 106 and a second region 107 higher than the first region 106. Part of a second gate electrode 310 is formed on the second region 107 of the field insulating layer 105.

A first fin-type active pattern 110 includes first through fourth regions 110a through 110d arranged sequentially along a first direction X. The first fin-type active pattern 110 does not include an additional region extending in the first direction X from the fourth region 110d of the first fin-type active pattern 110.

In the semiconductor device 6 according to the sixth embodiment of the present invention, one of end portions of the first fin-type active pattern 110 may be located in the fourth region 110d of the first fin-type active pattern 110. Therefore, the fourth region 110d of the first fin-type active pattern 110 may include one of short sides of the first fin-type active pattern 110. This is because the end portions of the first fin-type active pattern 110 include the short sides of the first fin-type active pattern 110.

The second region 107 of the field insulating layer 105 may contact one of the end portions of the first fin-type active pattern 110. Therefore, the second region 107 of the field insulating layer 105 may contact one of the short sides of the first fin-type active pattern 110.

As shown, one of the end portions of the first fin-type active pattern 110 is located in the fourth region 110d of the first fin-type active pattern 110. Therefore, the second region 107 of the field insulating layer 105 may contact the short side of the first fin-type active pattern 110 included in the fourth region 110d of the first fin-type active pattern 110.

Referring to the cross-sectional views taken along the lines B-B and D-D of FIG. 15, one of end portions of the second fin-type active pattern 120 and one of end portions of the third fin-type active pattern 130 contact the first region 106 of the field insulating layer 105 but do not contact the second region 107 of the field insulating layer 105.

Part of the second gate electrode 310 may be formed on the second region 107 of the field insulating layer 105 which contacts the fourth region 110d of the first fin-type active pattern 110. That is, a width of the second gate electrode 310 in the first direction X may be greater than a width of an overlap area between the first fin-type active pattern 110 and the second gate electrode 310.

A semiconductor device according to a seventh embodiment of the present invention will now be described with reference to FIG. 16. For simplicity, the seventh embodiment will hereinafter be described, focusing mainly on differences with the embodiments of FIGS. 11, 12 and 14. In addition, cross-sections of the semiconductor device according to the seventh embodiment will be described using FIGS. 5 and 12.

Figure 16:
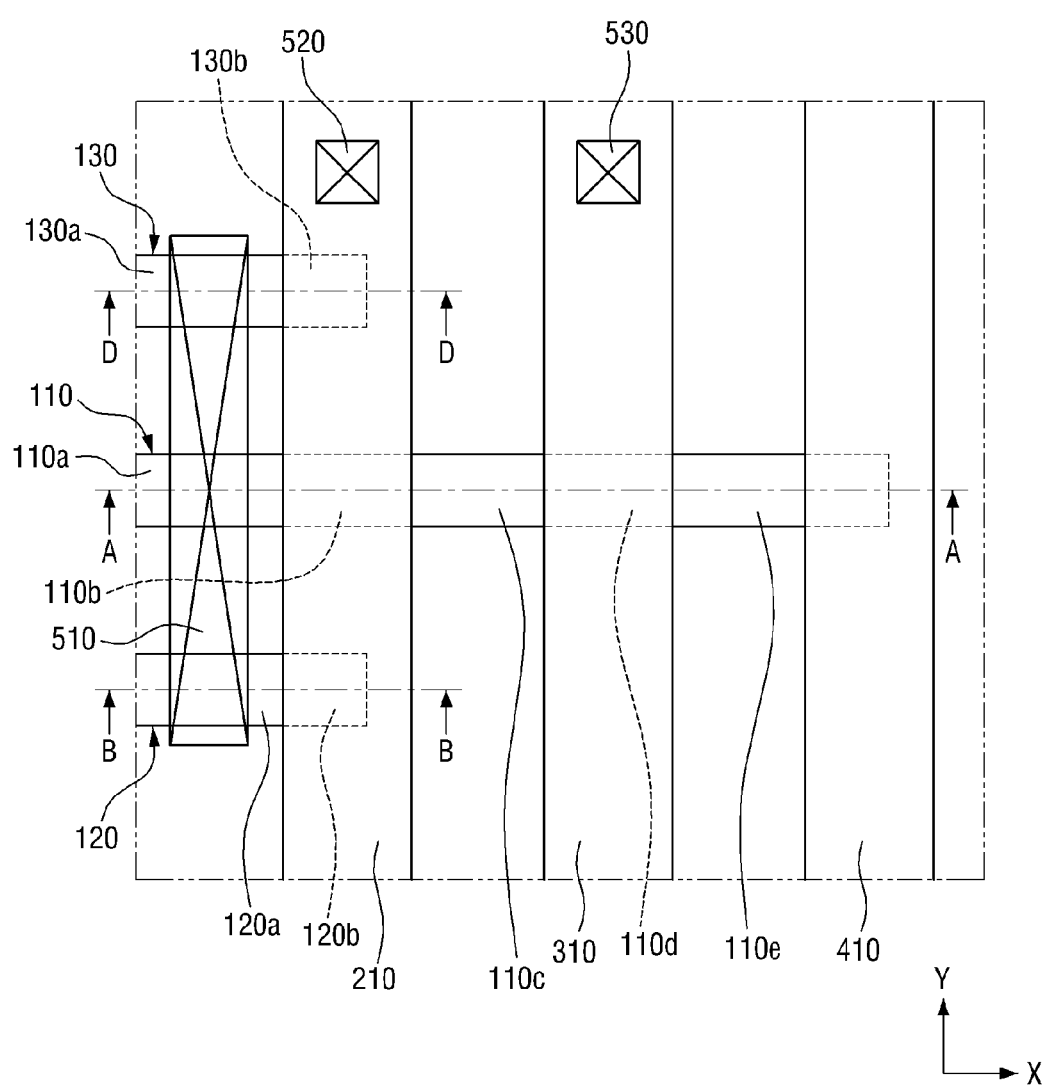
FIG. 16 is a layout view of a semiconductor device according to a seventh embodiment of the present invention.

FIG. 16 is a layout view of a semiconductor device 7 according to a seventh embodiment of the present invention. A cross-sectional view taken along the line A-A of FIG. 16 is similar to FIG. 5, and each of cross-sectional views taken along the lines B-B and D-D of FIG. 16 is similar to FIG. 12.

Referring to FIGS. 12 and 16, a third fin-type active pattern 130 includes a first region 130a and a second region 130b. The third fin-type active pattern 130 does not include an additional region extending in a first direction X from the second region 130b of the third fin-type active pattern 130.

Thus, the third fin-type active pattern 130 does not include a part that can correspond to a third region 110c of a first fin-type active pattern 110.

In the semiconductor device 7 according to the seventh embodiment of the present invention, one end portion of the third fin-type active pattern 130 may be located in the second region 130b of the third fin-type active pattern 130. Therefore, the second region 130b of the third fin-type active pattern 130 may include one of short sides of the third fin-type active pattern 130.

A second region 107 of a field insulating layer 105 may contact one of the end portions of the third fin-type active pattern 130. Therefore, the second region 107 of the field insulating layer 105 may contact one of the short sides of the third fin-type active pattern 130.

As such, one of the end portions of the third fin-type active pattern 130 is located in the second region 130b of the third fin-type active pattern 130. Therefore, the second region 107 of the field insulating layer 105 may contact the short side of the third fin-type active pattern 130 included in the second region 130b of the third fin-type active pattern 130.

Referring to the cross-sectional view taken along the line A-A of FIG. 16, part of a fifth region 110e of the first fin-type active pattern 110 in which one of the end portions of the first fin-type active pattern 110 is located is covered by a third gate electrode 410. For example, the end portion of the first fin-type active pattern 110 located in the fifth region 110e of the first fin-type active pattern 110 does not contact the second region 107 of the field insulating layer 105. However, a lower part of the fifth region 110e of the first fin-type active pattern 110 contacts a first region 106 of the field insulating layer 105.

Part of a first gate electrode 210 may be formed on the second region 107 of the field insulating layer 105 which contacts the second region 130b of the third fin-type active pattern 130. Thus, a width of the first gate electrode 210 in the first direction X may be greater than a width of an overlap area between the third fin-type active pattern 130 and the first gate electrode 210.

Further, referring to FIG. 16, one of the end portions of the third fin-type active pattern 130 may be located under the first gate electrode 210 and overlapped by the first gate electrode 210. Therefore, the third fin-type active pattern 130 includes the first region 130a protruding in the first direction X from a side surface of the first gate electrode 210 but does not include a region protruding in the first direction X from the other side surface of the first gate electrode 210.

A semiconductor device according to an eighth embodiment of the present invention will now be described with reference to FIG. 17. For simplicity, the eighth embodiment will hereinafter be described, focusing mainly on differences with the embodiments of FIGS. 13 and 14. In addition, cross-sections of the semiconductor device according to the eighth embodiment will be described using FIGS. 10 and 12.

Figure 17:
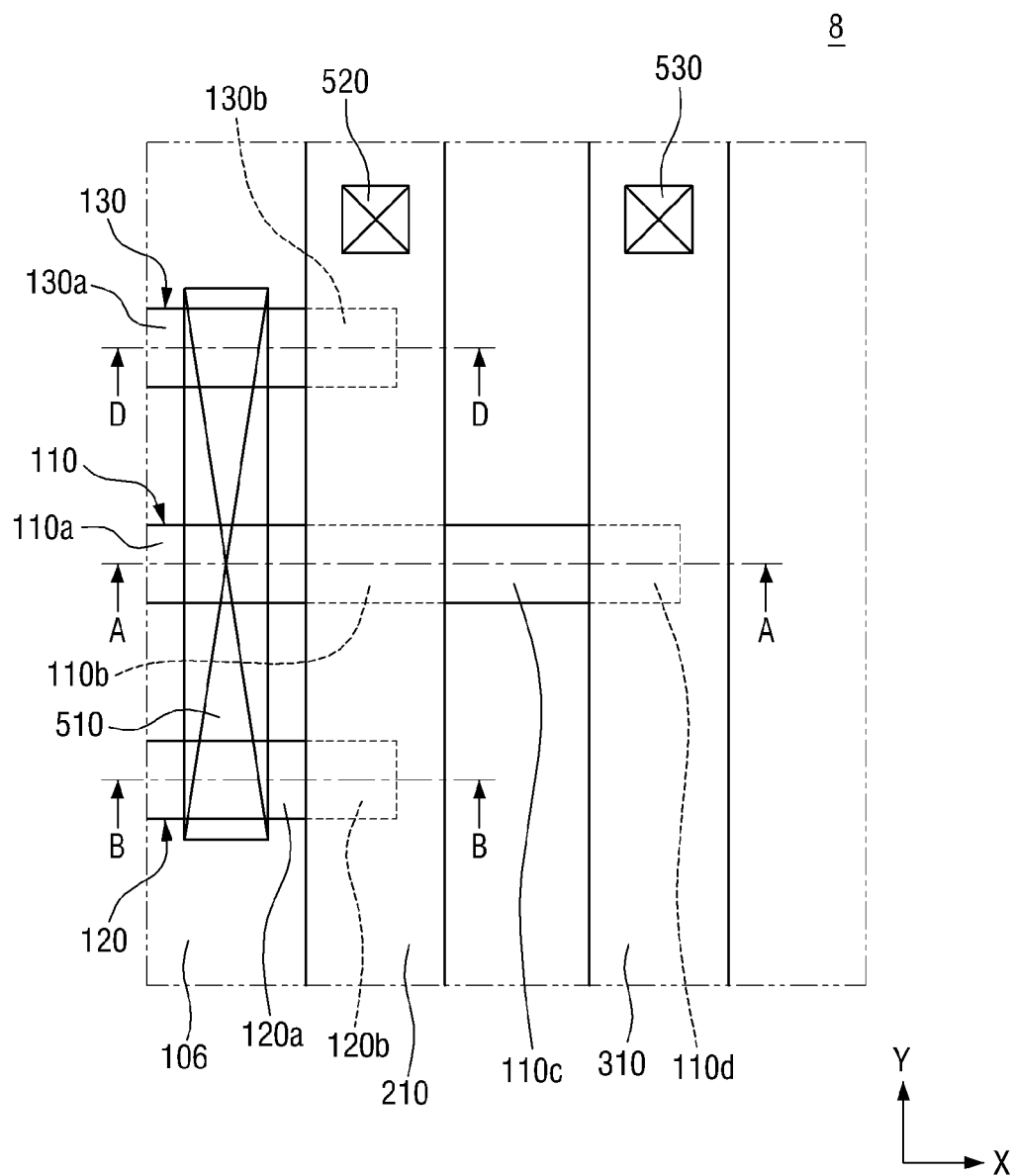
FIG. 17 is a layout view of a semiconductor device according to an eighth embodiment of the present invention.

FIG. 17 is a layout view of a semiconductor device 8 according to an eighth embodiment of the present invention. For example, in one embodiment, a cross-sectional view taken along the line A-A of FIG. 17 is similar to FIG. 10, and each of cross-sectional views taken along the lines B-B and D-D of FIG. 17 is similar to FIG. 12.

Referring to FIGS. 10, 12 and 17, in the semiconductor device 8 according to the eighth embodiment of the present invention, a field insulating layer 105 includes a first region 106 and a second region 107 higher than the first region 106. Part of a first gate electrode 210 and part of a second gate electrode 310 are formed on the second region 107 of the field insulating layer 105.

One of end portions of a first fin-type active pattern 110 may be located in a fourth region 110d of the first fin-type active pattern 110, one of end portions of a second fin-type active pattern 120 may be located in a second region 120b of the second fin-type active pattern 120, and one of end portions of a third fin-type active pattern 130 may be located in a second region 130b of the third fin-type active pattern 130.

The fourth region 110d of the first fin-type active pattern 110 may include one of short sides of the first fin-type active pattern 110, the second region 120b of the second fin-type active pattern 120 may include one of short sides of the second fin-type active pattern 120, and the second region 130b of the third fin-type active pattern 130 may include one of short sides of the third fin-type active pattern 130.

The second region 107 of the field insulating layer 105 may contact the short side of the first fin-type active pattern 110 included in the fourth region 110d of the first fin-type active pattern 110, contact the short side of the second fin-type active pattern 120 included in the second region 120b of the second fin-type active pattern 120, and contact the short side of the third fin-type active pattern 130 included in the second region 130b of the third fin-type active pattern 130.

Therefore, the second region 107 of the field insulating layer 105 contacts the fourth region 110d of the first fin-type active pattern 110, the second region 120b of the second fin-type active pattern 120, and the second region 130b of the third fin-type active pattern 130.

A width of the second gate electrode 310 in a first direction X may be greater than a width of an overlap area between the first fin-type active pattern 110 and the second gate electrode 310, and a width of the first gate electrode 210 in the first direction X may be greater than a width of an overlap area between the second fin-type active pattern 120 and the first gate electrode 210 and greater than a width of an overlap area between the third fin-type active pattern 130 and the first gate electrode 210.

In the semiconductor device 8 according to the eighth embodiment of the present invention, the first fin-type active pattern 110 includes a third region 110c protruding in the first direction X from a side surface of the second gate electrode 310 but does not include a region protruding in the first direction X from the other side surface of the second gate electrode 310. Further, the second fin-type active pattern 120 and the third fin-type active pattern 130 respectively include a first region 120a and a first region 130a protruding in the first direction X from a side surface of the first gate electrode 210 but do not include regions protruding in the first direction X from the other side surface of the first gate electrode 210.

A semiconductor device according to a ninth embodiment of the present invention will now be described with reference to FIG. 18. For simplicity, the ninth embodiment will hereinafter be described, focusing mainly on differences with the embodiment of FIG. 14.

Figure 18:
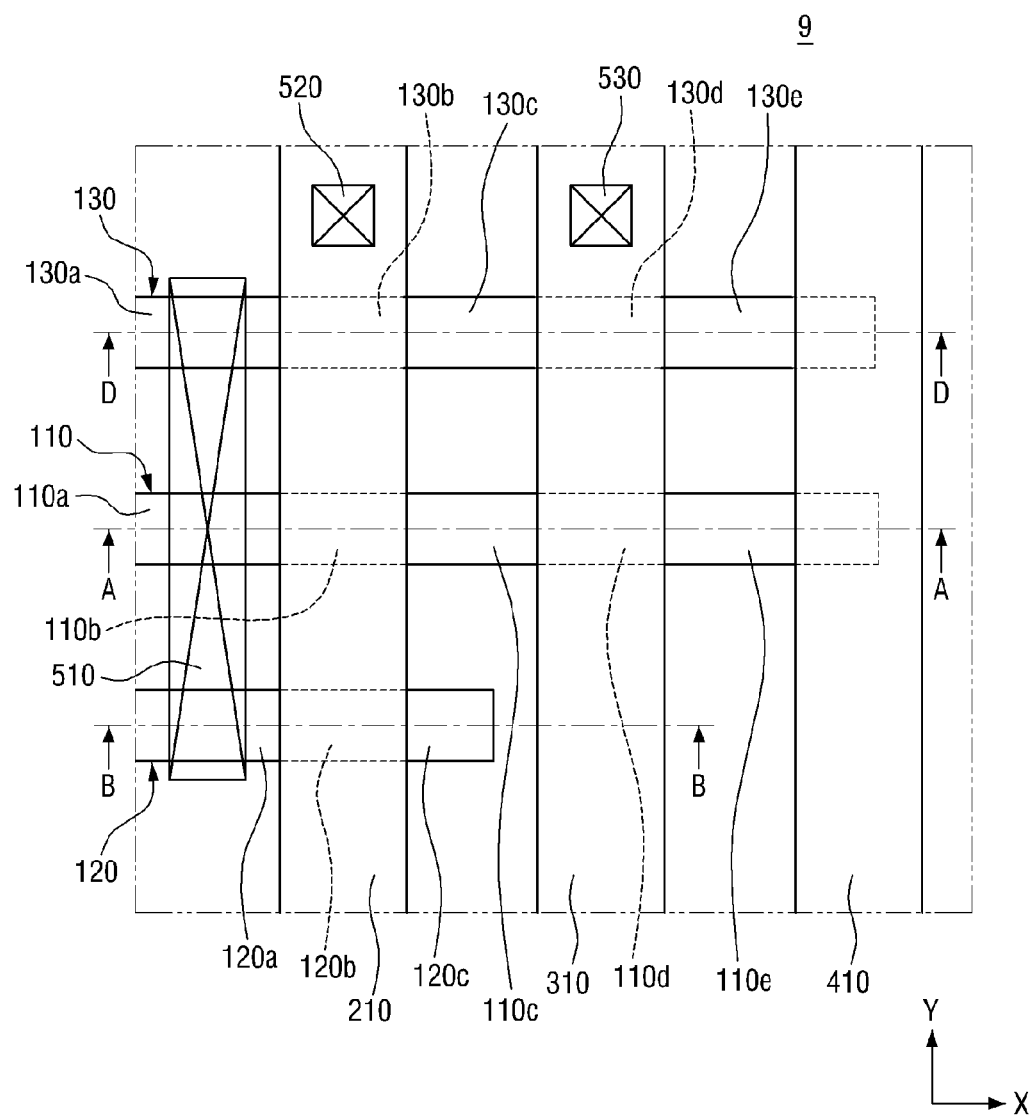
FIG. 18 is a layout view of a semiconductor device according to a ninth embodiment of the present invention.

FIG. 18 is a layout view of a semiconductor device 9 according to a ninth embodiment of the present invention.

Specifically, a cross-sectional view taken along the line A-A of FIG. 18 is identical to FIG. 5, and a cross-sectional view taken along the line B-B of FIG. 18 is identical to FIG. 6. In addition, a cross-sectional view taken along the line D-D of FIG. 18 is substantially identical to FIG. 5 if reference numerals of FIG. 18 are made to correspond to reference numerals of FIG. 5.

Referring to FIG. 18, in the semiconductor device 9 according to the ninth embodiment of the present invention, a third fin-type active pattern 130 further includes a fourth region 130d.

The fourth region 130d of the third fin-type active pattern 130 extends in a first direction X from a third region 130c of the third fin-type active pattern 130. First through fourth regions 130a through 130d of the third fin-type active pattern 130 may be arranged sequentially along the first direction X and directly connected to each other.

The third fin-type active pattern 130 may further include a fifth region 130e on a side of the fourth region 130d of the third fin-type active pattern 130. The fourth region 130d of the third fin-type active pattern 130 is disposed between the third region 130c of the third fin-type active pattern 130 and the fifth region 130e of the third fin-type active pattern 130.

The first through fifth regions 130a through 130e of the third fin-type active pattern 130 may be arranged sequentially along the first direction X.

In the semiconductor device 9 according to the ninth embodiment of the present invention, one of the end portions of the third fin-type active pattern 130 may be located in the fifth region 130e of the third fin-type active pattern 130. Therefore, the fifth region 130e of the third fin-type active pattern 130 may include one of short sides of the third fin-type active pattern 130.

A second gate electrode 310 intersects a first fin-type active pattern 110 and the third fin-type active pattern 130. However, the second gate electrode 310 does not intersect a second fin-type active pattern 120.

The second gate electrode 310 is formed on the first fin-type active pattern 110 and the third fin-type active pattern 130 but is not formed on the second fin-type active pattern 120. More specifically, the second gate electrode 310 is formed on a fourth region 110d of the first fin-type active pattern 110 and the fourth region 130d of the third fin-type active pattern 130.

A third gate electrode 410 extending along a second direction Y may intersect at least part of the third fin-type active pattern 130. For example, the third gate electrode 410 may intersect at least part of the fifth region 130e of the third fin-type active pattern 130.

In the semiconductor device 9 according to the ninth embodiment of the present invention, the third gate electrode 410 covers one of the end portions of the third fin-type active pattern 130. The third gate electrode 410 may cover one of the short sides of the third fin-type active pattern 130.

Since one of the end portions of the third fin-type active pattern 130 is located in the fifth region 130e of the third fin-type active pattern 130, the third gate electrode 410 may partially cover the fifth region 130e of the third fin-type active pattern 130.

In FIG. 18, the third fin-type active pattern 130 includes the first region 130a and the third region 130c protruding in the first direction X from side surfaces of the first gate electrode 210. In addition, the third fin-type active pattern 130 includes the third region 130c and the fifth region 130e protruding in the first direction X from side surfaces of the second gate electrode 210.

In FIG. 18, the first fin-type active pattern 110 is located between the second fin-type active pattern 120 and the third fin-type active pattern 130. However, the present invention is not limited thereto.

A semiconductor device according to a tenth embodiment of the present invention will now be described with reference to FIG. 19. For simplicity, the tenth embodiment will hereinafter be described, focusing mainly on differences with the embodiments of FIGS. 9, 10 and 18. In addition, cross-sections of the semiconductor device according to the tenth embodiment will be described using FIGS. 6 and 10.

Figure 19:
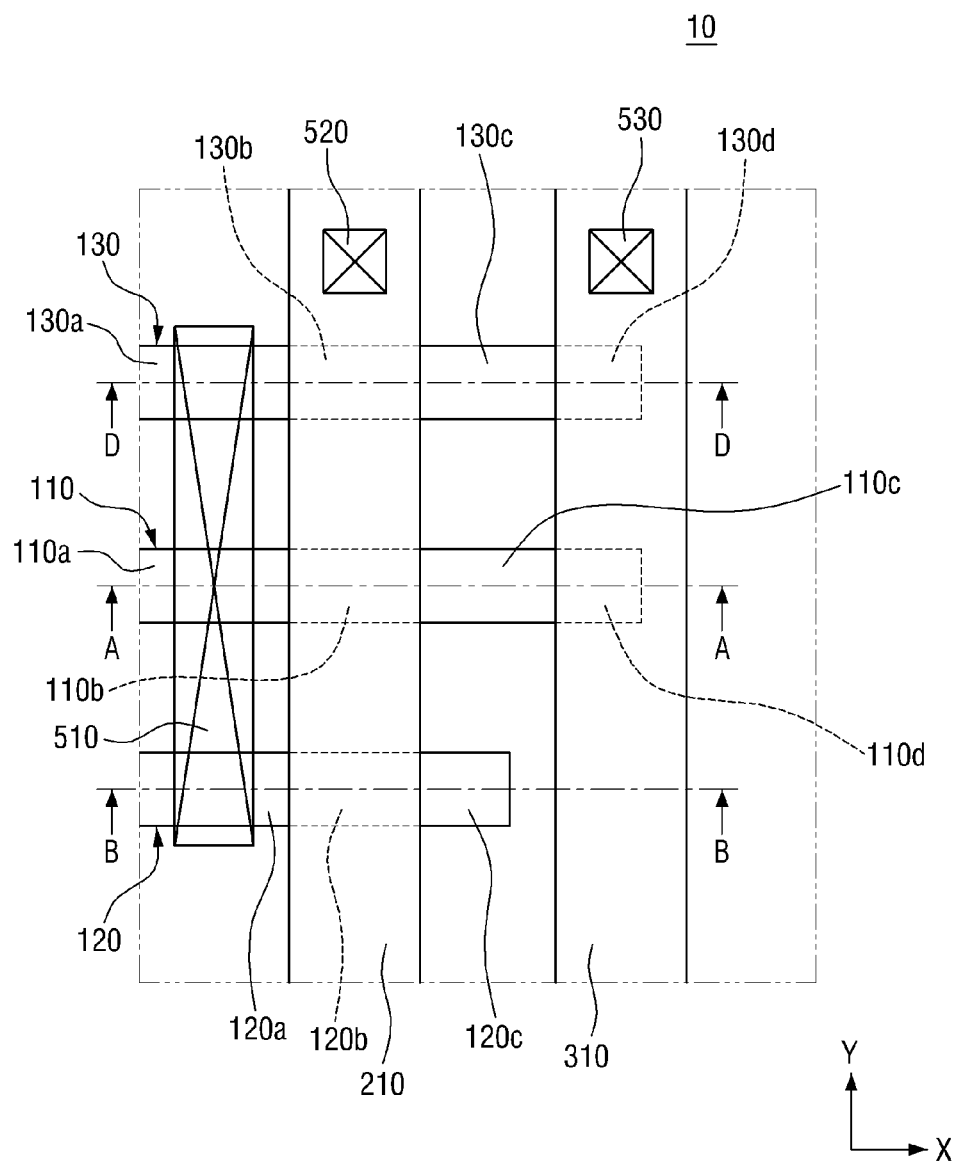
FIG. 19 is a layout view of a semiconductor device according to a tenth embodiment of the present invention.

FIG. 19 is a layout view of a semiconductor device 10 according to a tenth embodiment of the present invention. Each of cross-sectional views taken along the lines A-A and D-D of FIG. 19 is similar to FIG. 10, and a cross-sectional view taken along the line B-B of FIG. 19 is similar to FIG. 6.

Referring to FIGS. 10 and 19, a third fin-type active pattern 130 includes first through fourth regions 130a through 130d arranged sequentially along a first direction X. The third fin-type active pattern 130 does not include an additional region extending in the first direction X from the fourth region 130d of the third fin-type active pattern 130.

In the semiconductor device 10 according to the tenth embodiment of the present invention, one of end portions of the third fin-type active pattern 130 may be located in the fourth region 130d of the third fin-type active pattern 130. Therefore, the fourth region 130d of the third fin-type active pattern 130 may include one of short sides of the third fin-type active pattern 130. This is because the end portions of the third fin-type active pattern 130 include the short sides of the third fin-type active pattern 130.

A field insulating layer 105 includes a first region 106 and a second region 107. The second region 107 of the field insulating layer 105 is higher than the first region 106 of the field insulating layer 105.

The second region 107 of the field insulating layer 105 may contact one of the end portions of the third fin-type active pattern 130. Therefore, the second region 107 of the field insulating layer 105 may contact one of the short sides of the third fin-type active pattern 130.

One of the end portions of the third fin-type active pattern 130 is located in the fourth region 130d of the third fin-type active pattern 130. Therefore, the second region 107 of the field insulating layer 105 may contact the short side of the third fin-type active pattern 130 included in the fourth region 130d of the third fin-type active pattern 130.

Part of a second gate electrode 310 may be formed on the second region 107 of the field insulating layer 105 which contacts the fourth region 130d of the third fin-type active pattern 130. Thus, a width of the second gate electrode 310 in the first direction X may be greater than a width of an overlap area between the third fin-type active pattern 130 and the second gate electrode 310.

Further, referring to FIG. 19, one of the end portions of the third fin-type active pattern 130 is located under the second gate electrode 310 and overlapped by the second gate electrode 310. Therefore, the third fin-type active pattern 130 includes the third region 130c protruding in the first direction X from a side surface of the second gate electrode 310 but does not include a region protruding in the first direction X from the other side surface of the second gate electrode 310.

A semiconductor device according to an eleventh embodiment of the present invention will now be described with reference to FIG. 20. For simplicity, the eleventh embodiment will hereinafter be described, focusing mainly on differences with the embodiments of FIGS. 11, 12 and 18. In addition, cross-sections of the semiconductor device according to the eleventh embodiment will be described using FIGS. 5 and 12.

Figure 20:
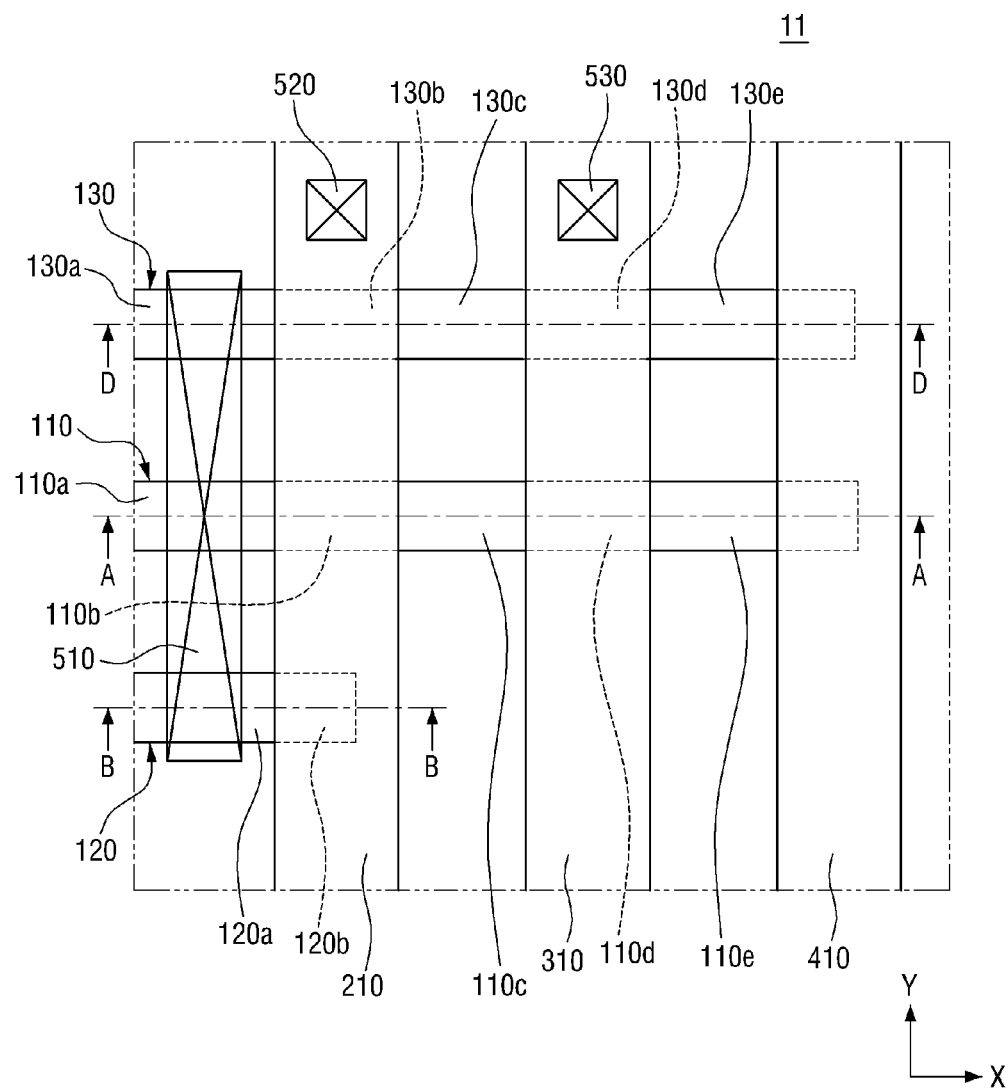
FIG. 20 is a layout view of a semiconductor device according to an eleventh embodiment of the present invention.

FIG. 20 is a layout view of a semiconductor device 11 according to an eleventh embodiment of the present invention. Each of cross-sectional views taken along the lines A-A and D-D of FIG. 20 is similar to FIG. 5, and a cross-sectional view taken along the line B-B of FIG. 20 is similar to FIG. 12.

Referring to FIGS. 12 and 20, a second fin-type active pattern 120 includes a first region 120a and a second region 120b. The second fin-type active pattern 120 does not include an additional region extending in a first direction X from the second region 120b of the second fin-type active pattern 120.

One of end portions of the second fin-type active pattern 120 may be located in the second region 120b of the second fin-type active pattern 120. Therefore, the second region 120b of the second fin-type active pattern 120 may include one of short sides of the second fin-type active pattern 120.

A second region 107 of a field insulating layer 105 may contact one of the end portions of the second fin-type active pattern 120. One of the end portions of the second fin-type active pattern 120 is located in the second region 120b of the second fin-type active pattern 120. Therefore, the second region 107 of the field insulating layer 105 may contact the short side of the second fin-type active pattern 120 included in the second region 120b of the second fin-type active pattern 120.

A semiconductor device according to a twelfth embodiment of the present invention will now be described with reference to FIG. 21. For simplicity, the twelfth embodiment will hereinafter be described, focusing mainly on differences with the embodiments of FIGS. 13 and 18. In addition, cross-sections of the semiconductor device according to the twelfth embodiment will be described using FIGS. 10 and 12.

Figure 21:
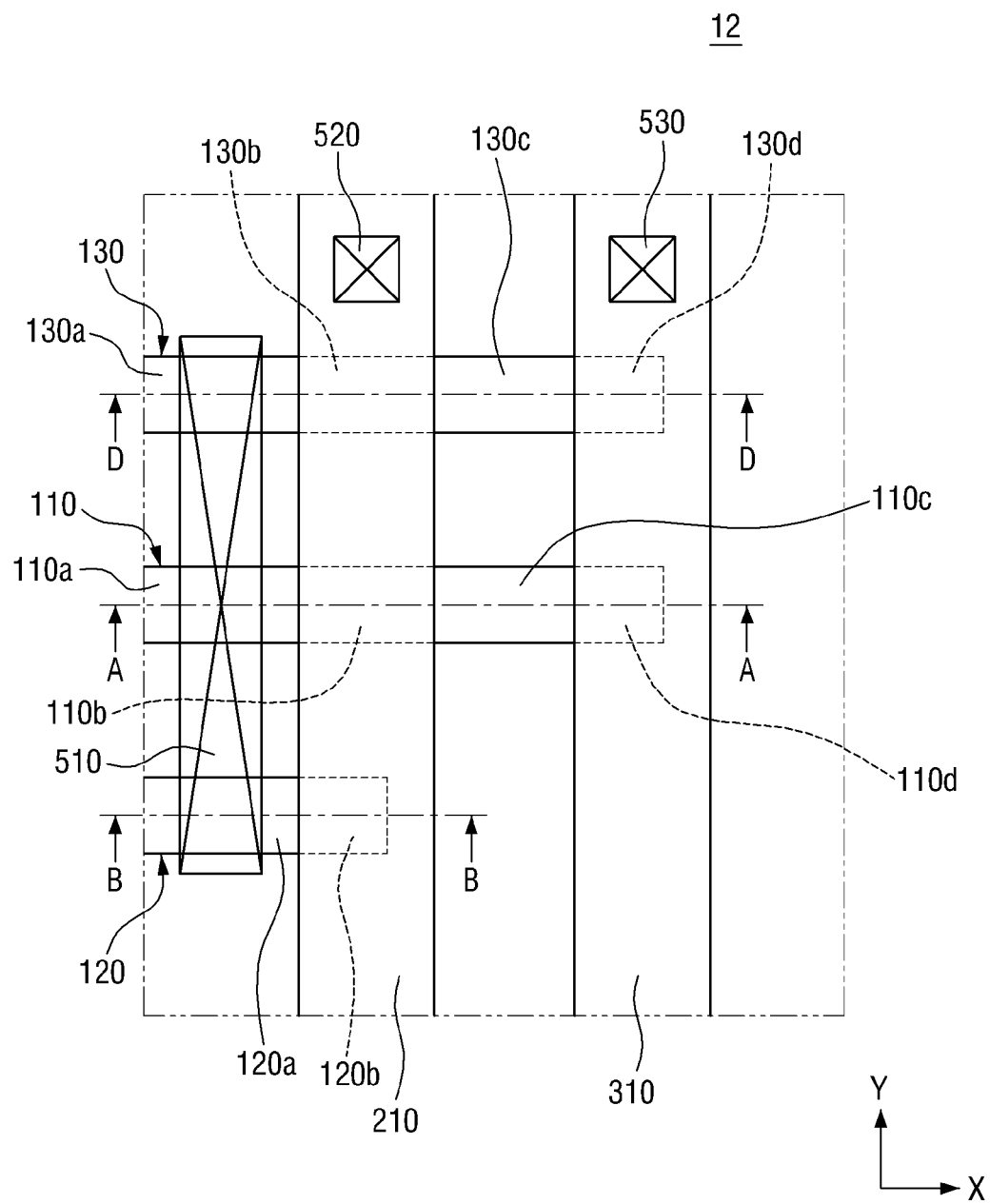
FIG. 21 is a layout view of a semiconductor device according to a twelfth embodiment of the present invention.

FIG. 21 is a layout view of a semiconductor device 12 according to a twelfth embodiment of the present invention. Each of cross-sectional views taken along the lines A-A and D-D of FIG. 21 is similar to FIG. 10, and a cross-sectional view taken along the line B-B of FIG. 21 is similar to FIG. 12.

Referring to FIGS. 10, 12 and 21, a second region 107 of a field insulating layer 105 contacts one of the end portions of a third fin-type active pattern 130.

One of the end portions of the third fin-type active pattern 130 may be located in a fourth region 130d of the third fin-type active pattern 130. The fourth region 130d of the third fin-type active pattern 130 may include one of short sides of the third fin-type active pattern 130.

Therefore, the second region 107 of the field insulating layer 105 contacts the fourth region 130*d* of the third fin-type active pattern 130.

A width of a second gate electrode 310 in a first direction X is greater than a width of an overlap area between the third fin-type active pattern 130 and the second gate electrode 310.

The third fin-type active pattern 130 includes a third region 130*c* protruding in the first direction X from a side surface of the second gate electrode 310 but does not include a region protruding in the first direction X from the other side surface of the second gate electrode 310.

Referring to FIGS. 3 through 21, in the semiconductor devices 1 through 12 according to the first through twelfth embodiments of the present invention, a plurality of fin-type active patterns (e.g., 110, 120, and optionally 130) extending along the first direction X are arranged in the second direction Y.

The first contact 510 is formed on the fin-type active patterns (110, 120, and optionally 130) and thus electrically connected to the fin-type active patterns (110, 120, and optionally 130).

The first gate electrode 210 extending along the second direction Y is formed on two or more of the fin-type active patterns. The first gate electrode 210 intersects two or more of the fin-type active patterns (110, 120, and optionally 130).

In addition, the second gate electrode 310 extending along the second direction Y is formed on one or more of the fin-type active patterns (110, 120, and optionally 130). The second gate electrode 310 intersects one or more of the fin-type active patterns (110, 120, and optionally 130).

As illustrated in the drawings, the first gate electrode 210 is disposed between the second gate electrode 310 and the first contact 510.

As illustrated in the drawings, the number of fin-type active patterns intersecting the first gate electrode 210 is different from the number of fin-type active patterns intersecting the second gate electrode 310.

In the semiconductor devices according to various embodiments of the present invention, the number of fin-type active patterns intersected by the first gate electrode 210 is greater than the number of fin-type active patterns intersected by the second gate electrode 310.

In FIGS. 3 through 21, two or three fin-type active patterns are illustrated. However, this is merely intended for ease of description, and the present invention is not limited thereto.

In the following embodiments, two antifuse memory cells that share the bit line BL illustrated in FIG. 2 will be described. A description of elements identical to those of the above-described embodiments of FIGS. 1 through 12 will be omitted or given briefly.

A semiconductor device according to a thirteenth embodiment of the present invention will now be described with reference to FIG. 22.

Figure 22:
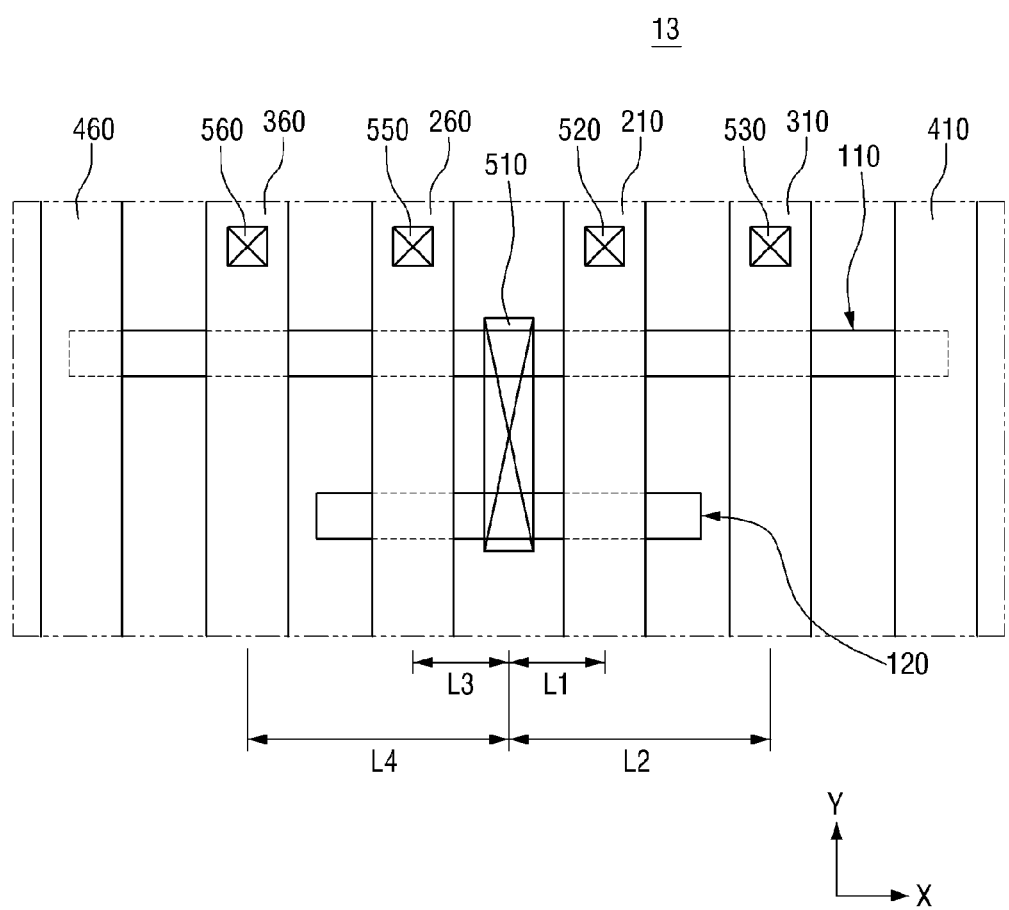
FIG. 22 is a layout view of a semiconductor device according to a thirteenth embodiment of the present invention.

FIG. 22 is a layout view of a semiconductor device 13 according to a thirteenth embodiment of the present invention.

Referring to FIG. 22, the semiconductor device 13 according to the thirteenth embodiment of the present invention includes a first fin-type active pattern 110, a second fin-type active pattern 120, a first contact 510, a first gate electrode 210, a second gate electrode 310, a third gate electrode 410, a fourth gate electrode 260, a fifth gate electrode 360, and a sixth gate electrode 460.

The first fin-type active pattern 110 and the second fin-type active pattern 120 defined by a field insulating layer 105 (see FIG. 4) may extend along a first direction X. In addition, the first fin-type active pattern 110 and the second fin-type active pattern 120 are arranged in a second direction Y.

Each of the first fin-type active pattern 110 and the second fin-type active pattern 120 may include long sides extending along the first direction X and short sides extending along the second direction Y. Therefore, each of the first fin-type active pattern 110 and the second fin-type active pattern 120 may include two end portions separated from each other in the first direction X.

The first contact 510 is formed on the first fin-type active pattern 110 and the second fin-type active pattern 120 and thus electrically connected to the first fin-type active pattern 110 and the second fin-type active pattern 120.

Each of the first gate electrode 210 and the fourth gate electrode 260 may extend along the second direction Y. The first gate electrode 210 intersects the first fin-type active pattern 110 and the second fin-type active pattern 120. The fourth gate electrode 260 intersects the first fin-type active pattern 110 and the second fin-type active pattern 120.

The first gate electrode 210 is formed on the first fin-type active pattern 110 and the second fin-type active pattern 120, and the fourth gate electrode 260 is formed on the first fin-type active pattern 110 and the second fin-type active pattern 120.

The first gate electrode 210 is formed on a side surface of the first contact 510 separated in the first direction X, and the fourth gate electrode 260 is formed on the other side surface of the first contact 510 separated in the first direction X. Therefore, the first contact 510 is disposed between the first gate electrode 210 and the fourth gate electrode 260. A first side surface of the first contact 510 may face and be adjacent to a first side surface of the first gate electrode 210, and a second, opposite side surface of the first contact 510 may face and be adjacent to a first side surface of the fourth gate electrode 260.

The first gate electrode 210 is separated from the first contact 510 by a first distance L1, and the fourth gate electrode 260 is separated from the first contact 510 by a third distance L3. In one embodiment, L1 is substantially equal to L3.

In the semiconductor devices according to certain embodiments of the present invention, each of the first gate electrode 210 and the fourth gate electrode 260 may be a gate terminal of an access transistor illustrated in FIG. 2. Therefore, the first gate electrode 210 and the fourth gate electrode 260 may be connected to the word line WL.

Each of the second gate electrode 310 and the fifth gate electrode 360 may extend along the second direction Y. Each of the second gate electrode 310 and the fifth gate electrode 360 intersects the first fin-type active pattern 110 but does not intersect the second fin-type active pattern 120.

Each of the second gate electrode 310 and the fifth gate electrode 360 is formed on the first fin-type active pattern 110 but is not formed on the second fin-type active pattern 120.

The second gate electrode 310 is separated from the first contact 510 by a second distance L2. The second distance L2 from the second gate electrode 310 to the first contact 510 is greater than the first distance L1 from the first gate electrode 210 to the first contact 510.

As shown, the first gate electrode 210 is disposed between the second gate electrode 310 and the first contact 510.

The fifth gate electrode 360 is separated from the first contact 510 by a fourth distance L4. The fourth distance L4 from the fifth gate electrode 360 to the first contact 510 is greater than the third distance L3 from the fourth gate electrode 260 to the first contact 510. The distance L2 may be substantially equal to the distance L4.

As shown, the fourth gate electrode 260 is disposed between the fifth gate electrode 360 and the first contact 510.

In the semiconductor devices according to certain embodiments of the present invention, each of the second gate electrode 310 and the fifth gate electrode 360 may be a gate terminal of a rupture transistor illustrated in FIG. 2. Therefore, the second gate electrode 310 and the fifth gate electrode 360 may be connected to the high-voltage line WP.

Each of the third gate electrode 410 and the sixth gate electrode 460 may extend along the second direction Y. Each of the third gate electrode 410 and the sixth gate electrode 460 intersects the first fin-type active pattern 110 but does not intersect the second fin-type active pattern 120.

Each of the third gate electrode 410 and the sixth gate electrode 460 is formed on the first fin-type active pattern 110 but is not formed on the second fin-type active pattern 120.

The second gate electrode 310 is disposed between the third gate electrode 410 and the first gate electrode 210, and the fifth gate electrode 360 is disposed between the sixth gate electrode 460 and the fourth gate electrode 260.

In the semiconductor device 13 according to the thirteenth embodiment of the present invention, the third gate electrode 410 and the sixth gate electrode 460 may be electrically floating gate electrodes. As such, the third gate electrode 410 and the sixth gate electrode 460 may be dummy gate electrodes.

A second contact 520 may connect the first gate electrode 210 to the word line WL illustrated in FIG. 2.

A third contact 530 may connect the second gate electrode 310 to the high-voltage line WP illustrated in FIG. 2.

A fourth contact 550 may connect the fourth gate electrode 260 to the word line WL illustrated in FIG. 2.

A fifth contact 560 may connect the fifth gate electrode 360 to the high-voltage line WP illustrated in FIG. 2.

As illustrated in FIG. 22, a contact electrically connected to the first fin-type active pattern 110 located between the first gate electrode 210 and the second gate electrode 310 is not formed. In other word, the first fin-type active pattern 110 located between the first gate electrode 210 and the second gate electrode 310 is not electrically connected to wiring line, such as word line (WL) or bit line (BL), wiring line providing electrical signal, or the like.

Likewise, a contact electrically connected to the first fin-type active pattern 110 located between the fourth gate electrode 260 and the fifth gate electrode 360 is not formed. In other word, the first fin-type active pattern 110 located between the fourth gate electrode 260 and the fifth gate electrode 360 is not electrically connected to wiring line, such as word line (WL) or bit line (BL), wiring line providing electrical signal, or the like.

In the semiconductor device 13 according to the thirteenth embodiment of the present invention, the third gate electrode 410 may cover one of the end portions of the first fin-type active pattern 110. In addition, the sixth gate electrode 460 may cover the other one of the end portions of the first fin-type active pattern 110. One of the end portions of the second fin-type active pattern 120 protrudes in the first direction X from a side surface of the first gate electrode 210. Further, the other one of the end portions of the second fin-type active pattern 120 protrudes in the first direction X from a side surface of the fourth gate electrode 260.

The structure depicted in FIG. 22 may form two anti-fuse memory cells connected to the same bit line.

Semiconductor devices according to fourteenth through sixteenth embodiments of the present invention will now be described with reference to FIGS. 23 through 25. For simplicity, the fourteenth through sixteenth embodiments will hereinafter be described, focusing mainly on differences with the embodiment of FIG. 22.

Figure 23:
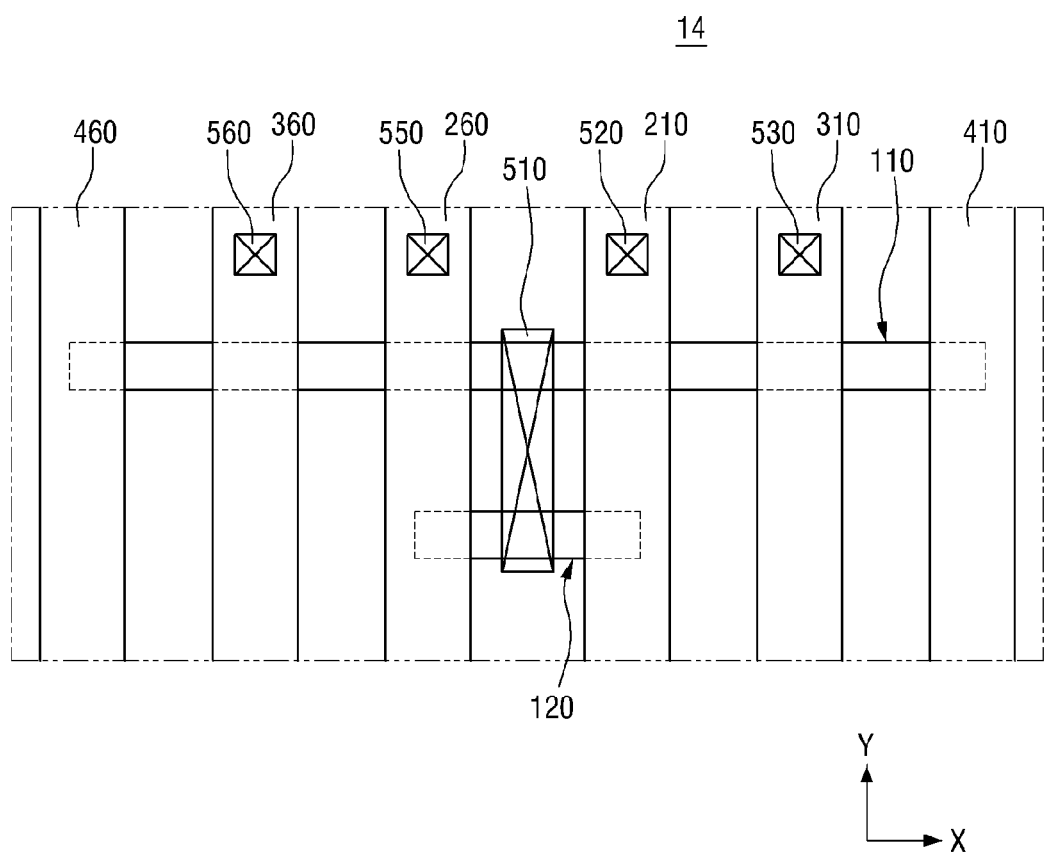
FIG. 23 is a layout view of a semiconductor device according to a fourteenth embodiment of the present invention.

FIG. 23 is a layout view of a semiconductor device 14 according to a fourteenth embodiment of the present invention. FIG. 24 is a layout view of a semiconductor device 15 according to a fifteenth embodiment of the present invention. FIG. 25 is a layout view of a semiconductor device 16 according to a sixteenth embodiment of the present invention.

Referring to FIG. 23, in the semiconductor device 14 according to the fourteenth embodiment of the present invention, one of the end portions of a second fin-type active pattern 120 does not protrude in a first direction X from a side surface of a first gate electrode 210.

In addition, the other one of the end portions of the second fin-type active pattern 120 does not protrude in the first direction X from a side surface of a fourth gate electrode 260.

For example, one of the end portions of the second fin-type active pattern 120 is located under the first gate electrode 210 and overlapped by the first gate electrode 210. In addition, the other one of the end portions of the second fin-type active pattern 120 is located under the fourth gate electrode 260 and overlapped by the fourth gate electrode 260.

Figure 24:
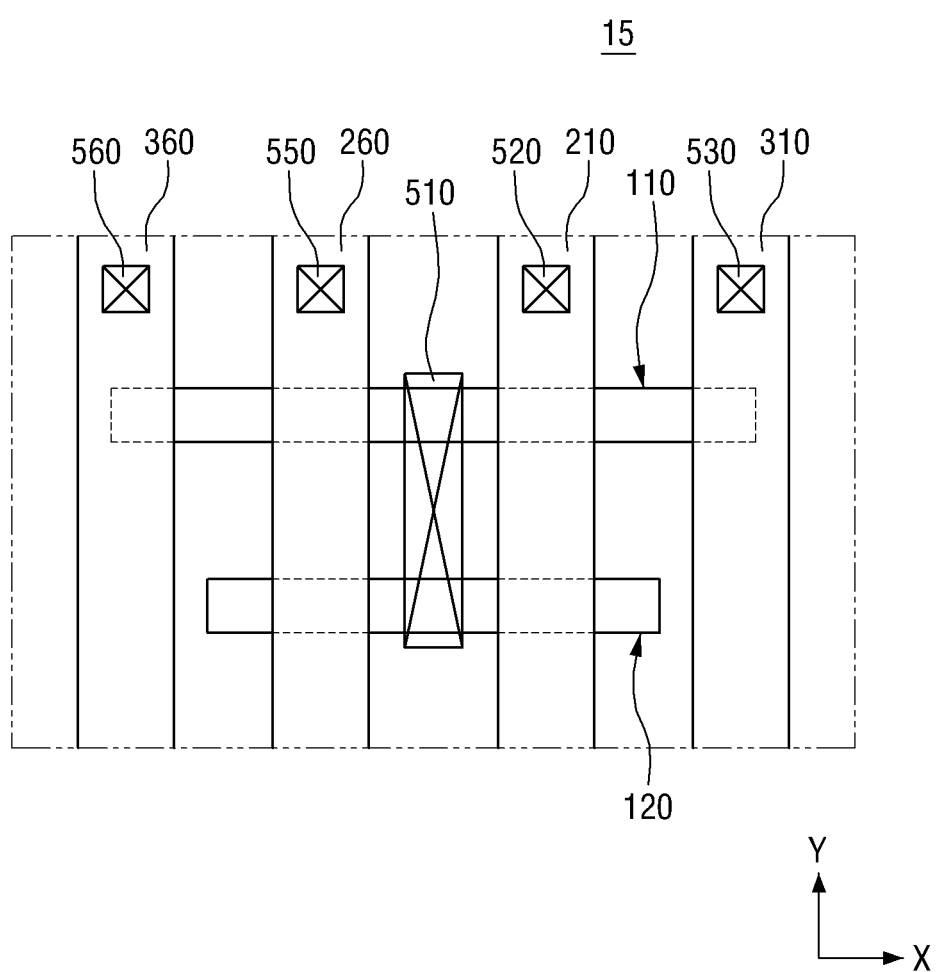
FIG. 24 is a layout view of a semiconductor device according to a fifteenth embodiment of the present invention.

Referring to FIG. 24, in the semiconductor device 15 according to the fifteenth embodiment of the present invention, one of the end portions of a first fin-type active pattern 110 does not protrude in a first direction X from a side surface of a second gate electrode 310.

In addition, the other one of the end portions of the first fin-type active pattern 110 does not protrude in the first direction X from a side surface of a fifth gate electrode 360.

For example, one of the end portions of the first fin-type active pattern 110 is located under the second gate electrode 310 and overlapped by the second gate electrode 310. In addition, the other one of the end portions of the first fin-type active pattern 110 is located under the fifth gate electrode 360 and overlapped by the fifth gate electrode 360.

Therefore, unlike the semiconductor device 13 according to the thirteenth embodiment of the present invention, the semiconductor device 15 according to the fifteenth embodiment of the present invention does not include a third gate electrode 410 and a sixth gate electrode 460.

Figure 25:
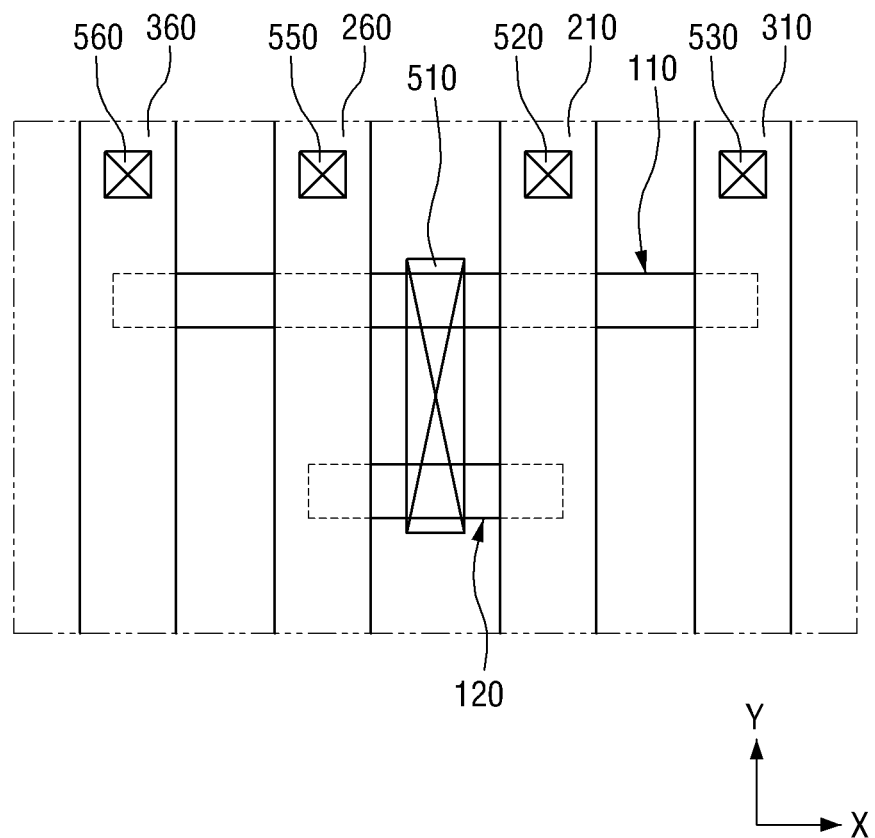
FIG. 25 is a layout view of a semiconductor device according to a sixteenth embodiment of the present invention.

Referring to FIG. 25, in the semiconductor device 16 according to the sixteenth embodiment of the present invention, one of the end portions of a second fin-type active pattern 120 does not protrude in a first direction X from a side surface of a first gate electrode 210.

In addition, the other one of the end portions of the second fin-type active pattern 120 does not protrude in the first direction X from a side surface of a fourth gate electrode 260.

One of end portions of a first fin-type active pattern 110 does not protrude in the first direction X from a side surface of a second gate electrode 310. In addition, the other one of the end portions of the first fin-type active pattern 110 does not protrude in the first direction X from a side surface of a fifth gate electrode 360.

For example, one of the end portions of the second fin-type active pattern 120 is located under the first gate electrode 210 and overlapped by the first gate electrode 210. In addition, the other one of the end portions of the second fin-type active pattern 120 is located under the fourth gate electrode 260 and overlapped by the fourth gate electrode 260.

Further, one of the end portions of the first fin-type active pattern 110 is located under the second gate electrode 310 and overlapped by the second gate electrode 310. In addition, the other one of the end portions of the first fin-type active pattern 110 is located under the fifth gate electrode 360 and overlapped by the fifth gate electrode 360.

Therefore, unlike the semiconductor device 13 according to the thirteenth embodiment of the present invention, the semiconductor device 16 according to the sixteenth embodiment of the present invention does not include a third gate electrode 410 and a sixth gate electrode 460.

A semiconductor device according to a seventeenth embodiment of the present invention will now be described with reference to FIG. 26. For simplicity, the seventeenth embodiment will hereinafter be described, focusing mainly on differences with the embodiment of FIG. 22.

Figure 26:
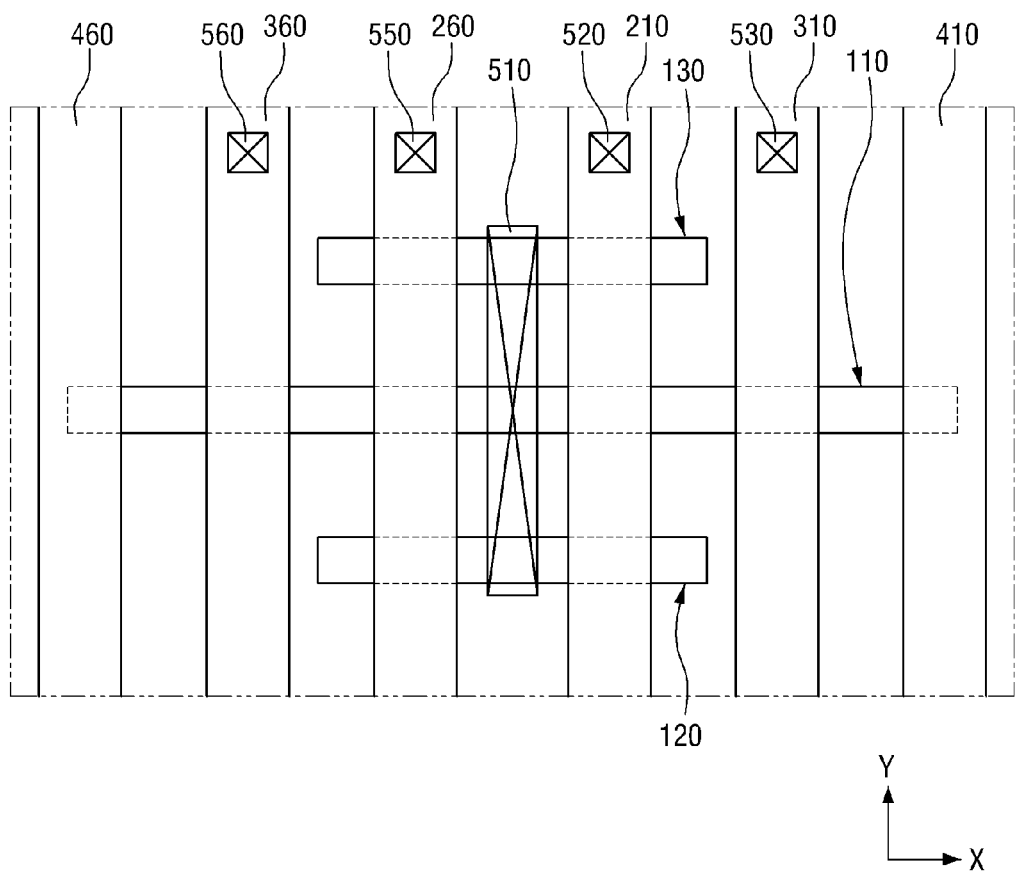
FIG. 26 is a layout view of a semiconductor device according to a seventeenth embodiment of the present invention.

FIG. 26 is a layout view of a semiconductor device 17 according to a seventeenth embodiment of the present invention.

Referring to FIG. 26, the semiconductor device 17 according to the seventeenth embodiment of the present invention further includes a third fin-type active pattern 130.

The third fin-type active pattern 130 defined by a field insulating layer 105 (see FIG. 4) may extend along a first direction X. In addition, first through third fin-type active patterns 110 through 130 are arranged in a second direction Y.

The third fin-type active pattern 130 may include long sides extending along the first direction X and short sides extending along the second direction Y. Therefore, the third fin-type active pattern 130 may include two end portions separated from each other in the first direction X.

A first contact 510 is formed on the third fin-type active pattern 130 and electrically connected to the first through third fin-type active patterns 110 through 130.

Each of a first gate electrode 210 and a fourth gate electrode 260 intersects the third fin-type active pattern 130. In addition, each of the first gate electrode 210 and the fourth gate electrode 260 is formed on the third fin-type active pattern 130.

A second gate electrode 310 and a fifth gate electrode 360 do not intersect the third fin-type active pattern 130. Each of the second gate electrode 310 and the fifth gate electrode 360 is not formed on the third fin-type active pattern 130.

In the semiconductor device 17 according to the seventeenth embodiment of the present invention, one of the end portions of the third fin-type active pattern 130 protrudes in the first direction X from a side surface of the first gate electrode 210. Further, the other one of the end portions of the third fin-type active pattern 130 protrudes in the first direction X from a side surface of the fourth gate electrode 260.

In FIG. 26, the first fin-type active pattern 110 is disposed between the second fin-type active pattern 120 and the third fin-type active pattern 130. However, the present invention is not limited thereto.

Semiconductor devices according to eighteenth through twentieth embodiments of the present invention will now be described with reference to FIGS. 27 through 29. For simplicity, the eighteenth through twentieth embodiments will hereinafter be described, focusing mainly on differences with the embodiment of FIG. 26.

Figure 27:
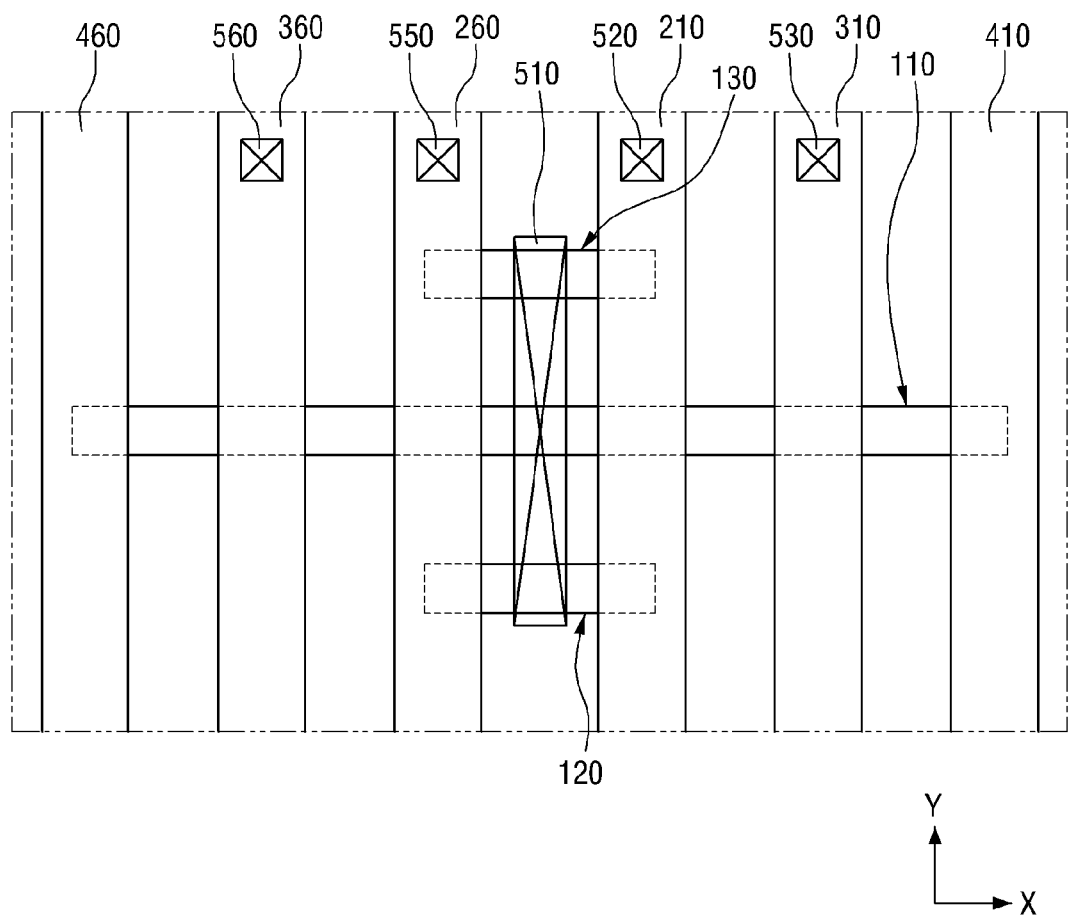
FIG. 27 is a layout view of a semiconductor device according to an eighteenth embodiment of the present invention.

FIG. 27 is a layout view of a semiconductor device 18 according to an eighteenth embodiment of the present invention. FIG. 28 is a layout view of a semiconductor device 19 according to a nineteenth embodiment of the present invention. FIG. 29 is a layout view of a semiconductor device 20 according to a twentieth embodiment of the present invention.

Referring to FIG. 27, in the semiconductor device 18 according to the eighteenth embodiment of the present invention, one of the end portions of a second fin-type active pattern 120 and one of the end portions of a third fin-type active pattern 130 do not protrude in a first direction X from a side surface of a first gate electrode 210.

In addition, the other one of the end portions of the second fin-type active pattern 120 and the other one of the end portions of the third fin-type active pattern 130 do not protrude in the first direction X from a side surface of a fourth gate electrode 260.

For example, one of the end portions of the second fin-type active pattern 120 and one of the end portions of the third fin-type active pattern 130 are located under the first gate electrode 210 and overlapped by the first gate electrode 210.

In addition, the other one of the end portions of the second fin-type active pattern 120 and the other one of the end portions of the third fin-type active pattern 130 are located under the fourth gate electrode 260 and overlapped by the fourth gate electrode 260.

Figure 28:
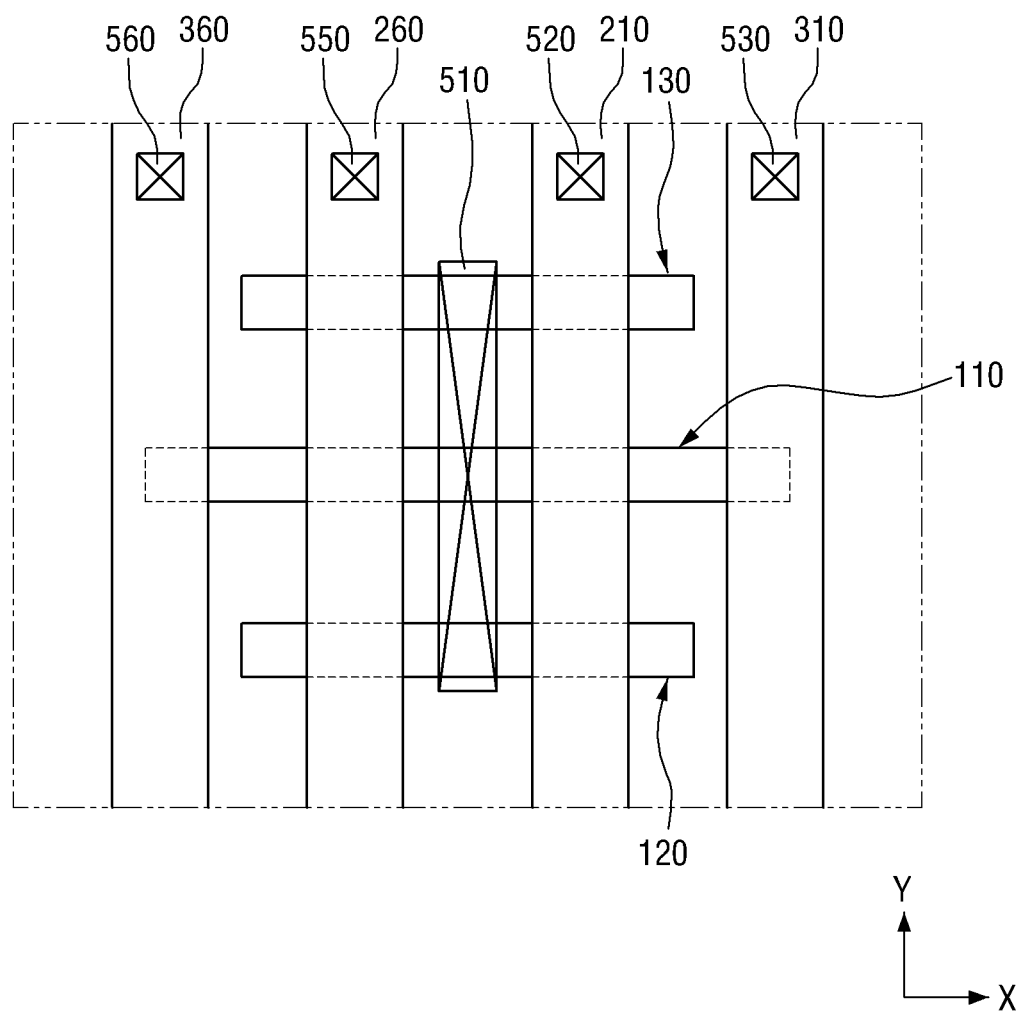
FIG. 28 is a layout view of a semiconductor device according to a nineteenth embodiment of the present invention.

Referring to FIG. 28, in the semiconductor device 19 according to the nineteenth embodiment of the present invention, one of the end portions of a first fin-type active pattern 110 does not protrude in a first direction X from a side surface of a second gate electrode 310.

In addition, the other one of the end portions of the first fin-type active pattern 110 does not protrude in the first direction X from a side surface of a fifth gate electrode 360.

For example, one of the end portions of the first fin-type active pattern 110 is located under the second gate electrode 310 and overlapped by the second gate electrode 310. In addition, the other one of the end portions of the first fin-type active pattern 110 is located under the fifth gate electrode 360 and overlapped by the fifth gate electrode 360.

Therefore, unlike the semiconductor device 17 according to the seventeenth embodiment of the present invention, the semiconductor device 19 according to the nineteenth embodiment of the present invention does not include a third gate electrode 410 and a sixth gate electrode 460.

Figure 29:
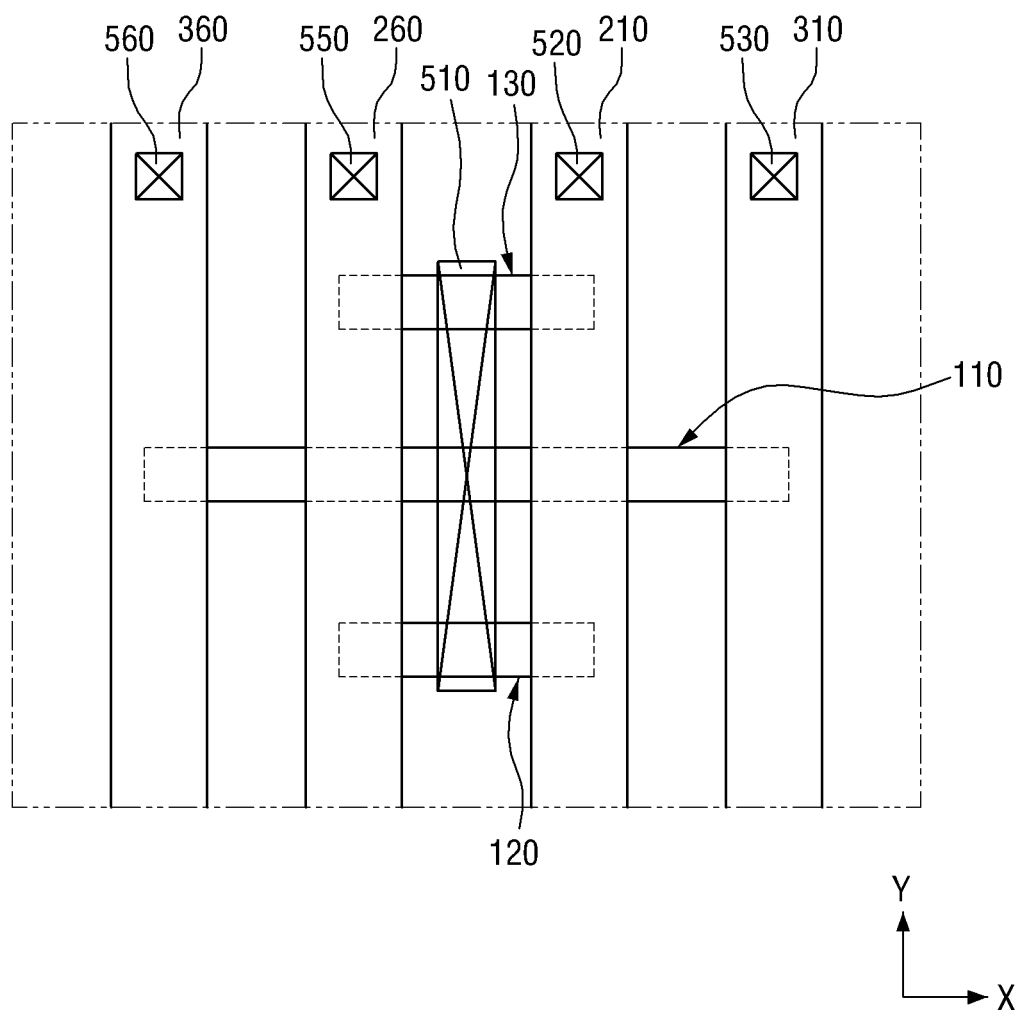
FIG. 29 is a layout view of a semiconductor device according to a twentieth embodiment of the present invention.

Referring to FIG. 29, in the semiconductor device 20 according to the twentieth embodiment of the present invention, one of the end portions of a second fin-type active pattern 120 and one of end portions of a third fin-type active pattern 130 do not protrude in a first direction X from a side surface of a first gate electrode 210.

In addition, the other one of the end portions of the second fin-type active pattern 120 and the other one of the end portions of the third fin-type active pattern 130 do not protrude in the first direction X from a side surface of a fourth gate electrode 260.

One of end portions of a first fin-type active pattern 110 does not protrude in the first direction X from a side surface of a second gate electrode 310. In addition, the other one of the end portions of the first fin-type active pattern 110 does not protrude in the first direction X from a side surface of a fifth gate electrode 360.

A semiconductor device according to a twenty-first embodiment of the present invention will now be described with reference to FIG. 30. For simplicity, the twenty-first embodiment will hereinafter be described, focusing mainly on differences with the embodiment of FIG. 26.

Figure 30:
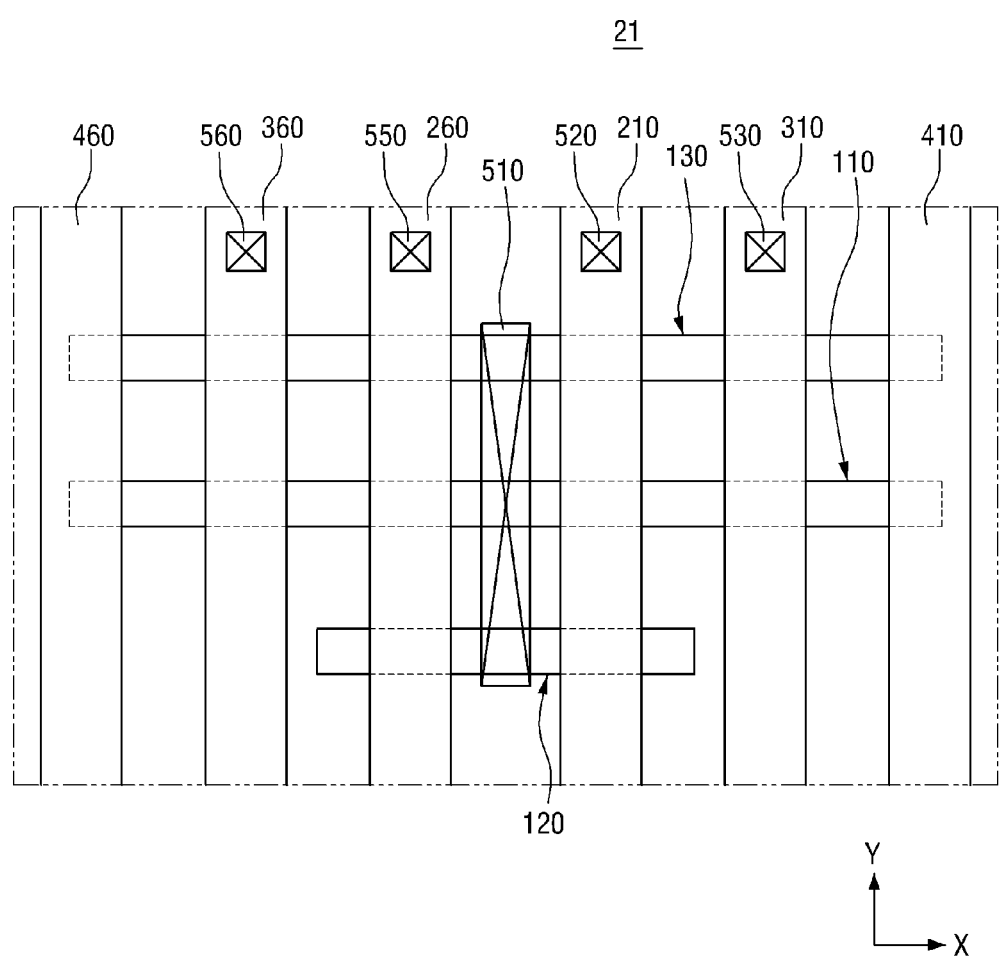
FIG. 30 is a layout view of a semiconductor device according to a twenty-first embodiment of the present invention.

FIG. 30 is a layout view of a semiconductor device 21 according to a twenty-first embodiment of the present invention.

Referring to FIG. 30, in the semiconductor device 21 according to the twenty-first embodiment of the present invention, each of a second gate electrode 310 and a fifth gate electrode 360 intersects a third fin-type active pattern 130. That is, each of the second gate electrode 310 and the fifth gate electrode 360 is formed on the third fin-type active pattern 130.

Each of a third gate electrode 410 and a sixth gate electrode 460 intersects the third fin-type active pattern 130. Each of the third gate electrode 410 and the sixth gate electrode 460 is formed on the third fin-type active pattern 130.

In the semiconductor device 21 according to the twenty-first embodiment of the present invention, the third gate electrode 410 may cover one of end portions of the third fin-type active pattern 130. In addition, the sixth gate electrode 460 may cover the other one of the end portions of the third fin-type active pattern 130.

Semiconductor devices according to twenty-second through twenty-fourth embodiments of the present invention will now be described with reference to FIGS. 31 through 33. For simplicity, the twenty-second through twenty-fourth embodiments will hereinafter be described, focusing mainly on differences with the embodiment of FIG. 30.

Figure 31:
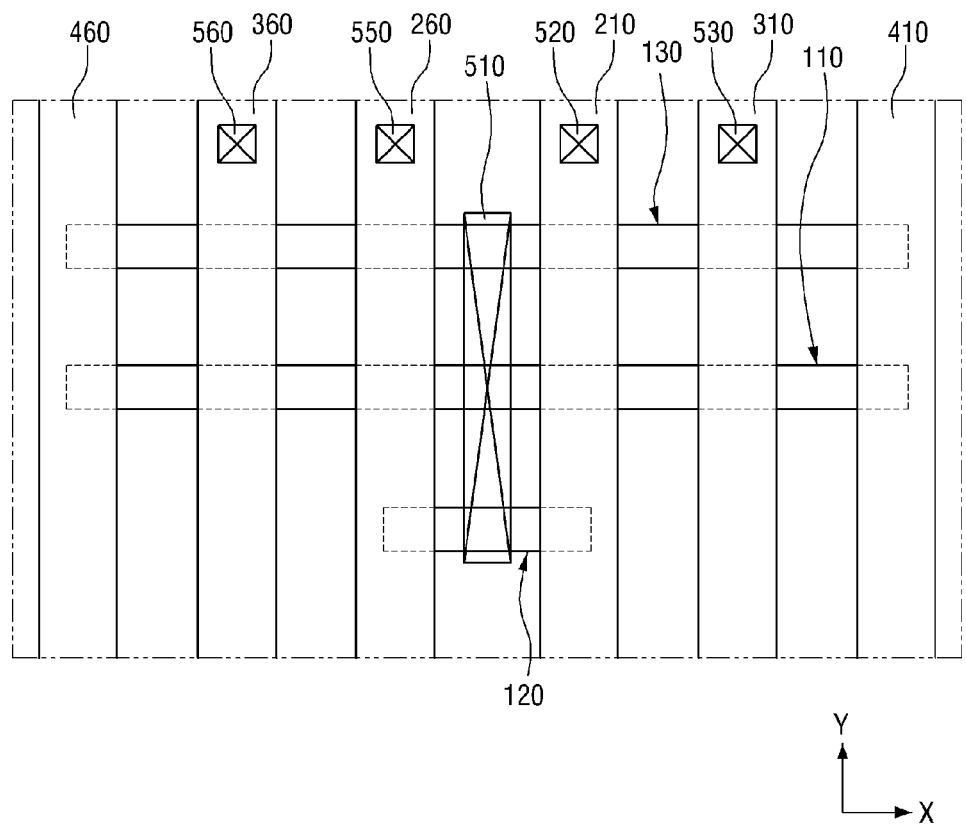
FIG. 31 is a layout view of a semiconductor device according to a twenty-second embodiment of the present invention.

FIG. 31 is a layout view of a semiconductor device 22 according to a twenty-second embodiment of the present invention. FIG. 32 is a layout view of a semiconductor device 23 according to a twenty-third embodiment of the present invention. FIG. 33 is a layout view of a semiconductor device 24 according to a twenty-fourth embodiment of the present invention.

Referring to FIG. 31, in the semiconductor device 22 according to the twenty-second embodiment of the present invention, one of the end portions of a second fin-type active pattern 120 does not protrude in a first direction X from a side surface of a first gate electrode 210.

In addition, the other one of the end portions of the second fin-type active pattern 120 does not protrude in the first direction X from a side surface of a fourth gate electrode 260.

Figure 32:
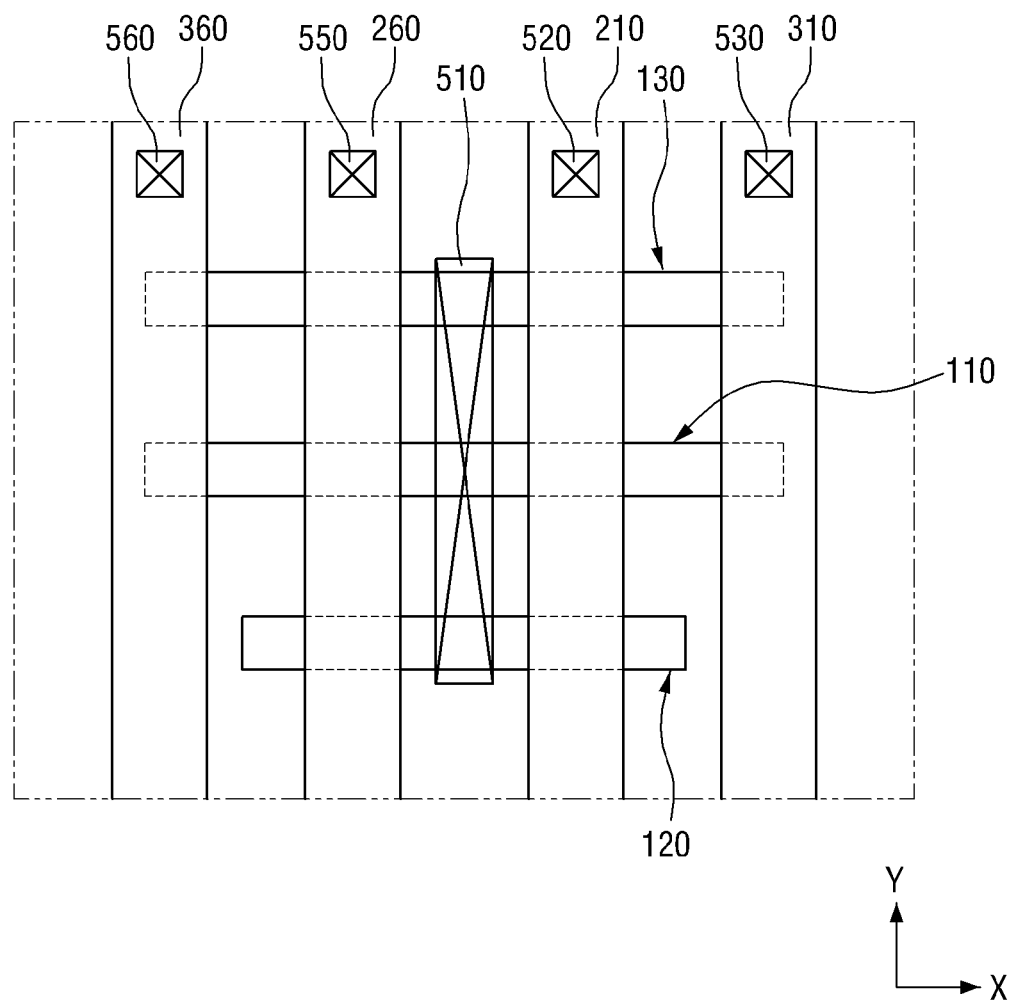
FIG. 32 is a layout view of a semiconductor device according to a twenty-third embodiment of the present invention.

Referring to FIG. 32, in the semiconductor device 23 according to the twenty-third embodiment of the present invention, one of the end portions of a first fin-type active pattern 110 and one of the end portions of a third fin-type active pattern 130 do not protrude in a first direction X from a side surface of a second gate electrode 310.

In addition, the other one of the end portions of the first fin-type active pattern 110 and the other one of the end portions of the third fin-type active pattern 130 do not protrude in the first direction X from a side surface of a fifth gate electrode 360.

Figure 33:
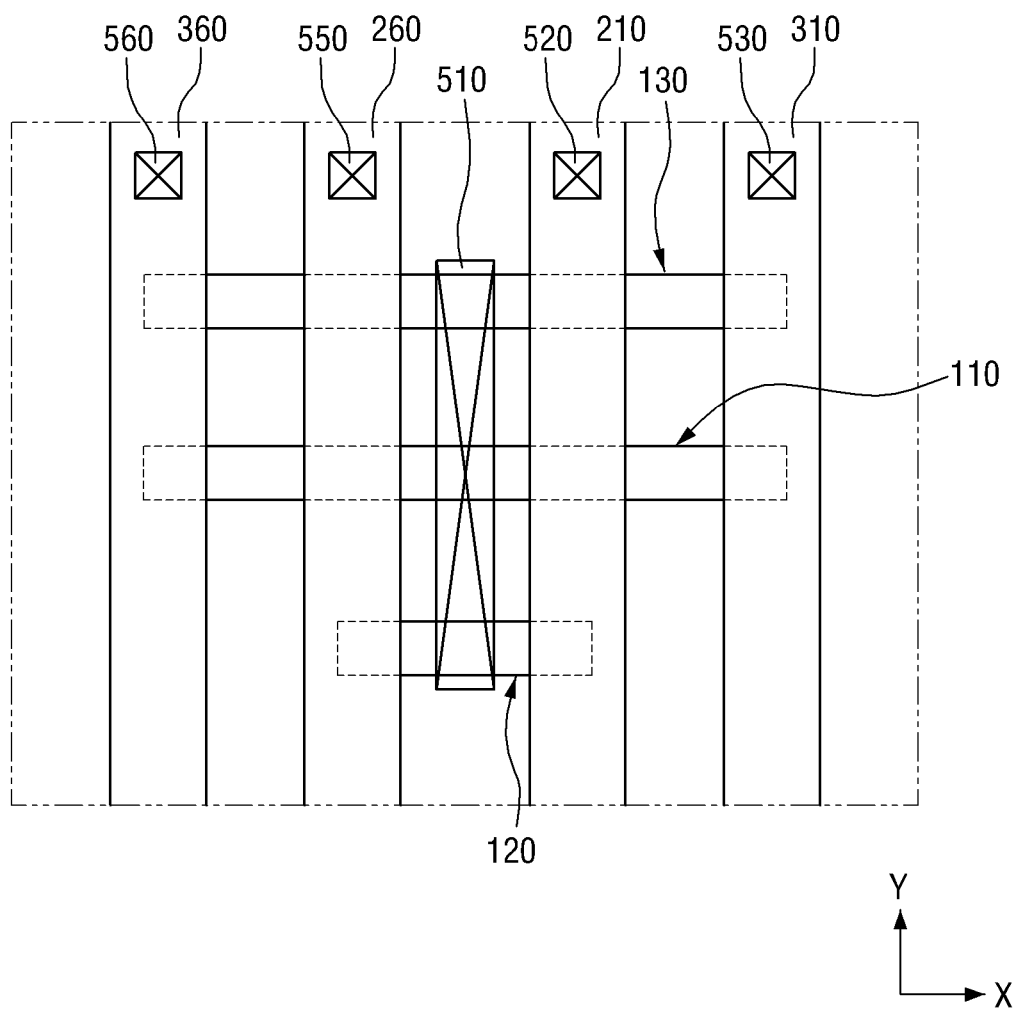
FIG. 33 is a layout view of a semiconductor device according to a twenty-fourth embodiment of the present invention.

Referring to FIG. 33, in the semiconductor device 24 according to the twenty-fourth embodiment of the present invention, one of the end portions of a second fin-type active pattern 120 does not protrude in a first direction X from a side surface of a first gate electrode 210. In addition, the other one of the end portions of the second fin-type active pattern 120 does not protrude in the first direction X from a side surface of a fourth gate electrode 260.

One of the end portions of a first fin-type active pattern 110 and one of the end portions of a third fin-type active pattern 130 do not protrude in the first direction X from a side surface of a second gate electrode 310.

In addition, the other one of the end portions of the first fin-type active pattern 110 and the other one of the end portions of the third fin-type active pattern 130 do not protrude in the first direction X from a side surface of a fifth gate electrode 360.

A semiconductor device according to a twenty-fifth embodiment of the present invention will now be described with reference to FIG. 34. For simplicity, the twenty-fifth embodiment will hereinafter be described, focusing mainly on differences with the embodiment of FIG. 22.

Figure 34:
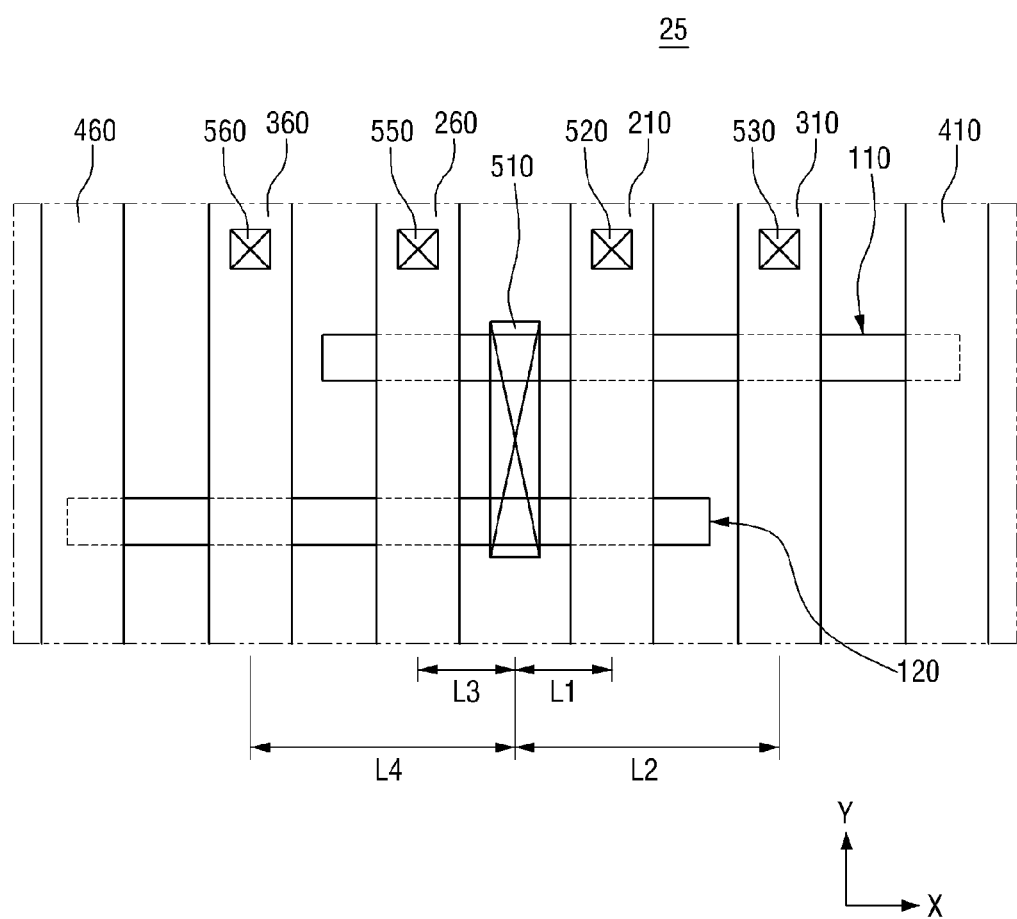
FIG. 34 is a layout view of a semiconductor device according to a twenty-fifth embodiment of the present invention.

FIG. 34 is a layout view of a semiconductor device 25 according to a twenty-fifth embodiment of the present invention.

Referring to FIG. 34, in the semiconductor device 25 according to the twenty-fifth embodiment of the present invention, a second gate electrode 310 intersects a first fin-type active pattern 110 but does not intersect a second fin-type active pattern 120.

The second gate electrode 310 is formed on the first fin-type active pattern 110 but is not formed on the second fin-type active pattern 120.

On the other hand, a fifth gate electrode 360 intersects the second fin-type active pattern 120 but does not intersect the first fin-type active pattern 110.

The fifth gate electrode 360 is formed on the second fin-type active pattern 120 but is not formed on the first fin-type active pattern 110.

A third gate electrode 410 intersects the first fin-type active pattern 110 but does not intersect the second fin-type active pattern 120. The third gate electrode 410 is formed on the first fin-type active pattern 110 but is not formed on the second fin-type active pattern 120.

A sixth gate electrode 460 intersects the second fin-type active pattern 120 but does not intersect the first fin-type active pattern 110. The sixth gate electrode 460 is formed on the second fin-type active pattern 120 but is not formed on the first fin-type active pattern 110.

As illustrated in FIG. 34, a contact electrically connected to the first fin-type active pattern 110 located between a first gate electrode 210 and the second gate electrode 310 for connecting to a wiring line carrying an external signal is not formed. Accordingly, the first fin-type active pattern 110 located between the first gate electrode 210 and the second gate electrode 310 is not electrically connected to a wiring line, such as word line (WL) or bit line (BL), a wiring line providing electrical signal, or the like.

Likewise, a similar type of contact electrically connected to the second fin-type active pattern 120 located between a fourth gate electrode 260 and the fifth gate electrode 360 is not formed. Thus, the second fin-type active pattern 120 located between the fourth gate electrode 260 and the fifth gate electrode 360 is not electrically connected to a wiring line, such as word line (WL) or bit line (BL), a wiring line providing electrical signal, or the like.

In the semiconductor device 25 according to the twenty-fifth embodiment of the present invention, one of the end portions of the first fin-type active pattern 110 may be covered by the third gate electrode 410. However, the other one of the end portions of the first fin-type active pattern 110 may protrude in a first direction X from a side surface of the fourth gate electrode 260.

In addition, one of the end portions of the second fin-type active pattern 120 may be covered by the sixth gate electrode 460. However, the other one of the end portions of the second fin-type active pattern 120 protrudes in the first direction X from a side surface of the first gate electrode 210.

Semiconductor devices according to twenty-sixth through twenty-eighth embodiments of the present invention will now be described with reference to FIGS. 35 through 37. For simplicity, the twenty-sixth through twenty-eighth embodiments will hereinafter be described, focusing mainly on differences with the embodiment of FIG. 34.

Figure 35:
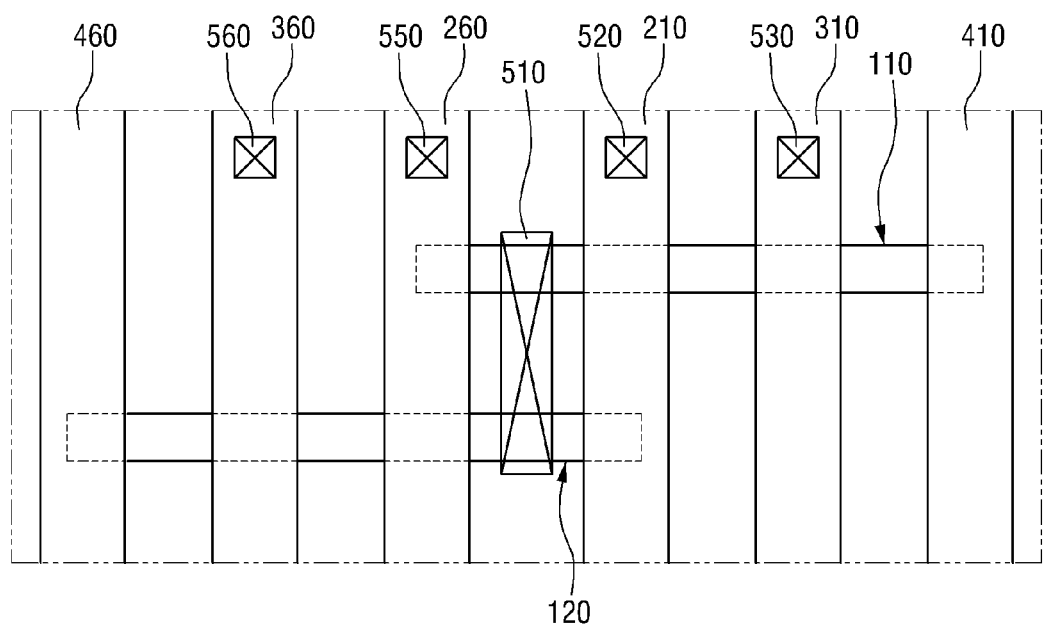
FIG. 35 is a layout view of a semiconductor device according to a twenty-sixth embodiment of the present invention.

FIG. 35 is a layout view of a semiconductor device 26 according to a twenty-sixth embodiment of the present invention. FIG. 36 is a layout view of a semiconductor device 27 according to a twenty-seventh embodiment of the present invention. FIG. 37 is a layout view of a semiconductor device 28 according to a twenty-eighth embodiment of the present invention.

Referring to FIG. 35, in the semiconductor device 26 according to the twenty-sixth embodiment of the present invention, one of the end portions of a first fin-type active pattern 110 is covered by a third gate electrode 410, but the other one of the end portions of the first fin-type active pattern 110 does not protrude in a first direction X from a side surface of a fourth gate electrode 260.

In addition, one of the end portions of a second fin-type active pattern 120 is covered by a sixth gate electrode 460, but the other one of the end portions of the second fin-type active pattern 120 does not protrude in the first direction X from a side surface of a first gate electrode 210.

Figure 36:
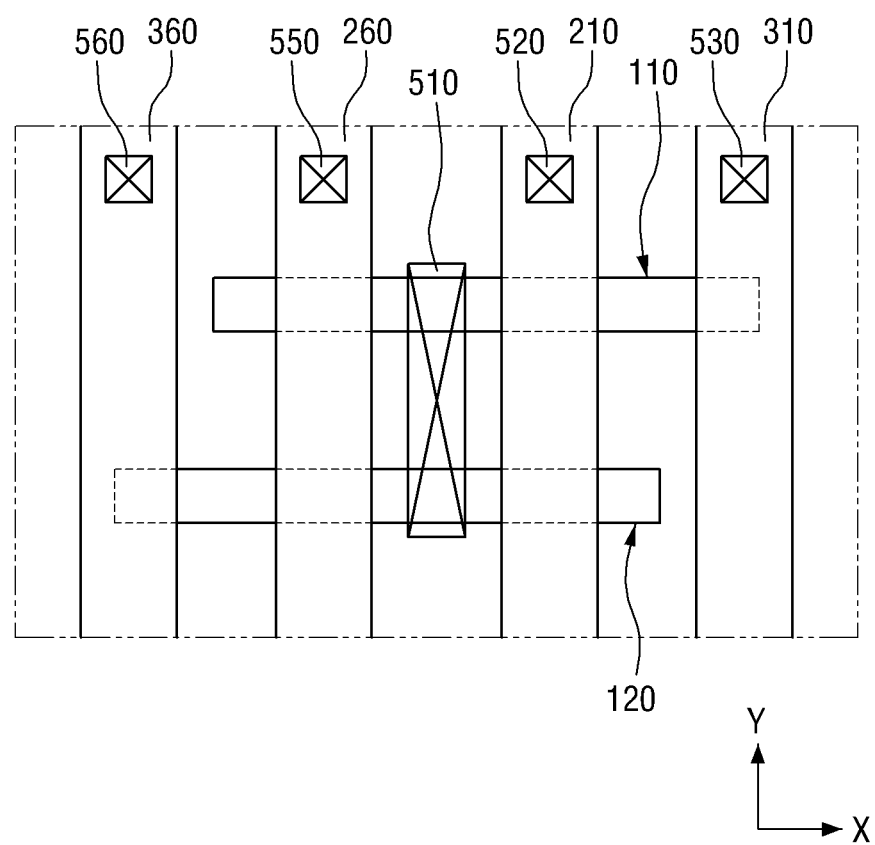
FIG. 36 is a layout view of a semiconductor device according to a twenty-seventh embodiment of the present invention.

Referring to FIG. 36, in the semiconductor device 27 according to the twenty-seventh embodiment of the present invention, one of the end portions of a first fin-type active pattern 110 does not protrude in a first direction X from a side surface of a second gate electrode 310, but the other one of the end portions of the first fin-type active pattern 110 protrudes in the first direction X from a side surface of a fourth gate electrode 260.

One of the end portions of a second fin-type active pattern 120 does not protrude in the first direction X from a side surface of a fifth gate electrode 360, but the other one of the end portions of the second fin-type active pattern 120 protrudes in the first direction X from a side surface of a first gate electrode 210.

Therefore, unlike the semiconductor device 25 according to the twenty-fifth embodiment of the present invention, the semiconductor device 27 according to the twenty-seventh embodiment of the present invention does not include a third gate electrode 410 and a sixth gate electrode 460.

Figure 37:
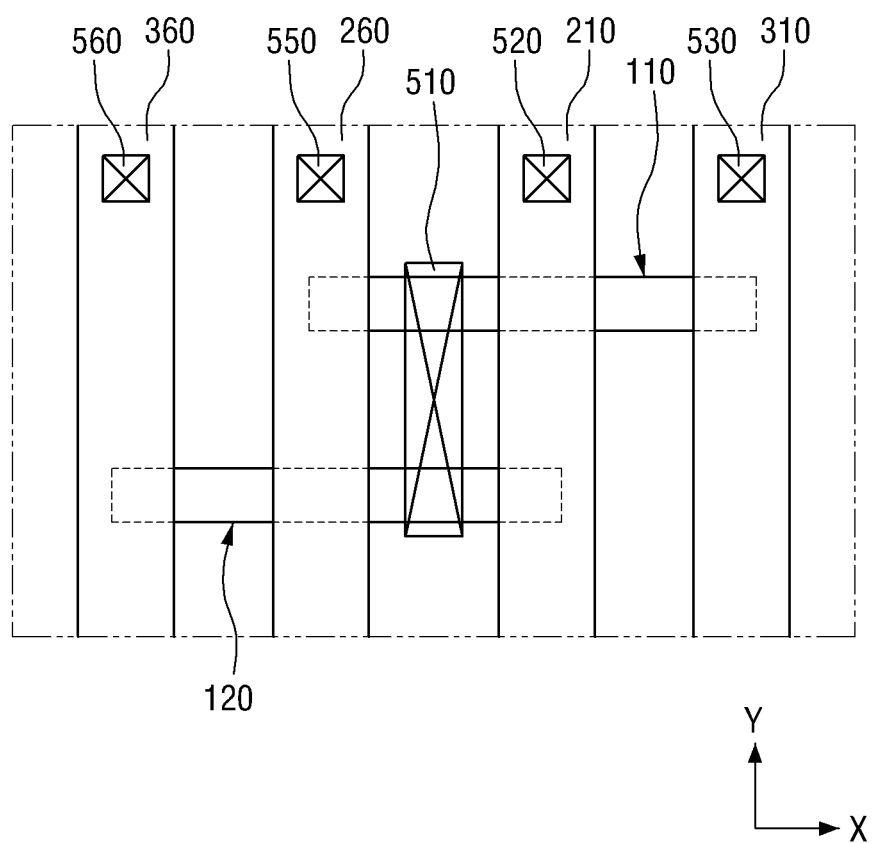
FIG. 37 is a layout view of a semiconductor device according to a twenty-eighth embodiment of the present invention.

Referring to FIG. 37, in the semiconductor device 28 according to the twenty-eighth embodiment of the present invention, one of the end portions of a first fin-type active pattern 110 does not protrude in a first direction X from a side surface of a second gate electrode 310. In addition, the other one of the end portions of the first fin-type active pattern 110 does not protrude in the first direction X from a side surface of a fourth gate electrode 260.

One of the end portions of a second fin-type active pattern 120 does not protrude in the first direction X from a side surface of a fifth gate electrode 360. In addition, the other one of the end portions of the second fin-type active pattern 120 does not protrude in the first direction X from a side surface of a first gate electrode 210.

A semiconductor device according to a twenty-ninth embodiment of the present invention will now be described with reference to FIG. 38. For simplicity, the twenty-ninth embodiment will hereinafter be described, focusing mainly on differences with the embodiment of FIG. 34.

Figure 38:
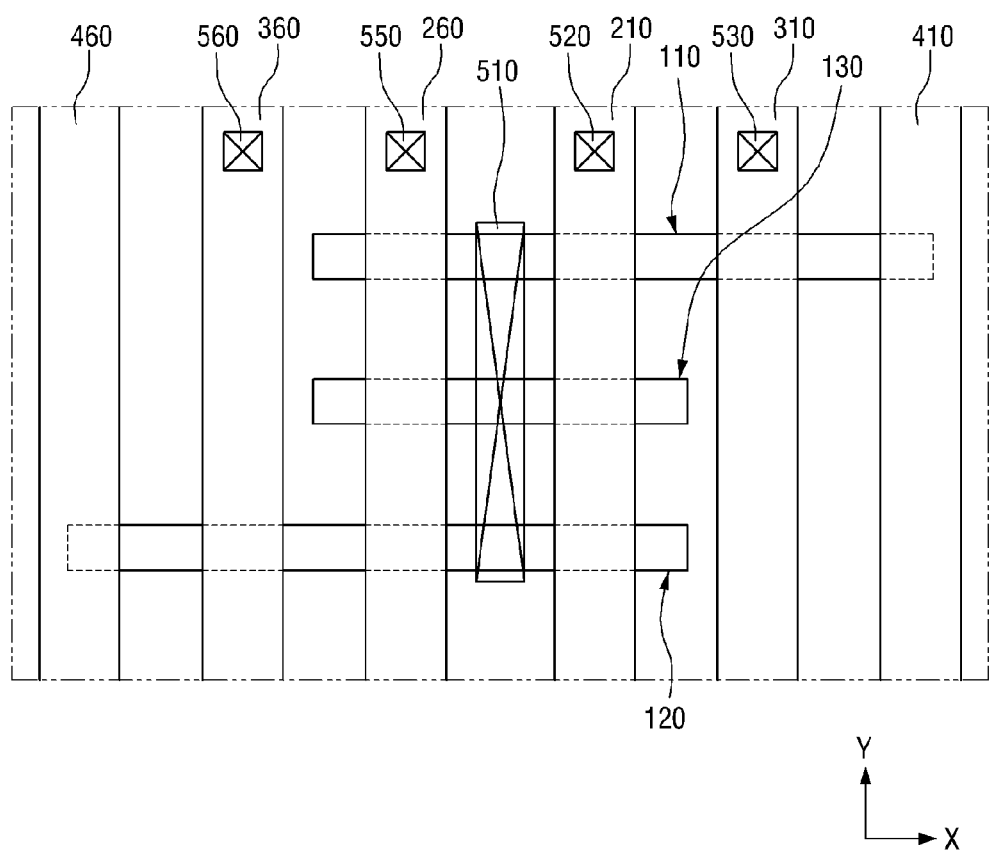
FIG. 38 is a layout view of a semiconductor device according to a twenty-ninth embodiment of the present invention.

FIG. 38 is a layout view of a semiconductor device 29 according to a twenty-ninth embodiment of the present invention.

Referring to FIG. 38, the semiconductor device 29 according to the twenty-ninth embodiment of the present invention further includes a third fin-type active pattern 130.

The third fin-type active pattern 130 defined by a field insulating layer 105 (see FIG. 4) may extend along a first direction X. In addition, first through third fin-type active patterns 110 through 130 are arranged in a second direction Y.

The third fin-type active pattern 130 may include long sides extending along the first direction X and short sides extending along the second direction Y. Therefore, the third fin-type active pattern 130 may include two end portions separated from each other in the first direction X.

A first contact 510 is formed on the third fin-type active pattern 130 and electrically connected to the first through third fin-type active patterns 110 through 130.

Each of a first gate electrode 210 and a fourth gate electrode 260 intersects the third fin-type active pattern 130. In addition, each of the first gate electrode 210 and the fourth gate electrode 260 is formed on the third fin-type active pattern 130.

A second gate electrode 310 and a fifth gate electrode 360 do not intersect the third fin-type active pattern 130. Each of the second gate electrode 310 and the fifth gate electrode 360 is not formed on the third fin-type active pattern 130.

In the semiconductor device 29 according to the twenty-ninth embodiment of the present invention, one of the end portions of the third fin-type active pattern 130 protrudes in the first direction X from a side surface of the first gate electrode 210. Further, the other one of the end portions of the third fin-type active pattern 130 protrudes in the first direction X from a side surface of the fourth gate electrode 260.

In FIG. 38, the third fin-type active pattern 130 is disposed between the first fin-type active pattern 110 and the second fin-type active pattern 120. However, the present invention is not limited thereto.

Semiconductor devices according to thirtieth through thirty-second embodiments of the present invention will now be described with reference to FIGS. 39 through 41. For simplicity, the thirtieth through thirty-second embodiments will hereinafter be described, focusing mainly on differences with the embodiment of FIG. 26.

Figure 39:
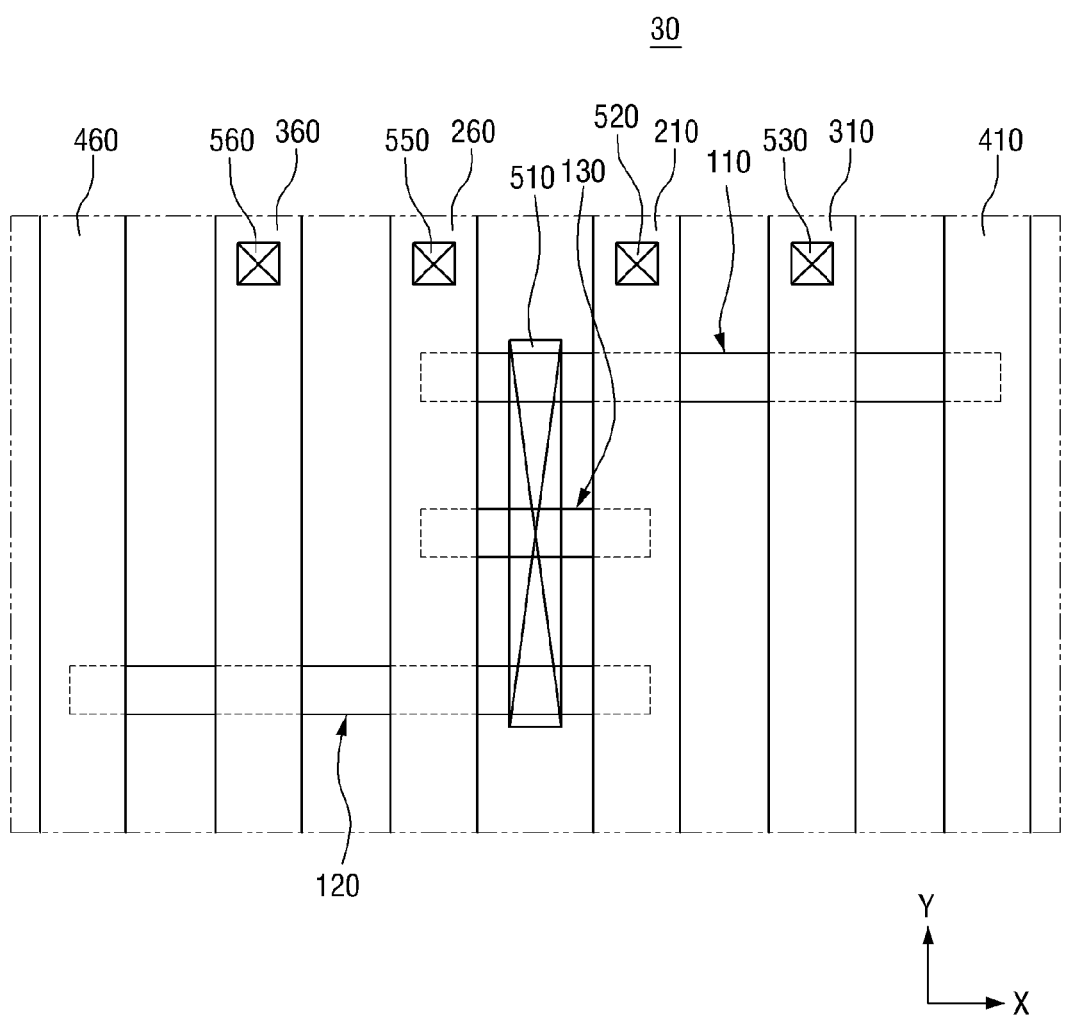
FIG. 39 is a layout view of a semiconductor device according to a thirtieth embodiment of the present invention.

FIG. 39 is a layout view of a semiconductor device 30 according to a thirtieth embodiment of the present invention. FIG. 40 is a layout view of a semiconductor device 31 according to a thirty-first embodiment of the present invention. FIG. 41 is a layout view of a semiconductor device 32 according to a thirty-second embodiment of the present invention.

Referring to FIG. 39, in the semiconductor device 30 according to the thirtieth embodiment of the present invention, one of the end portions of a third fin-type active pattern 130 does not protrude in a first direction X from a side surface of a first gate electrode 210, and the other one of the end portions of the third fin-type active pattern 130 does not protrude in the first direction X from a side surface of a fourth gate electrode 260.

A first fin-type active pattern 110 and a second fin-type active pattern 120 are substantially identical to those described above with reference to FIG. 35.

Figure 40:
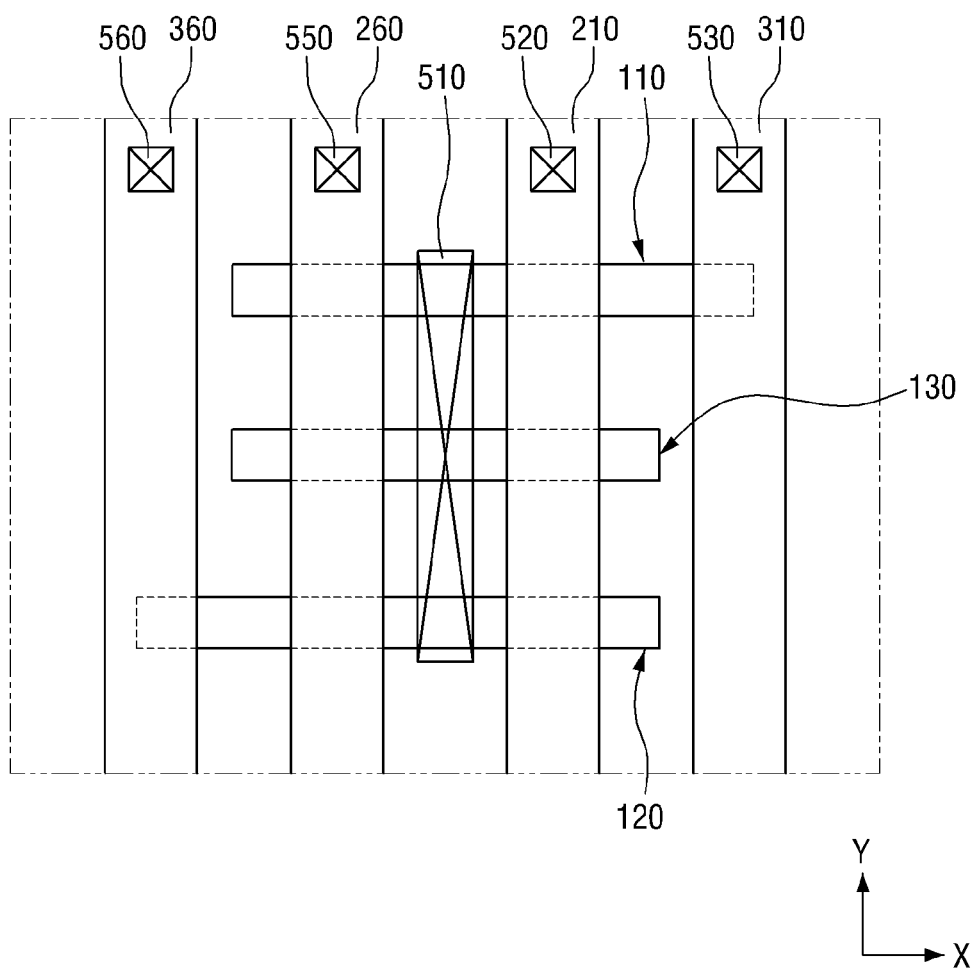
FIG. 40 is a layout view of a semiconductor device according to a thirty-first embodiment of the present invention.

Referring to FIG. 40, in the semiconductor device 31 according to the thirty-first embodiment of the present invention, one of the end portions of a first fin-type active pattern 110 does not protrude in a first direction X from a side surface of a second gate electrode 310, but the other one of the end portions of the first fin-type active pattern 110 protrudes in the first direction X from a side surface of a fourth gate electrode 260.

One of the end portions of a second fin-type active pattern 120 does not protrude in the first direction X from a side surface of a fifth gate electrode 360, but the other one of the end portions of the second fin-type active pattern 120 protrudes in the first direction X from a side surface of a first gate electrode 210.

Figure 41:
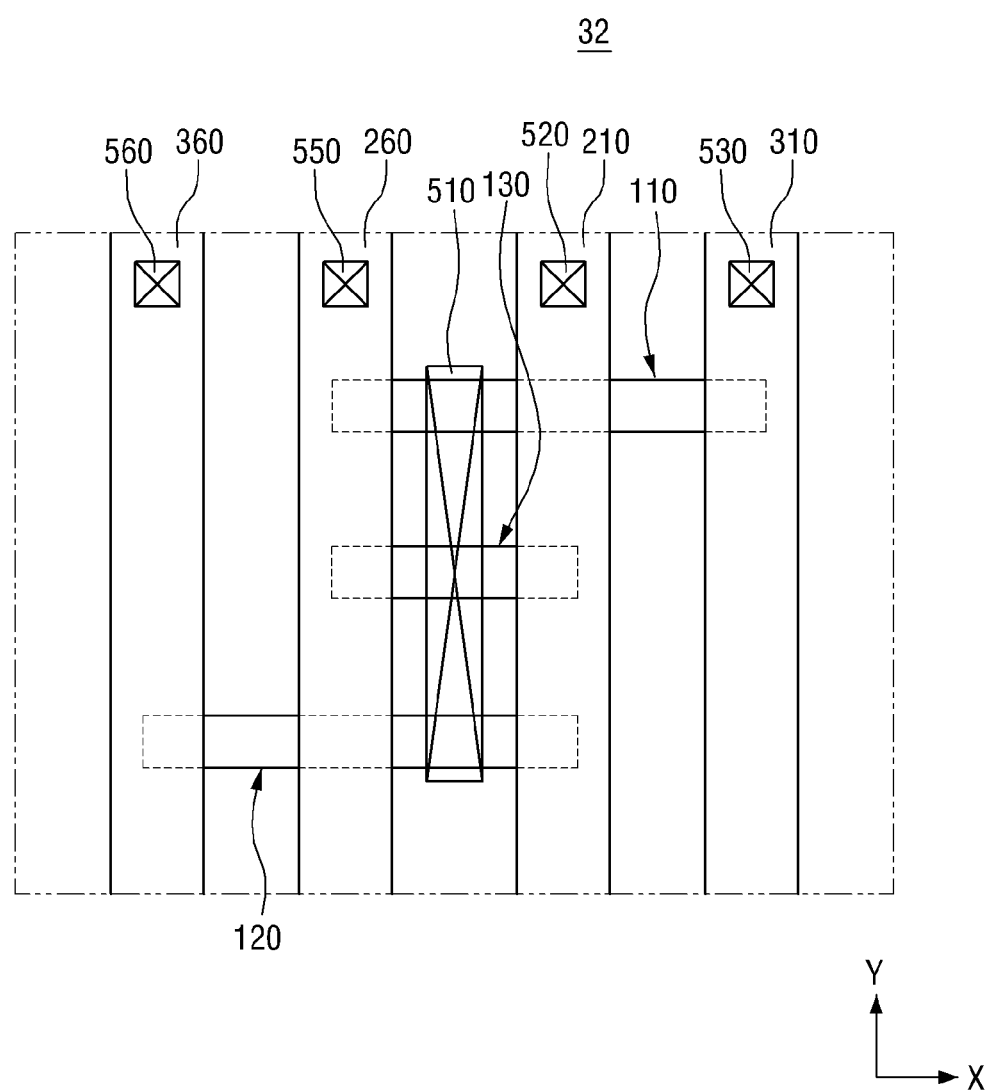
FIG. 41 is a layout view of a semiconductor device according to a thirty-second embodiment of the present invention.

Referring to FIG. 41, in the semiconductor device 32 according to the thirty-second embodiment of the present invention, one of the end portions of a third fin-type active pattern 130 does not protrude in a first direction X from a side surface of a first gate electrode 210. In addition, the other one of the end portions of the third fin-type active pattern 130 does not protrude in the first direction X from a side surface of a fourth gate electrode 260.

A first fin-type active pattern 110 and a second fin-type active pattern 120 are substantially identical to those described above with reference to FIG. 37.

A semiconductor device according to a thirty-third embodiment of the present invention will now be described with reference to FIG. 42. For simplicity, the thirty-third embodiment will hereinafter be described, focusing mainly on differences with the embodiment of FIG. 38.

Figure 42:
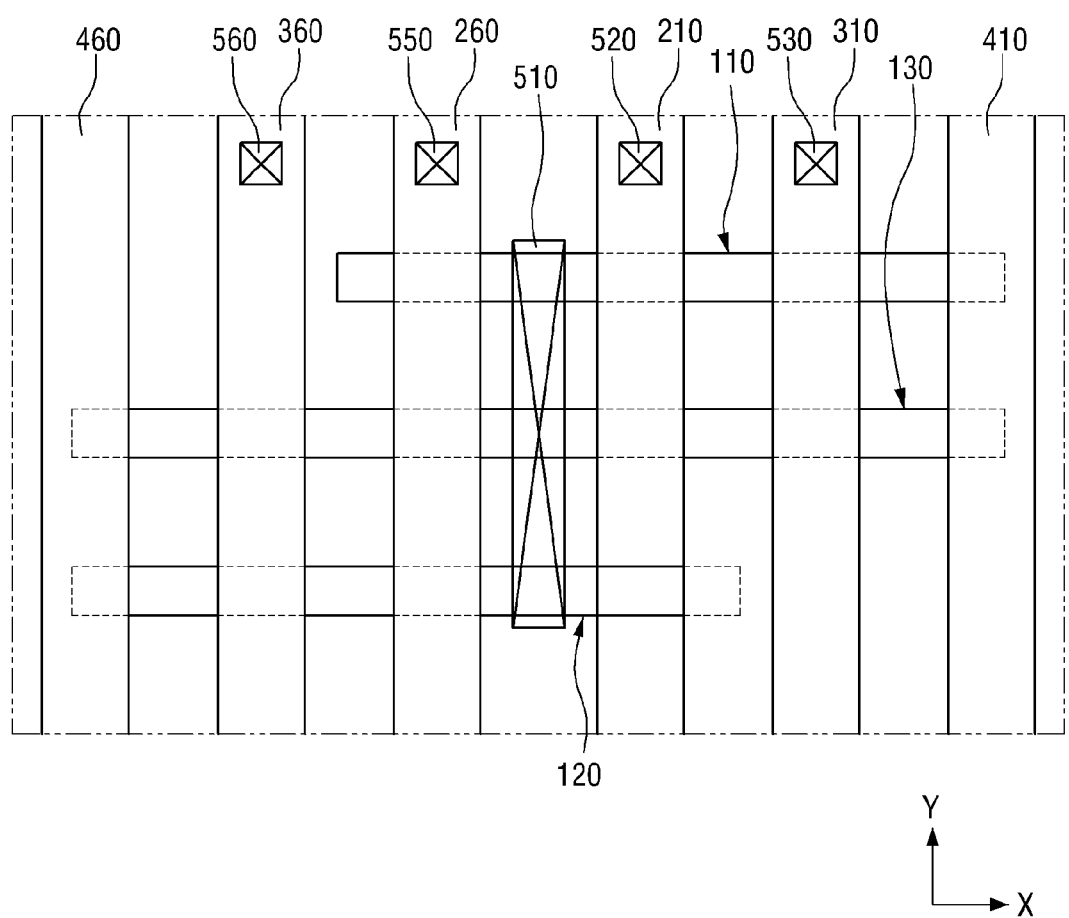
FIG. 42 is a layout view of a semiconductor device according to a thirty-third embodiment of the present invention.

FIG. 42 is a layout view of a semiconductor device 33 according to a thirty-third embodiment of the present invention.

Referring to FIG. 42, in the semiconductor device 33 according to the thirty-third embodiment of the present invention, each of a second gate electrode 310 and a fifth gate electrode 360 intersects a third fin-type active pattern 130. That is, each of the second gate electrode 310 and the fifth gate electrode 360 is formed on the third fin-type active pattern 360.

Each of a third gate electrode 410 and a sixth gate electrode 460 intersects the third fin-type active pattern 130. Each of the third gate electrode 410 and the sixth gate electrode 460 is formed on the third fin-type active pattern 130.

In the semiconductor device 33 according to the thirty-third embodiment of the present invention, the third gate electrode 410 may cover one of end portions of the third fin-type active pattern 130. In addition, the sixth gate electrode 460 may cover the other one of the end portions of the third fin-type active pattern 130.

Semiconductor devices according to thirty-fourth through thirty-sixth embodiments of the present invention will now be described with reference to FIGS. 43 through 45. For simplicity, the thirty-fourth through thirty-sixth embodiments will hereinafter be described, focusing mainly on differences with the embodiment of FIG. 42.

Figure 43:
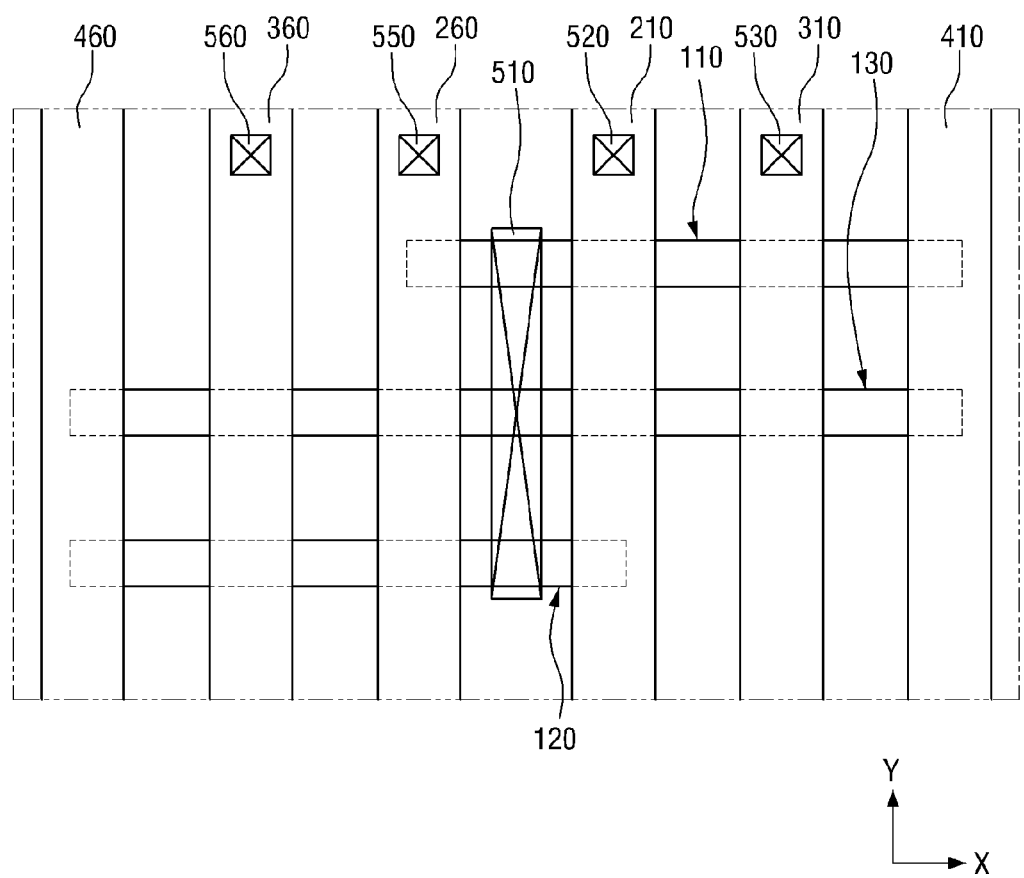
FIG. 43 is a layout view of a semiconductor device according to a thirty-fourth embodiment of the present invention.

FIG. 43 is a layout view of a semiconductor device 34 according to a thirty-fourth embodiment of the present invention. FIG. 44 is a layout view of a semiconductor device 35 according to a thirty-fifth embodiment of the present invention. FIG. 45 is a layout view of a semiconductor device 36 according to a thirty-sixth embodiment of the present invention.

Referring to FIG. 43, in the semiconductor device 34 according to the thirty-fourth embodiment of the present invention, an end portion of a first fin-type active pattern 110 which is not covered by a third gate electrode 410 does not protrude in a first direction X from a side surface of a fourth gate electrode 260.

An end portion of a second fin-type active pattern 120 which is not covered by a sixth gate electrode 460 does not protrude in the first direction X from a side surface of a first gate electrode 210.

Figure 44:
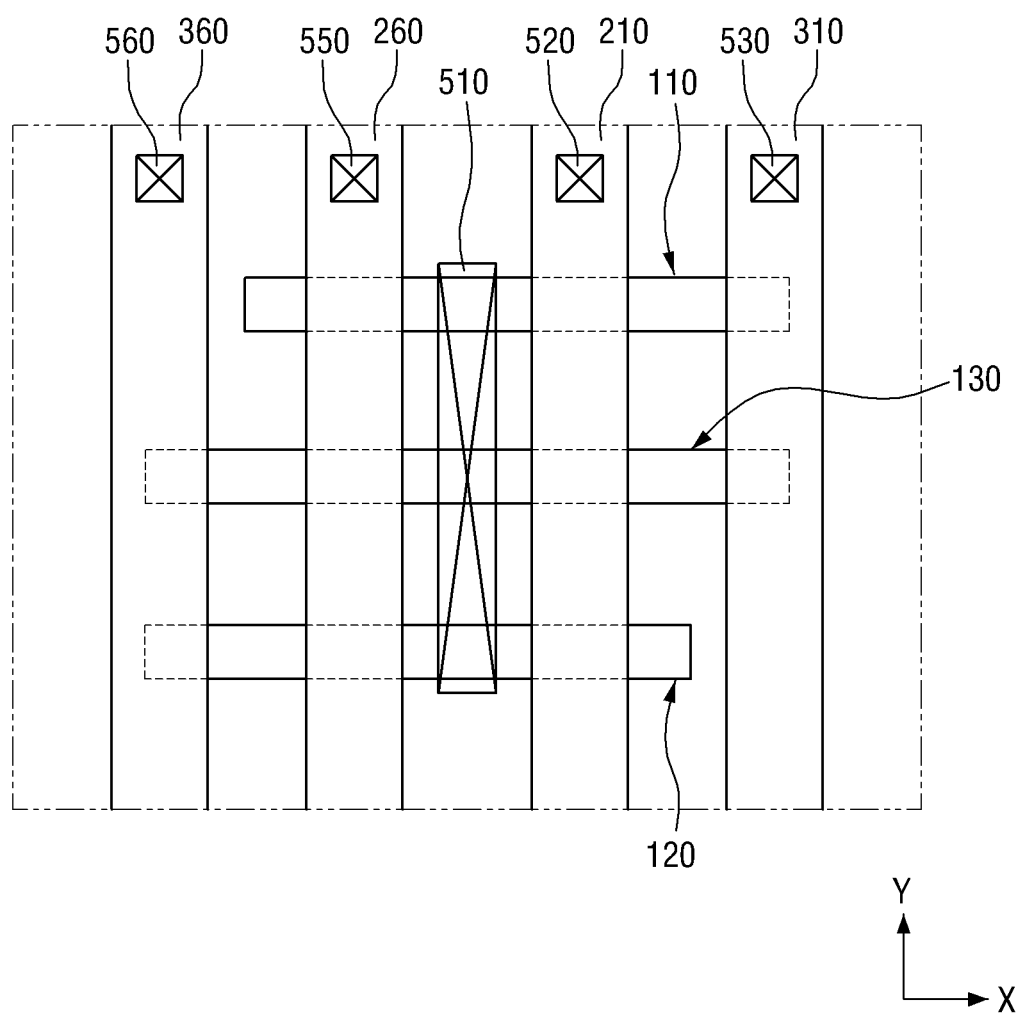
FIG. 44 is a layout view of a semiconductor device according to a thirty-fifth embodiment of the present invention.

Referring to FIG. 44, in the semiconductor device 35 according to the thirty-fifth embodiment of the present invention, one of the end portions of a third fin-type active pattern 130 does not protrude in a first direction X from a side surface of a second gate electrode 310. In addition, the other one of the end portions of the third fin-type active pattern 130 does not protrude in the first direction X from a side surface of a fifth gate electrode 360.

A first fin-type active pattern 110 and a second fin-type active pattern 120 are substantially identical to those described above with reference to FIG. 36.

Figure 45:
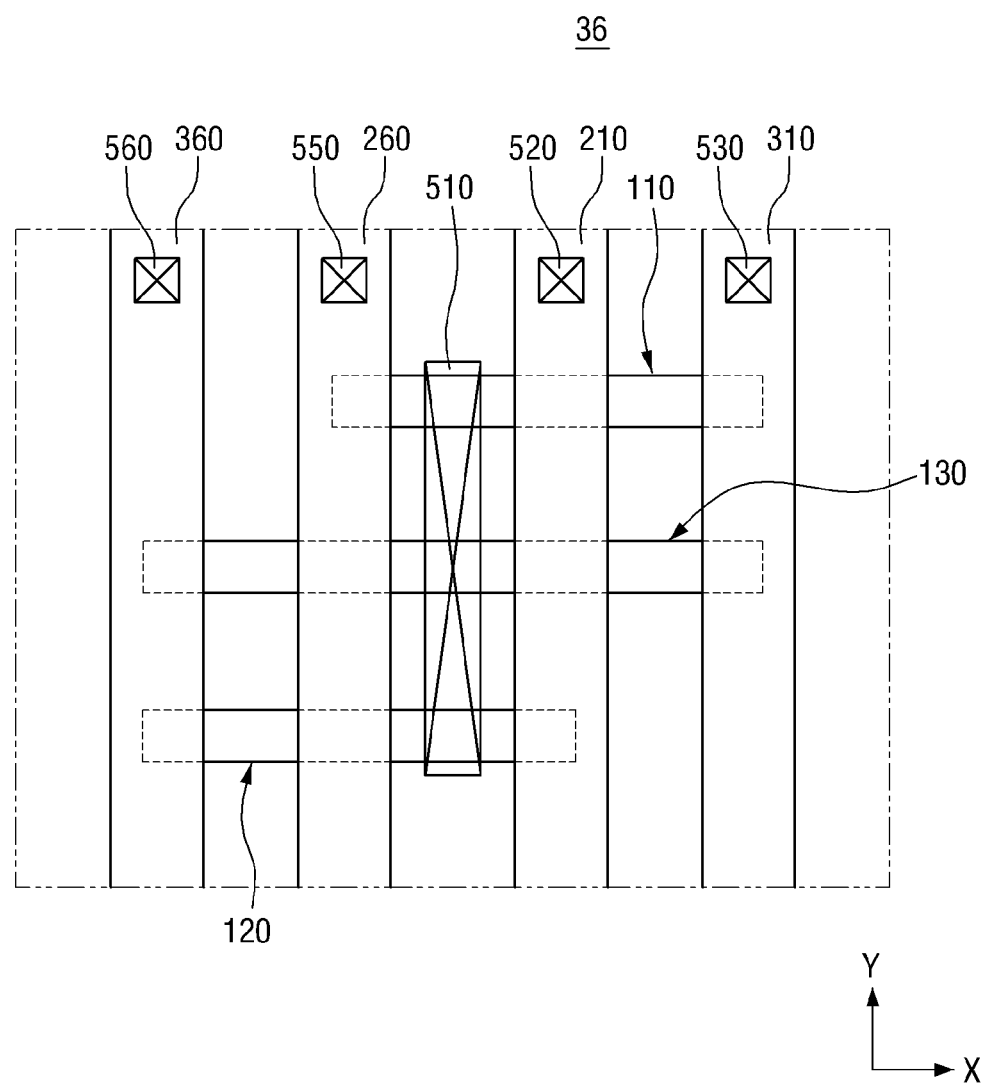
FIG. 45 is a layout view of a semiconductor device according to a thirty-sixth embodiment of the present invention.

Referring to FIG. 45, in the semiconductor device 36 according to the thirty-sixth embodiment of the present invention, one of the end portions of a first fin-type active pattern 110 does not protrude in a first direction X from a side surface of a second gate electrode 310. In addition, the other one of the end portions of the first fin-type active pattern 110 does not protrude in the first direction X from a side surface of a fourth gate electrode 260.

One of the end portions of a second fin-type active pattern 120 does not protrude in the first direction X from a side surface of a fifth gate electrode 360. In addition, the other one of the end portions of the second fin-type active pattern 120 does not protrude in the first direction X from a side surface of a first gate electrode 210.

One of the end portions of a third fin-type active pattern 130 does not protrude in the first direction X from a side surface of the second gate electrode 310. In addition, the other one of the end portions of the third fin-type active pattern 130 does not protrude in the first direction X from a side surface of the fifth gate electrode 360.

The effects that can be obtained when the semiconductor devices according to the embodiments 1 through 45 are used in the memory cell array 50 of FIG. 1 will now be described with reference to FIGS. 2 and 46(a) and (b).

FIG. 46(a) illustrates a case where the number of rupture transistors connected to a high-voltage line WP is equal to the number of access transistors connected to a word line WL (e.g., a ratio of 3:3). For example, FIG. 46(a) may represent an antifuse memory cell, generally referred to has an antifuse device, including an access transistor structure 4602, and an antifuse structure 4604.

FIG. 46(b) illustrates certain aspects of the semiconductor devices 1 through 45 according to certain embodiments of the present invention, such as a case where the number of rupture transistors connected to the high-voltage line WP is different from the number of access transistors connected to the word line WL (e.g., a ratio of 1:3). For example, FIG. 46(b) may represent an antifuse memory cell including an access transistor structure 4606, that includes three transistors, and an antifuse structure 4608, that includes one transistor.

Before an antifuse memory cell is programmed, the number of rupture transistors connected to a bit line BL is three in the case of (a). Here, an Off current flowing through the bit line BL is generated by each of the rupture transistors.

In the case of (b), the number rupture transistors connected to the bit line BL is one before the antifuse memory cell is programmed. Here, the Off current flowing through the bit line BL is generated by the one rupture transistor.

Therefore, the Off current of the antifuse memory cell is proportional to the number of rupture transistors connected to the bit line BL before the antifuse memory cell is programmed, and so the Off current in the case of (b) will be smaller than in the case of (a).

After the antifuse memory cell is programmed, the number of rupture transistors connected to the high-voltage line WP is three in the case of (a). However, if a programming voltage is applied to the high-voltage line WP, a transistor or transistors having the weakest gate insulating layer among the three transistors breaks down. Accordingly, the broken down rupture transistor(s) are programmed and serve as electrical resistors. This may include less than all of the rupture transistors. Therefore, only the rupture transistor(s) including the weakest gate insulating layer may break down regardless of the number of rupture transistors connected to the high-voltage line WP.

After the antifuse memory cell is programmed, it is read as follows. In the example below, it is assumed for the case of (a) that only one of the rupture transistors was broken down during the programming stage.

To read the programmed antifuse memory cell, an On current is generated in the bit line BL. When a channel is formed by an operating voltage applied to an access transistor connected to the word line WL, the On current flows from a programmed rupture transistor toward the bit line BL, but it only flows through the one access transistor connected to the programmed rupture transistor. Here, the On current passing through the access transistor structure 4602 depends on the resistance of the access transistor structure 4602, and increases as a value of On resistance $R_{on}$ of the access transistor structure 4602 decreases, and vice versa.

The value of the On resistance $R_{on}$ of the access transistor structure 4602 decreases as a width of a gate terminal of the access transistor connected to the word line WL increases, and vice versa. Here, where only one rupture transistor has been programmed, because the current only flows through the one access transistor connected to the programmed rupture transistor, the width of the gate terminal of the access transistor effectively decreases, such that the On resistance $R_{on}$ of the access transistor structure 4602 increases, and the On current decreases.

Therefore, in the case of (a), after the antifuse memory cells are programmed, the On current of the antifuse memory cell, which current is proportional to the number of access transistors through which current flows, decreases.

In the semiconductor devices 1 through 45 according to the embodiments of the present invention, the number of rupture transistors connected to the high-voltage line WP is smaller than the number of access transistors connected to the word line WL. For example, the semiconductor devices 1 through 45 according to these embodiments of the present invention reduce the Off current while increasing the On current.

Therefore, the semiconductor devices 1 through 45 according to embodiments of the present invention can increase a ratio of the On current to the Off current.

Figure 47:
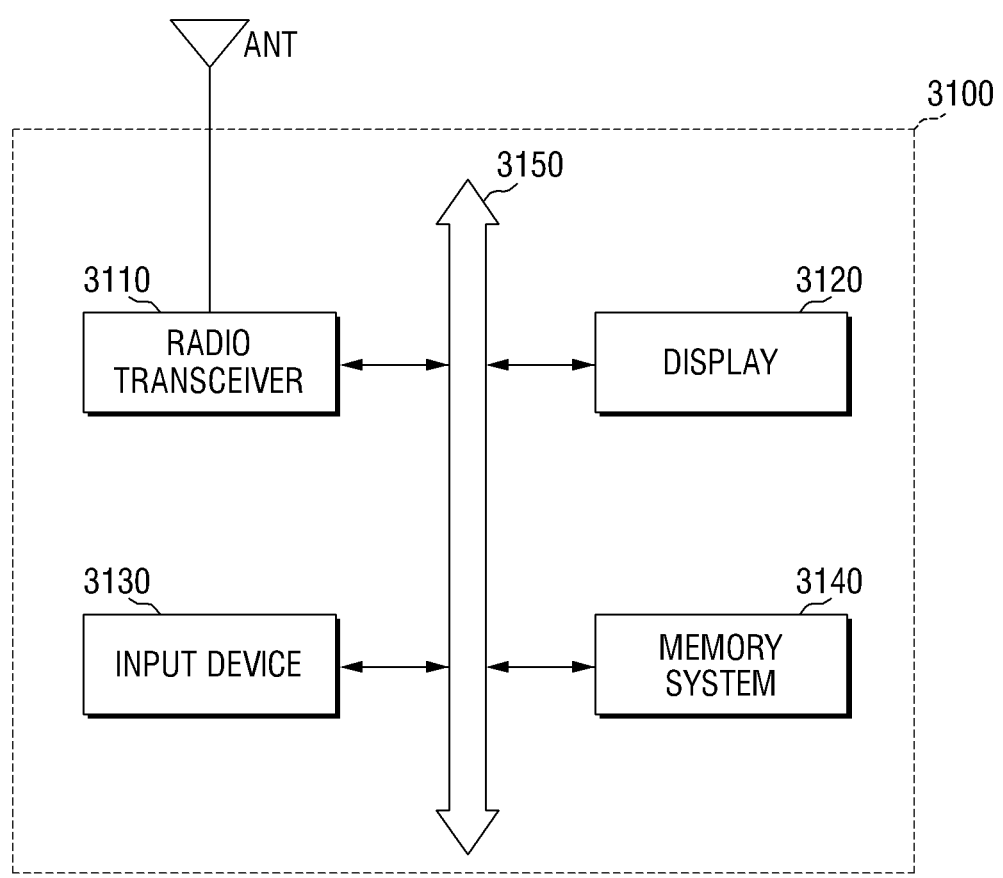
FIG. 47 illustrates an embodiment of a data processing system including the memory device of FIG. 1.

FIG. 47 illustrates an embodiment of a data processing system including the memory device of FIG. 1.

Referring to FIG. 47, a data processing system 3100 may be implemented as a cellular phone, a smartphone, a personal digital assistant (PDA), or a wireless communication device. The data processing system 3100 includes a memory system 3140.

The memory system 3140 includes a memory device and a memory controller that can control the operation of the memory device. The memory controller may control a data access operation (such as a program operation, an erase operation or a read operation) of the memory device under the control of a processor. The memory device may include an antifuse memory cell array such as described in the embodiments of FIGS. 1-45.

Page data programmed into the memory device may be displayed on a display 3120 under the control of the processor and the memory controller.

A radio transceiver 3110 may receive or transmit radio signals through an antenna ANT. For example, the radio transceiver 3110 may convert a radio signal received through the antenna ANT into a signal that can be processed by the processor. Therefore, the processor may process the signal output from the radio transceiver 3110 and transmit the processed signal to the memory system 3140 or the display 3120. In addition, the radio transceiver 3110 may convert a signal output from the processor into a radio signal and transmit the radio signal to an external device through the antenna ANT.

An input device 3130 is a device by which a control signal for controlling the operation of the processor or data to be processed by the processor can be input. The input device 3130 may be implemented as a pointing device such as a touchpad or computer mouse, a keypad, or a keyboard.

The processor may control the display 3120 to display data output from the memory system 3140, data output from the radio transceiver 3110, or data output from the input device 3130. Depending on embodiments, the memory controller that can control the operation of the memory device may form a stacked structure together with the memory device.

Figure 48:
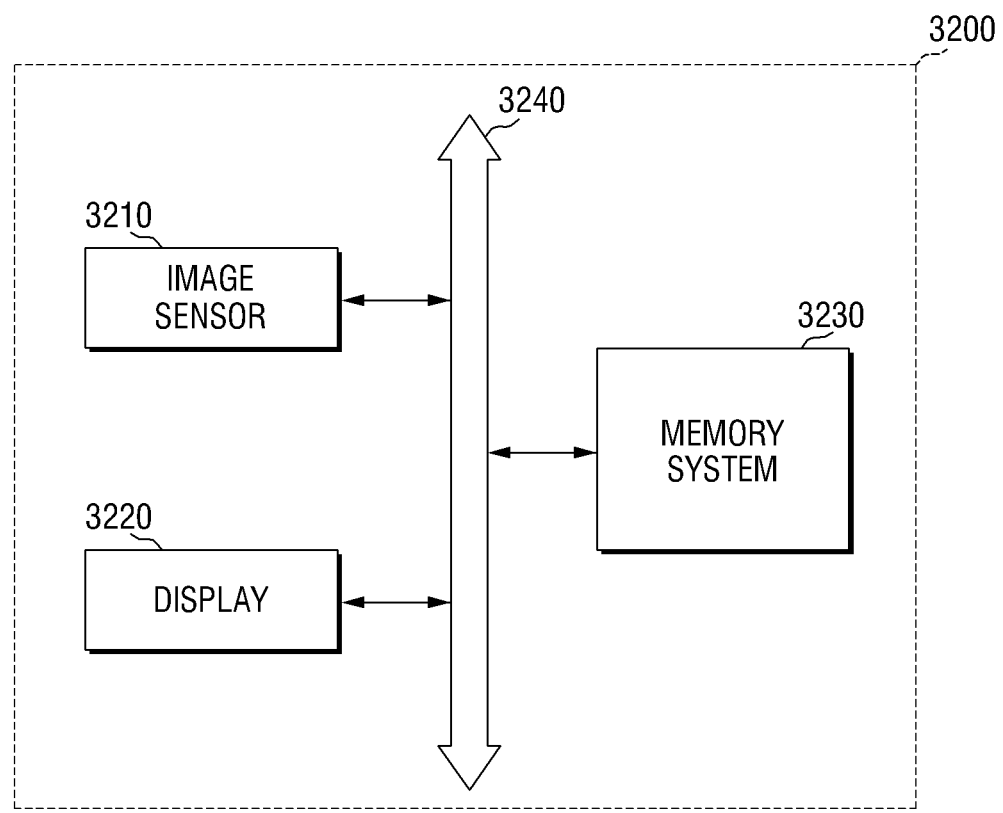
FIG. 48 illustrates another embodiment of the data processing system including the memory device of FIG. 1.

FIG. 48 illustrates another embodiment of the data processing system including the memory device of FIG. 1.

Referring to FIG. 48, a data processing system 3200 may be implemented as an image processing device, such as a digital camera, or a cellular phone to which a digital camera is attached.

The data processing system 3200 may include an image sensor 3210, a display 3220, and a memory system 3230.

The memory system 3230 includes a memory device and a memory controller that can control a data processing operation of the memory device. The memory device may include an antifuse memory cell array such as described in the embodiments of FIGS. 1-45.

The image sensor 3210 of the data processing system 3200 converts an optical image into digital signals and transmits the digital signals to the memory system 3230. The digital signals may be processed by the memory system 3230 to be displayed on the display 3230 or stored in the memory device through the memory controller. In addition, data stored in the memory device is displayed on the display 3230. Depending on embodiments, the memory controller that can control the operation of the memory device may be implemented as a part of the processor or as a chip separate from the processor.

Figure 49:
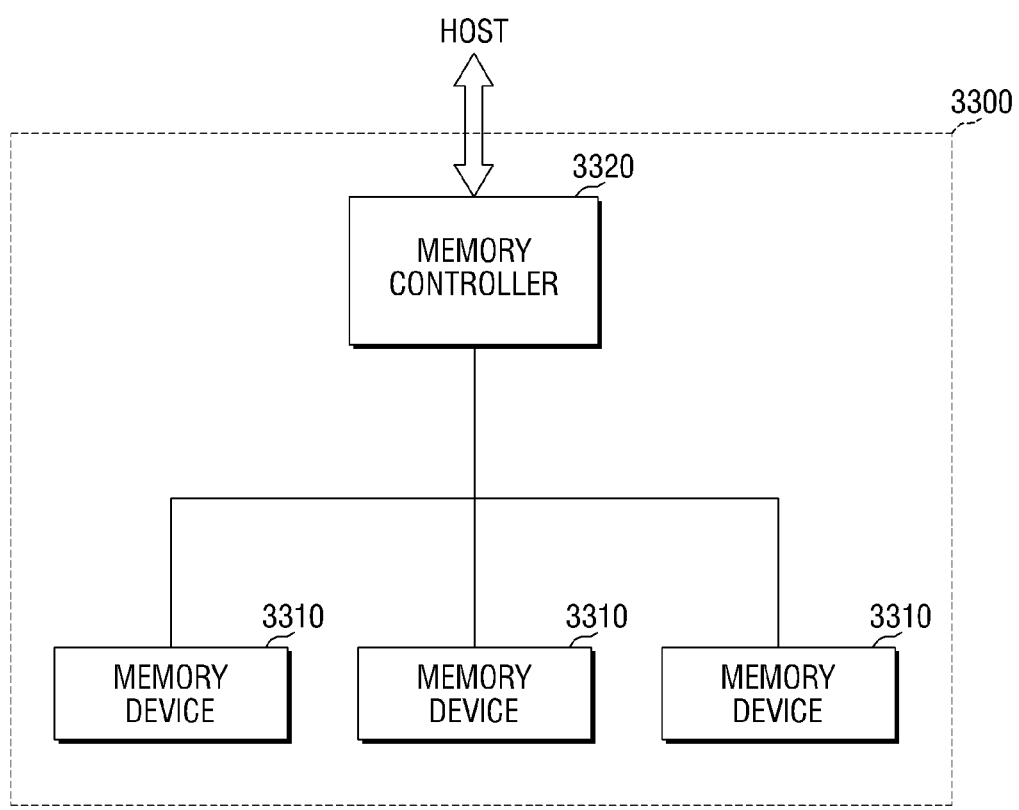
FIG. 49 illustrates another embodiment of the data processing system including the memory device of FIG. 1.

FIG. 49 illustrates another embodiment of the data processing system including the memory device of FIG. 1.

Referring to FIG. 49, a data processing system 3300 may be implemented as a data storage device such as a solid state drive (SSD). The data processing system 3300 may include a plurality of memory devices 3310 and a memory controller 3320 that can control a data processing operation of each of the memory devices 3310. One or more of the memory devices 3310 may include an antifuse memory cell array such as described in the embodiments of FIGS. 1-45. The data processing system 3300 may be implemented, for example, as a memory module.

Figure 50:
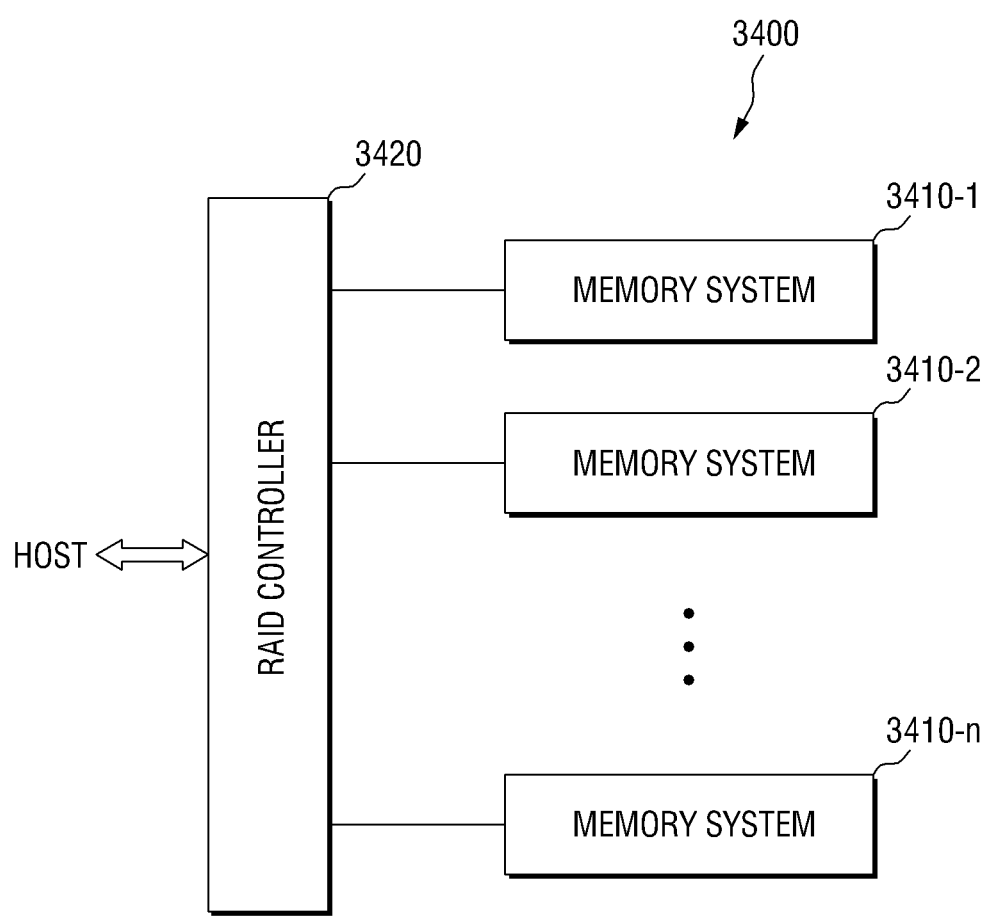
FIG. 50 illustrates another embodiment of the data processing system including the memory device of FIG. 1.

FIG. 50 illustrates another embodiment of the data processing system including the memory device of FIG. 1.

Referring to FIG. 50, a data processing system (e.g., a data storage device) 3400 may be implemented as a redundant array of independent disks (RAID) system. The data processing system 3400 may include a RAID controller 3420 and a plurality of memory modules 3410-1 through 3410-n, where n is a natural number.

Each of the memory modules 3410-1 through 3410-n may be the data processing system 3300 illustrated in FIG. 49. The memory modules 3410-1 through 3410-n may constitute a RAID array.

The data processing system 3400 may be implemented, for example, as a personal computer (PC) or an SSD. During a program operation, in response to a program command received from a host, the RAID controller 3420 may transmit program data output from the host to any one of the memory modules 3410-1 through 3410-n according to any one RAID level selected from a plurality of RAID levels based on RAID level information. In addition, during a read operation, in response to a read command received from the host, the RAID controller 3420 may transmit to the host data read from any one of the memory modules 3410-1 through 3410-n according to any one RAID level selected from the RAID levels based on the RAID level information.

Figure 51:
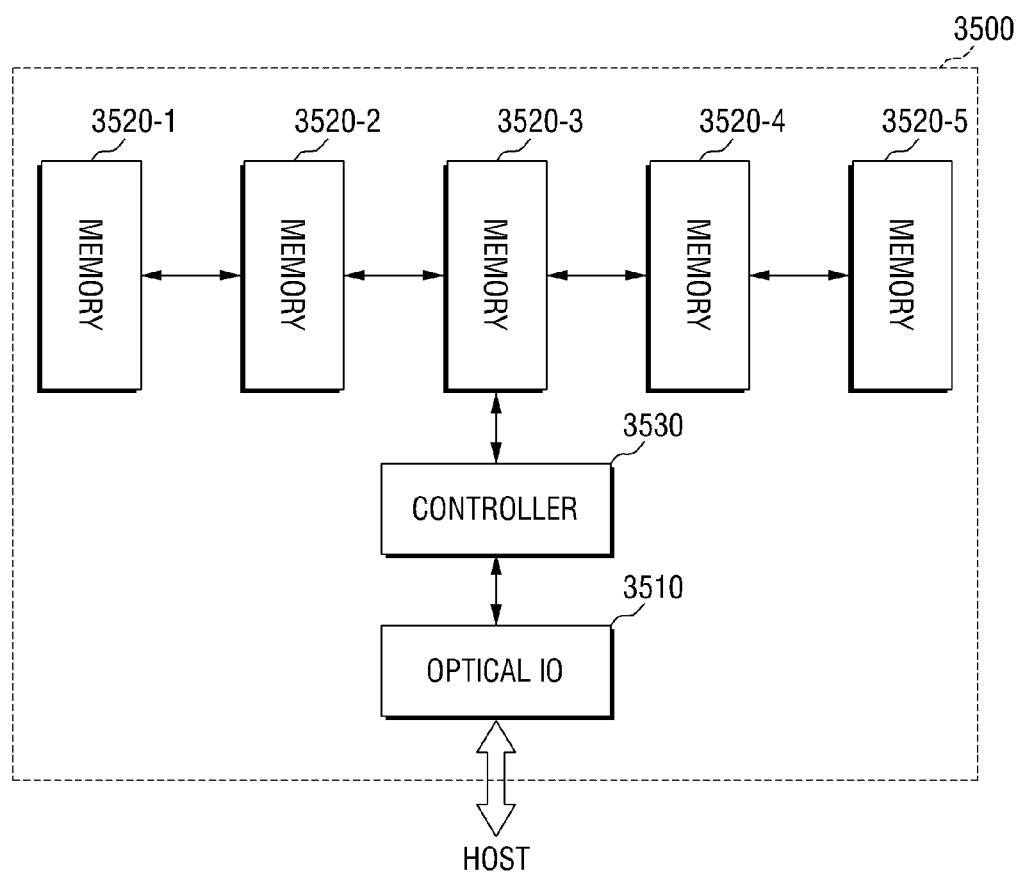
FIG. 51 illustrates an embodiment of a module including a plurality of memory devices of FIG. 1.

FIG. 51 illustrates an embodiment of a module including a plurality of memory devices of FIG. 1.

Referring to FIG. 51, a module 3500 may include a plurality of memory devices 3520-1 through 3520-5, a memory controller 3530, and an optical interface 3510 which interfaces the data input/output of each of the memory devices 3520-1 through 3520-5. One or more of the memory devices 3520-1 through 3520-5 may include an antifuse memory cell array such as described in the embodiments of FIGS. 1-45.

The optical interface 3510 may include an input/output controller and a signal converter. The input/output controller may control the input/output operation of each of the memory devices 3520-1 through 3520-5. The signal converter may convert data about the data input/output of each of the memory devices 3520-1 through 3520-5 into an optical signal.

The optical interface 3510 provides data exchange between each of the memory devices 3520-1 through 3520-5 and a host using optical communication. The optical interface 3510 may transmit or receive data using an optical fiber or a waveguide. The exchanged data is suitable to a case where high-speed signals, such as signals that comply with a serial advanced technology attachment (SATA) standard, are transmitted, or the data may be transmitted or received using wavelength division multiplexing (WDM).

Depending on embodiments, the memory controller 3530 that can control the operation of each of the memory devices 3520-1 through 3520-5 may be provided within each of the memory devices 3520-1 through 3520-5 or may form a stacked structure together with each of the memory devices 3520-1 through 3520-5.

Figure 52:
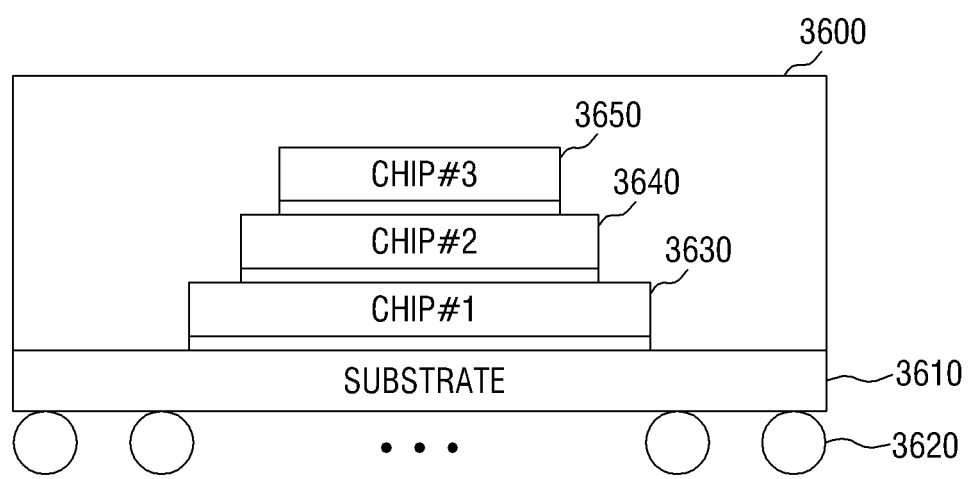
FIG. 52 is a schematic conceptual diagram of an embodiment of a multi-chip package including the memory device of FIG. 1.

FIG. 52 is a schematic conceptual diagram of an embodiment of a multi-chip package including the memory device of FIG. 1.

Referring to FIG. 52, a multi-chip package 3600 may include a plurality of semiconductor chips 3630 through 3650 sequentially stacked on a package substrate 3610. Each of the semiconductor chips 3630 through 3650 may be a memory controller or a memory device. Each memory device may include an antifuse memory cell array such as described in the embodiments of FIGS. 1-45. Through-silicon vias (TSVs), wires, bumps, or solder balls 3620 may be used to electrically connect the semiconductor chips 3630 through 3650 to each other.

In addition, depending on embodiments, the multi-chip package 3600 may be implemented in a structure in which the memory controllers and a plurality of memory cell array dies 50 are stacked.

While various aspects of the present invention have been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a substrate;
a first fin-type active pattern extending along a first direction on the substrate, and comprising first through fourth lengthwise regions arranged sequentially along the first direction;
a second fin-type active pattern extending along the first direction on the substrate, and comprising a first lengthwise region and a second lengthwise region arranged sequentially along the first direction,
wherein the first lengthwise region of the first fin-type active pattern corresponds with the first lengthwise region of the second fin-type active pattern to face the first lengthwise region of the second fin-type active pattern, and
wherein the second lengthwise region of the first fin-type active pattern corresponds with the second lengthwise region of the second fin-type active pattern to face the second lengthwise region of the second fin-type active pattern;
a first gate electrode extending along a second direction different from the first direction and formed on the second lengthwise region of the first fin-type active pattern and the second lengthwise region of the second fin-type active pattern;
a second gate electrode extending along the second direction, formed on the fourth lengthwise region of the first fin-type active pattern, and not formed on the second fin-type active pattern; and
a contact electrically connected to the first lengthwise region of the first fin-type active pattern and the first lengthwise region of the second fin-type active pattern.

2. The semiconductor device of claim 1, wherein the second gate electrode is a gate terminal for a rupture transistor of an anti-fuse device.

3. The semiconductor device of claim 2, wherein the antifuse device includes a plurality of access transistors and at least the rupture transistor, and includes a greater number of access transistors than rupture transistors.

4. The semiconductor device of claim 1, wherein the first gate electrode forms a gate for an access transistor and is electrically connected to a word line, and the second gate electrode forms a gate for a rupture transistor and is electrically connected to a high-voltage line.

5. The semiconductor device of claim 1, wherein:
the third lengthwise region of the first fin-type active pattern is a region between the second lengthwise region of the first fin-type active pattern and the fourth lengthwise region of the first fin-type active pattern, and the second fin-type active pattern includes a third lengthwise region corresponding to the third lengthwise region of the first fin-type active pattern, wherein the third lengthwise region of the second fin-type active pattern is shorter lengthwise than the third lengthwise region of the first fin-type active pattern.

6. A semiconductor device comprising:
a first fin-type active pattern which is defined by a field insulating layer, extends along a first direction, and comprises first through fourth regions arranged sequentially along the first direction;
a second fin-type active pattern which is defined by the field insulating layer, extends along the first direction, and comprises first through third regions arranged sequentially along the first direction;
a first gate electrode which extends along a second direction different from the first direction and is formed on the second region of the first fin-type active pattern and the second region of the second fin-type active pattern;
a second gate electrode which extends along the second direction, is formed on the fourth region of the first fin-type active pattern, and is not formed on the second fin-type active pattern;
a contact which is electrically connected to the first region of the first fin-type active pattern and the first region of the second fin-type active pattern;
a first epitaxial layer which is formed on the third region of the first fin-type active pattern; and
a second epitaxial layer which is formed on the third region of the second fin-type active pattern.

7. The semiconductor device of claim 6, wherein the first epitaxial layer and the second epitaxial layer are connected to each other.

8. The semiconductor device of claim 6, wherein the first fin-type active pattern further comprises a fifth region,
wherein the fourth region of the first fin-type active pattern is disposed between the third region of the first fin-type active pattern and the fifth region of the first fin-type active pattern; and further comprising:
a dummy gate electrode which extends along the second direction and is formed on the fifth region of the first fin-type active pattern,
wherein the dummy gate electrode covers an end portion of the first fin-type active pattern.

9. The semiconductor device of claim 6, wherein the field insulating layer comprises a first region and a second region higher than the first region, and
wherein an end portion of the first fin-type active pattern is located in the fourth region of the first fin-type active pattern, and the second region of the field insulating layer contacts the end portion of the first fin-type active pattern.

10. The semiconductor device of claim 6, wherein the field insulating layer comprises a first region and a second region higher than the first region, wherein an end portion of the second fin-type active pattern is located in the second region of the second fin-type active pattern, and the second region of the field insulating layer contacts the end portion of the second fin-type active pattern.

11. The semiconductor device of claim 6, wherein the first fin-type active pattern forms part of an access transistor and a rupture transistor of an antifuse memory cell.

12. The semiconductor device of claim 6, wherein each of the first region of the first fin-type active pattern and the third region of the first fin-type active pattern comprises an n-type impurity region.

13. The semiconductor device of claim 6, wherein a distance between the contact and the second gate electrode is greater than a distance between the contact and the first gate electrode.

14. A semiconductor device comprising:
a plurality of fin-type active patterns which extend along a first direction, and are arranged with respect to each other along a second direction different from the first direction;
a contact which is electrically connected to the plurality of fin-type active patterns including a first fin-type active pattern and a second fin-type active pattern;
a first gate electrode which extends along the second direction and is formed on at least two of the plurality of fin-type active patterns including the first fin-type active pattern and the second fin-type active pattern; and
a second gate electrode which extends along the second direction and is formed on at least the first fin-type active pattern and not on the second fin-type active pattern,
wherein the first gate electrode is disposed between the contact and the second gate electrode, and a total number of fin-type active patterns crossed by the first gate electrode is greater than a total number of fin-type active patterns crossed by the second gate electrode, and
wherein the second fin-type active pattern includes a protrusion region extending toward the second gate electrode from the first gate electrode,
the semiconductor device further comprising:
a first epitaxial layer which is formed on the first fin-type active pattern between the first gate electrode and the second sate electrode; and
a second epitaxial layer which is formed on the protrusion region of the second fin-type active pattern.

15. The semiconductor device of claim 14, wherein the first gate electrode is a gate electrode of an access transistor, the second gate electrode is a gate electrode of a rupture transistor, and the semiconductor device is an antifuse device.

16. The semiconductor device of claim 15, wherein the first gate electrode crosses all of the plurality of fin-type active patterns of the antifuse device.

17. The semiconductor device of claim 15, wherein the rupture transistor includes a ruptured dielectric layer to function as a resistor.

18. The semiconductor device of claim 14, wherein the first gate electrode is electrically connected to a word line and the second gate electrode is electrically connected to a high-voltage line.

19. The semiconductor device of claim 14, wherein one end of the first fin-type active pattern of the plurality of fin-type active patterns extends in the first direction beyond the second gate electrode, and one end of the second fin-type active pattern of the plurality of fin-type active patterns extends beyond the first gate electrode in the first direction but does not extend beyond the second gate electrode in the first direction.

* * * * *